(12) United States Patent
Yoneda

(10) Patent No.: US 8,824,193 B2
(45) Date of Patent: Sep. 2, 2014

(54) SEMICONDUCTOR STORAGE DEVICE

(75) Inventor: Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 292 days.

(21) Appl. No.: 13/469,159

(22) Filed: May 11, 2012

(65) Prior Publication Data

US 2012/0294066 A1    Nov. 22, 2012

(30) Foreign Application Priority Data

May 18, 2011   (JP) ................. 2011-111738

(51) Int. Cl.
*G11C 11/24* (2006.01)

(52) U.S. Cl.
USPC .................. 365/149; 365/189.05

(58) Field of Classification Search
USPC ............... 365/149, 189.05, 189.12
See application file for complete search history.

(56) References Cited

U.S. PATENT DOCUMENTS

| | | | |
|---|---|---|---|
| 4,179,751 A * | 12/1979 | Adachi | ............ 365/228 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633: vol. 44, No. 9; Agne Gijutsu Center (with English translation).

(Continued)

*Primary Examiner* — Vu Le

(74) *Attorney, Agent, or Firm* — Fish & Richardson P.C.

(57) ABSTRACT

A semiconductor storage device which stops and resumes the supply of power supply voltage without the necessity of saving and returning a data signal between a volatile storage device and a nonvolatile storage device is provided. In the semiconductor storage device, data is held in a data holding portion connected to a transistor including a semiconductor layer containing an oxide semiconductor and a capacitor. The potential of the data held in the data holding portion is controlled by a data potential holding circuit and a data potential control circuit. The data potential holding circuit can output data without leaking electric charge, and the data potential control circuit can control the potential of the data held in the data holding portion without leaking electric charge by capacitive coupling through the capacitor.

16 Claims, 40 Drawing Sheets

(56) References Cited

U.S. PATENT DOCUMENTS

| | | | |
|---|---|---|---|
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,606,988 B2 * | 10/2009 | Gower et al. | 711/154 |
| 7,674,650 B2 | 3/2010 | Akimoto et al. | |
| 7,712,009 B2 | 5/2010 | Ito et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0102018 A1 | 5/2011 | Shionoiri et al. | |
| 2012/0049889 A1 | 3/2012 | Hatano | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-124290 A | 6/2010 |
| WO | 2004/114391 A1 | 12/2004 |

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room.Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID

(56) References Cited

OTHER PUBLICATIONS

Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA Amoled Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5) Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologus Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide.Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, The Japan Society of Applied Physics.

(56) References Cited

OTHER PUBLICATIONS

Orita, M et al., "Amorphous transparnet conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 1A
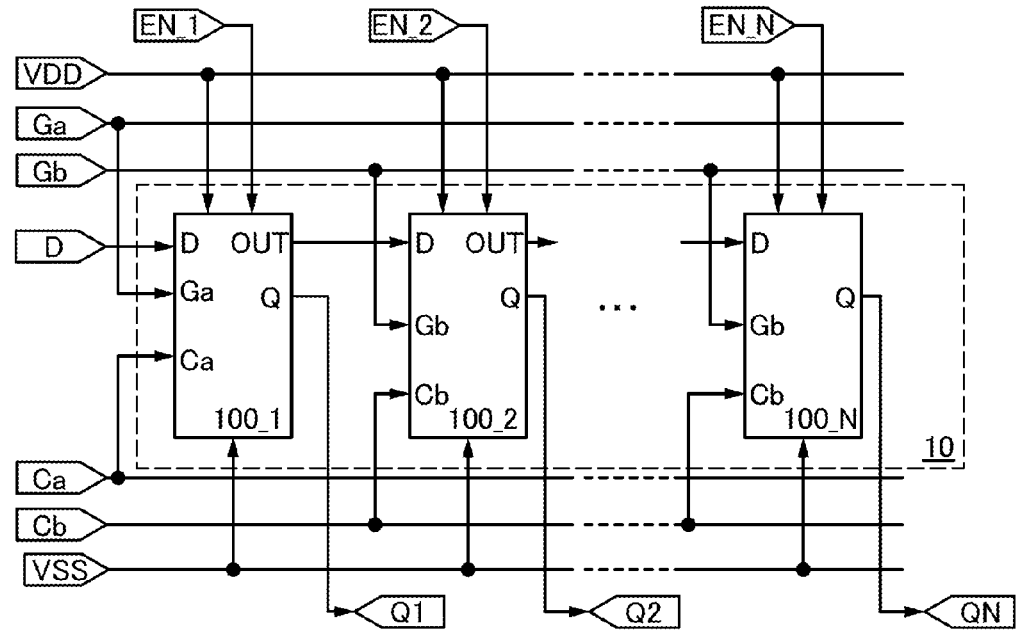
FIG. 1B
FIG. 1C
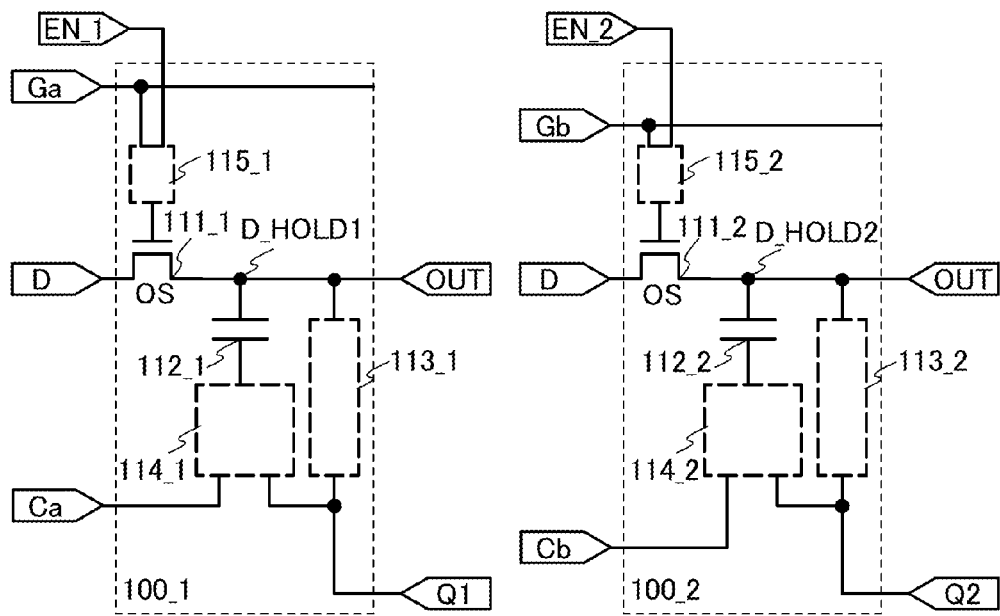

FIG. 31A    FIG. 31B
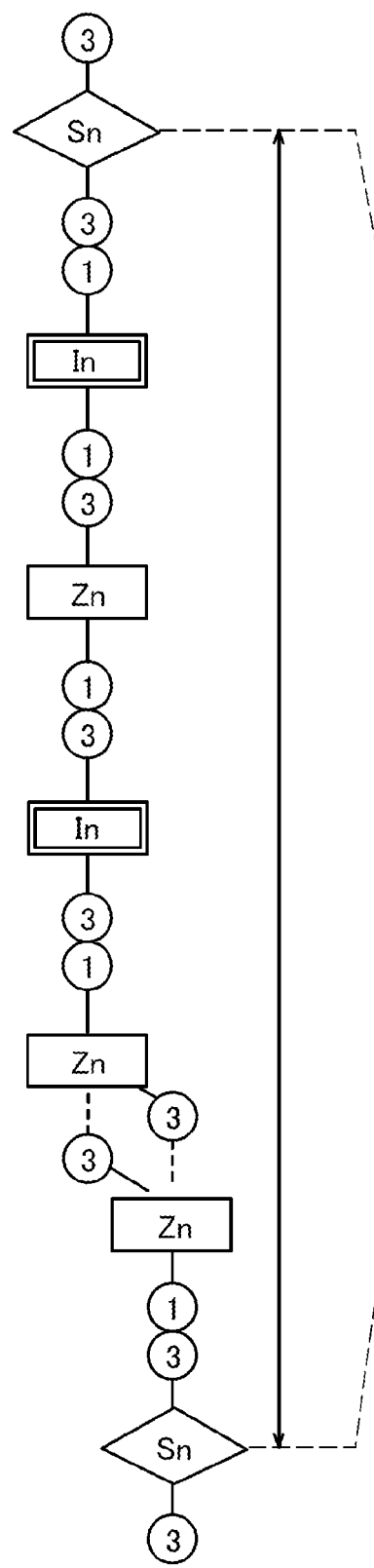
FIG. 31C
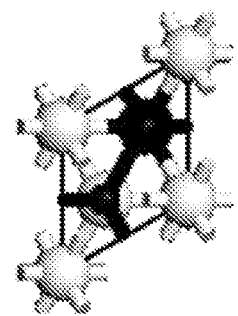
● In
◐ Sn
◌ Zn
• O ● In
● Ga
● Zn
● O ● : In
◐ : Ga or Zn
● : O ● : In
◐ : Ga
◐ : Zn
● : O

SEMICONDUCTOR STORAGE DEVICE

BACKGROUND OF THE INVENTION

1. Field of the Invention

The present invention relates to a semiconductor storage device. In particular, the present invention relates to a semiconductor storage device in a signal processing unit, which can keep a stored logic state even when power is turned off.

2. Description of the Related Art

A signal processing unit such as a central processing unit (CPU) has a variety of configurations depending on its application. The signal processing unit is generally provided with some kinds of storage devices such as a register and a cache memory in addition to a main memory for storing data or a program. A register has a function of temporarily holding a data signal for carrying out arithmetic processing, holding a program execution state, or the like. Meanwhile, a cache memory, which is located between an arithmetic unit and a main memory, is provided to reduce low-speed access to the main memory and to speed up the arithmetic processing.

In a storage device, such as a register or a cache memory, of a signal processing unit, writing of a data signal needs to be performed at higher speed than in a main memory. In general, a flip-flop, a static random access memory (SRAM), or the like is used as a register or a cache memory. That is, a volatile storage device in which a data signal is lost when the supply of power supply voltage is stopped is used for such a register, a cache memory, or the like.

In order to reduce power consumption, a method for temporarily stopping the supply of power supply voltage to a signal processing unit during a period in which a data signal is not input and output has been suggested (for example, see Patent Document 1). In the method disclosed in Patent Document 1, a nonvolatile storage device is located in the periphery of a volatile storage device, so that the data signal is temporarily stored in the nonvolatile storage device when the supply of power supply voltage is stopped.

REFERENCE

[Patent Document 1] Japanese Published Patent Application No. 2010-124290

SUMMARY OF THE INVENTION

In the structure described in Patent Document 1, data stored in the volatile storage device can be stored in the nonvolatile storage device located in the periphery of the volatile storage device while the supply of power supply voltage is stopped in the signal processing unit.

However, in the structure described in Patent Document 1, the volatile storage device and the nonvolatile storage device are provided separately. Therefore, when the supply of power supply voltage is stopped, it is necessary to save the data into the nonvolatile storage device from the volatile storage device. In addition, when the supply of power supply voltage is resumed, it is necessary to return the data to the volatile storage device from the nonvolatile storage device.

In view of the foregoing problems, an object of one embodiment of the present invention is to provide a semiconductor storage device which drives without the necessity of saving and returning data between a volatile storage device and a nonvolatile storage device when the supply of power supply voltage is stopped and resumed.

According to one embodiment of the present invention, in order to enable a data signal to be held even after the supply of power supply voltage is stopped, a volatile storage device and a nonvolatile storage device are provided without separation. In a semiconductor storage device including a plurality of stages of storage circuits, a storage circuit in each stage includes a transistor including a semiconductor layer containing an oxide semiconductor and a capacitor. Data is held in a wiring connected to a transistor of a storage circuit in an odd-numbered stage and a transistor of a storage circuit in an even-numbered stage. The potential of the data signal held in the wiring is controlled by a data potential holding circuit and a data potential control circuit. The potential of the data signal held in the wiring is controlled by the data potential holding circuit, and the data potential control circuit can control the potential of the data signal held in the wiring without leaking electric charge by capacitive coupling through the capacitor. The conductive state of the transistor in each of the storage circuits in a plurality of stages is controlled by a gate-selection signal generator circuit which is connected to a gate of the transistor.

According to one embodiment of the present invention, a semiconductor storage device in which storage circuits are cascade-connected includes a $(2m-1)$-th stage storage circuit (m is a natural number of 1 or more) and a $2m$-th stage storage circuit. The $(2m-1)$-th stage storage circuit includes a $(2m-1)$-th transistor having a first terminal from which data is supplied; a $(2m-1)$-th data holding portion which is electrically connected to a second terminal of the $(2m-1)$-th transistor, a first terminal of a $2m$-th transistor included in a $2m$-th stage storage circuit, and a first electrode of a $(2m-1)$-th capacitor and which holds the data; a $(2m-1)$-th data potential holding and outputting circuit which outputs the data with a potential of the $(2m-1)$-th data holding portion held; and a $(2m-1)$-th data potential control circuit to which an output signal of the $(2m-1)$-th data potential holding and outputting circuit and a first capacitor control signal are input and which controls a potential of a second electrode of the $(2m-1)$-th capacitor. The $2m$-th stage storage circuit includes the $2m$-th transistor, a $2m$-th data holding portion which is electrically connected to a second terminal of the $2m$-th transistor, a first terminal of a $(2m+1)$-th transistor included in a $(2m+1)$-th stage storage circuit, and a first electrode of a $2m$-th capacitor and which holds the data which is supplied through the $2m$-th transistor; a $2m$-th data potential holding and outputting circuit which outputs the data with a potential of the $2m$-th data holding portion held; and a $2m$-th data potential control circuit to which an output signal of the $2m$-th data potential holding and outputting circuit and a second capacitor control signal are input and which controls a potential of a second electrode of the $2m$-th capacitor. In the semiconductor storage device, a gate of the $(2m-1)$-th transistor is connected to a $(2m-1)$-th gate-selection signal generator circuit to which a first gate control signal and a $(2m-1)$-th enable signal are input, and the $(2m-1)$-th transistor is controlled to be in a conductive state or a non-conductive state by the $(2m-1)$-th gate-selection signal generator circuit. A gate of the $2m$-th transistor is connected to a $2m$-th gate-selection signal generator circuit to which a second gate control signal and a $2m$-th enable signal are input, and the $2m$-th transistor is controlled to be in a conductive state or a non-conductive state by the $2m$-th gate-selection signal generator circuit. The $(2m-1)$-th data holding portion holds the data by bringing the $(2m-1)$-th transistor and the $2m$-th transistor out of conduction. The $2m$-th data holding portion holds the data by bringing the $2m$-th transistor and the $(2m+1)$-th transistor out of conduction. The $(2m-1)$-th data potential control circuit changes a potential of an output terminal of the $(2m-1)$-th data potential control circuit and controls the potential of the (2m−1)-th data holding portion by capacitive coupling through the (2m−1)-th capacitor. The 2m-th data potential control circuit changes a potential of an output terminal of the 2m-th data potential control circuit and controls the potential of the 2m-th data holding portion by capacitive coupling through the 2m-th capacitor.

According to another embodiment of the present invention, a semiconductor storage device in which storage circuits are cascade-connected includes a (2m−1)-th stage storage circuit and a 2m-th stage storage circuit. The (2m−1)-th stage storage circuit includes a (2m−1)-th transistor having a first terminal from which data is supplied; a (2m−1)-th data holding portion which is electrically connected to a second terminal of the (2m−1)-th transistor, a first terminal of a 2m-th transistor included in a 2m-th stage storage circuit, a first electrode of a (2m−1)-th capacitor, and an input terminal of a (2m−1)-th inverter circuit and which holds the data; and a (2m−1)-th NOR circuit to which a signal of an output terminal of the (2m−1)-th inverter circuit and a first capacitor control signal are input and which has an output terminal electrically connected to a second electrode of the (2m−1)-th capacitor. The 2m-th stage storage circuit includes the 2m-th transistor; a 2m-th data holding portion which is electrically connected to a second terminal of the 2m-th transistor, a first terminal of a (2m+1)-th transistor included in a (2m+1)-th stage storage circuit, a first electrode of a 2m-th capacitor, and an input terminal of a 2m-th inverter circuit and which holds the data which is supplied through the 2m-th transistor; and a 2m-th NOR circuit to which a signal of an output terminal of the 2m-th inverter circuit and a second capacitor control signal are input and which has an output terminal electrically connected to a second electrode of the 2m-th capacitor. In the semiconductor storage device, a gate of the (2m−1)-th transistor in the (2m−1)-th stage storage circuit is connected to a (2m−1)-th gate-selection signal generator circuit to which a first gate control signal and a (2m−1)-th enable signal are input, and the (2m−1)-th transistor is controlled to be in a conductive state or a non-conductive state by the (2m−1)-th gate-selection signal generator circuit. A gate of the 2m-th transistor in the 2m-th stage storage circuit is connected to a 2m-th gate-selection signal generator circuit to which a second gate control signal and a 2m-th enable signal are input, and the 2m-th transistor is controlled to be in a conductive state or a non-conductive state by the 2m-th gate-selection signal generator circuit. The (2m−1)-th data holding portion holds the data by bringing the (2m−1)-th transistor and the 2m-th transistor out of conduction. The 2m-th data holding portion holds the data by bringing the 2m-th transistor and the (2m+1)-th transistor out of conduction. The (2m−1)-th NOR circuit changes a potential of the output terminal of the (2m−1)-th NOR circuit by the signal of the output terminal of the (2m−1)-th inverter circuit and the first capacitor control signal and controls a potential of the (2m−1)-th data holding portion by capacitive coupling through the (2m−1)-th capacitor. The 2m-th NOR circuit changes a potential of the output terminal of the 2m-th NOR circuit by the signal of the output terminal of the 2m-th inverter circuit and the second capacitor control signal and controls a potential of the 2m-th data holding portion by capacitive coupling through the 2m-th capacitor.

In the embodiment of the present invention, it is preferable that, in the semiconductor storage device, a transistor included in each of the (2m−1)-th inverter circuit, the 2m-th inverter circuit, the (2m−1)-th NOR circuit, the 2m-th NOR circuit, the (2m−1)-th gate-selection signal generator circuit, and the 2m-th gate-selection signal generator circuit be a transistor including a semiconductor layer containing silicon.

In the embodiment of the present invention, it is preferable that, in the semiconductor storage device, the transistor including a semiconductor layer containing silicon and the (2m−1)-th transistor and the 2m-th transistor be stacked.

In the embodiment of the present invention, it is preferable that, in the semiconductor storage device, the (2m−1)-th transistor and the 2m-th transistor be each a transistor including a semiconductor layer containing an oxide semiconductor.

In the embodiment of the present invention, it is preferable that, in the semiconductor storage device, the oxide semiconductor be an In—Sn—Zn-based oxide semiconductor.

According to one embodiment of the present invention, it is possible to provide a semiconductor storage device which drives without the necessity of saving and returning a data signal between a volatile storage device and a nonvolatile storage device when the supply of power supply voltage is stopped and resumed.

BRIEF DESCRIPTION OF THE DRAWINGS

FIGS. 1A to 1C are circuit diagrams of a semiconductor storage device.

FIGS. 31A to 31C illustrate a structure of an oxide material according to one embodiment of the present invention.

DETAILED DESCRIPTION OF THE INVENTION

Figure 2:
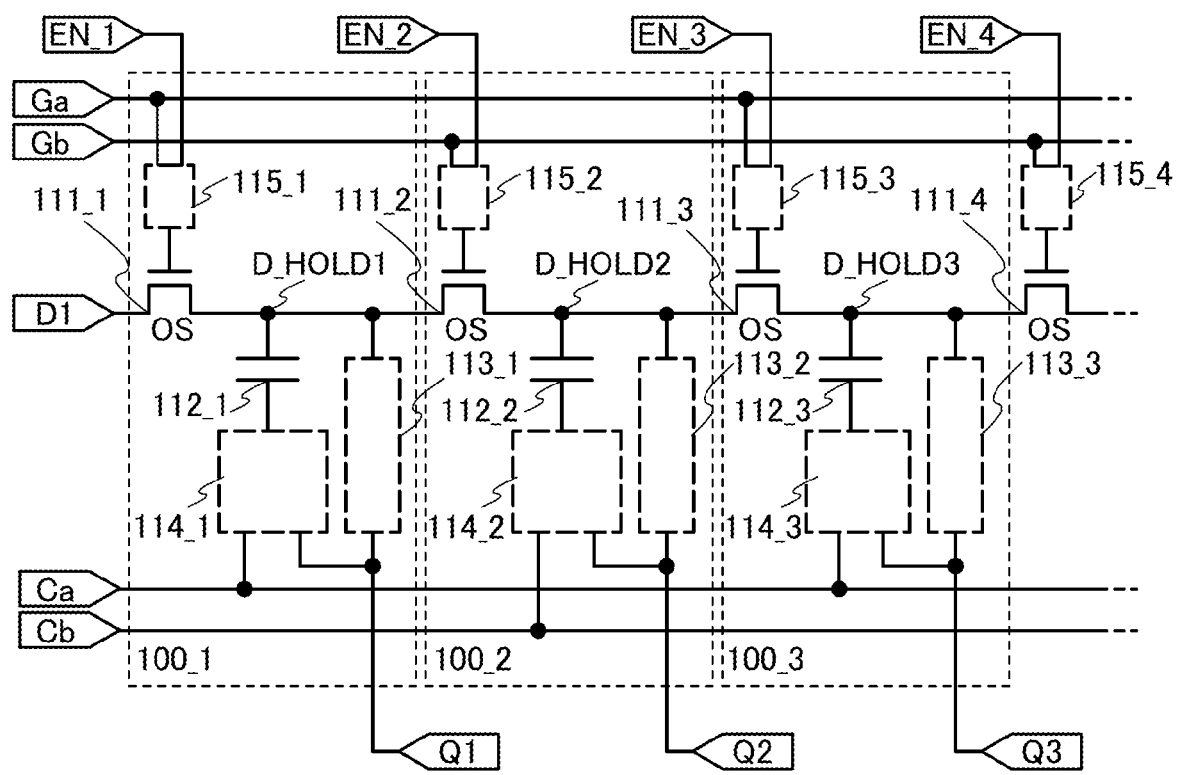
FIG. 2 is a circuit diagram of a semiconductor storage device.

Embodiments of the present invention will be described below with reference to the accompanying drawings. Note that the present invention can be carried out in many different modes, and it is easily understood by those skilled in the art that various changes and modifications can be made without departing from the spirit and scope of the present invention. Therefore, the present invention should not be interpreted as being limited to the description in the following embodiments. Note that in structures of the present invention described below, reference numerals denoting the same portions are used in common in different drawings.

Note that the size, the thickness of a layer, signal waveform, and a region in structures illustrated in the drawings and the like in the embodiments are exaggerated for simplicity in some cases. Therefore, the scale is not necessarily limited to that illustrated in the drawings and the like.

Note that when it is explicitly described that "A and B are connected", the case where A and B are electrically connected, the case where A and B are functionally connected, and the case where A and B are directly connected are included therein.

Note that in this specification, the terms "first", "second", "third", and "N-th" (N is a natural number) are used in order to avoid confusion between components and thus do not limit the number of the components.

Embodiment 1

A semiconductor storage device can be a circuit that functions as a multi-bit register by using cascade-connected storage circuits in a plurality of stages. This embodiment describes the configuration of a semiconductor storage device having a plurality of stages of storage circuits. Note that the semiconductor storage device described in this embodiment can be used for a storage device of a signal processing unit.

Note that examples of the signal processing unit includes, in its category, a large scale integrated circuit (LSI) such as a CPU, a microprocessor, an image processing circuit, a digital signal processor (DSP), and a field programmable gate array (FPGA).

FIG. 1A is an example of a block diagram of a semiconductor storage device 10 that functions as an N-bit register. In the semiconductor storage device 10 of this embodiment illustrated in FIG. 1A, N stages of storage circuits (N is a natural number) (storage circuits 100_1 to 100_N) are cascade-connected and N-bit data signals which are input sequentially are output as output data Q1 to QN. Whereas data D is input to an input terminal D in the first-stage storage circuit 100_1, an output signal OUT of the previous stage is input to an input terminal D of each of the second-stage to N-th stage storage circuits 100_2 to 100_N.

To an odd-numbered stage storage circuit (a (2m−1)-th stage storage circuit; m is a natural number of 1 or more), a first gate control signal Ga and a first capacitor control signal Ca are input. To an even-numbered stage storage circuit (a 2m-th stage storage circuit; m is a natural number of 1 or more), a second gate control signal Gb and a second capacitor control signal Ca are input. In addition, an enable signal is input to the storage circuit in each stage. For example, a first enable signal is input to the first-stage storage circuit, a second enable signal is input to the second-stage storage circuit, a (2m−1)-th enable signal is input to the (2m−1)-th stage storage circuit, a 2m-th enable signal is input to the 2m-th stage storage circuit, and an N-th enable signal is input to the N-th stage storage circuit.

To the storage circuit in each stage, a wiring for supplying a high power supply potential VDD and a wiring for supplying a low power supply potential VSS (GND) are connected. In the configuration of this embodiment, even when the supply of power supply voltage is stopped at the timing when data is held, the data D which is taken into the storage circuit can be held therein, and, in the case where the supply of power supply voltage is resumed, the held data D can be output. In this case, with a configuration in which the potential of the wiring for supplying a high power supply potential VDD is switched to a low power supply potential VSS, switching between a stop and a resumption of the supply of power supply voltage is performed.

Note that in this specification, stop of the supply of a signal or power supply voltage means that the supply of the signal or the power supply voltage to a wiring for supplying the signal or the power supply voltage is not performed. Note also that in this specification, resumption of the supply of a signal or power supply voltage means that the supply of the signal or the power supply voltage to a wiring for supplying the signal or the power supply voltage is resumed from a state where the supply of the signal or the power supply voltage has been stopped. Note also that in this specification, fixing of a signal means that, for example, an AC signal oscillated with a predetermined frequency is converted into a DC signal having a fixed potential such as a high power supply potential VDD or a low power supply potential VSS.

Next, in order to describe a specific circuit configuration, FIG. 1B illustrates a circuit configuration of the first-stage storage circuit 100_1 which is one of the odd-numbered storage circuits in FIG. 1A. The first-stage storage circuit 100_1 in FIG. 1B includes a first transistor 111_1, a first capacitor 112_1, a first data potential holding and outputting circuit 113_1, a first data potential control circuit 114_1, and a first gate-selection signal generator circuit 115_1.

One (a first terminal) of a source and a drain of the first transistor 111_1 is connected to a data signal line for supplying the data D. The other (a second terminal) of the source and the drain of the first transistor 111_1 is connected to a first electrode of the first capacitor 112_1 and an output terminal for outputting an output signal OUT. A gate of the first transistor 111_1 is connected to a wiring to which an output signal from the first gate-selection signal generator circuit 115_1 is output. The first gate control signal Ga and the first enable signal EN_1 are input to the first gate-selection signal generator circuit 115_1. A wiring to which the first transistor 111_1, the first electrode of the first capacitor 112_1, and the output terminal for outputting the output signal OUT are connected is a wiring for holding data which is supplied through the first transistor 111_1 and is also referred to as first data holding portion D_HOLD1 in the following description.

The first data potential holding and outputting circuit 113_1 is connected to the first data holding portion D_HOLD1. The first data potential holding and outputting circuit 113_1 includes a transistor and outputs a signal in response to a signal applied to a gate of the transistor. As the first data potential holding and outputting circuit 113_1, an inverter circuit or a buffer circuit including a complementary transistor can be used. The signals are input and output by controlling the outputs of the potentials of the power supply voltages through a channel formation region of the transistor, with an insulator including a gate insulating film of the transistor provided between the gate and the channel formation region.

The first data potential control circuit 114_1 is connected to a second electrode of the first capacitor 112_1. The first data potential control circuit 114_1 controls the potential of the second electrode of the first capacitor 112_1 in response to the first capacitor control signal Ca and an output signal of the first data potential holding and outputting circuit 113_1. When the first data holding portion D_HOLD1 is in an electrically floating state by controlling the potential of the second electrode of the first capacitor 112_1 in the first data potential control circuit 114_1, the potential of the first data holding portion D_HOLD1 can be controlled without leaking electric charge by capacitive coupling through the first capacitor 112_1.

Next, FIG. 1C illustrates a circuit configuration of a second-stage storage circuit 100_2 which is one of the even-numbered storage circuits in FIG. 1A. The second-stage storage circuit 100_2 in FIG. 1C includes a second transistor 111_2, a second capacitor 112_2, a second data potential holding and outputting circuit 113_2, a second data potential control circuit 114_2, and a second gate-selection signal generator circuit 115_2.

One (a first terminal) of a source and a drain of the second transistor 111_2 is connected to the output terminal for outputting the output signal OUT of the first-stage storage circuit 100_1, i.e., the first data holding portion D_HOLD1. The other (a second terminal) of the source and the drain of the second transistor 111_2 is connected to a first electrode of the second capacitor 112_2 and an output terminal for outputting an output signal OUT. A gate of the second transistor 111_2 is connected to a wiring to which an output signal from the second gate-selection signal generator circuit 115_2 is output. The second gate control signal Gb and the second enable signal EN_2 are input to the second gate-selection signal generator circuit 115_2. A wiring to which the second transistor 111_2, the first electrode of the second capacitor 112_2, and the output terminal for outputting the output signal OUT are connected is a wiring for holding data which is supplied through the second transistor 111_2 and is also referred to as second data holding portion D_HOLD2 in the following description.

The second data potential holding and outputting circuit 113_2 is connected to the second data holding portion D_HOLD2. The second data potential holding and outputting circuit 113_2 includes a transistor and outputs a signal in response to a signal applied to a gate of the transistor. As the second data potential holding and outputting circuit 113_2, an inverter circuit or a buffer circuit including a complementary transistor can be used. The signals are input and output by controlling the outputs of the potentials of the power supply voltages through a channel formation region of the transistor, with an insulator including a gate insulating film of the transistor provided between the gate and the channel formation region.

The second data potential control circuit 114_2 is connected to a second electrode of the second capacitor 112_2. The second data potential control circuit 114_2 controls the potential of the second electrode of the second capacitor 112_2 in response to the second capacitor control signal Cb and an output signal of the second data potential holding and outputting circuit 113_2. When the second data holding portion D_HOLD2 is in an electrically floating state by controlling the potential of the second electrode of the second capacitor 112_2 in the second data potential control circuit 114_2, the potential of the second data holding portion D_HOLD2 can be controlled without leaking electric charge by capacitive coupling through the second capacitor 112_2.

As illustrated in FIG. 2, a third-stage storage circuit 100_3 and a fourth-stage storage circuit 100_4 (not illustrated) can be illustrated in a manner similar to that of the first-stage storage circuit 100_1 in FIG. 1B and the second-stage storage circuit 100_2 in FIG. 1C. For example, the third-stage storage circuit 100_3 in FIG. 2 includes a third transistor 111_3, a third capacitor 112_3, a third data potential holding and outputting circuit 113_3, a third data potential control circuit 114_3, and a third gate-selection signal generator circuit 115_3 in a manner similar to that of the first-stage storage circuit 100_1 which is also the odd-numbered storage circuit.

In this specification, elements in the third-stage storage circuit 100_3 to the N-th stage storage circuit 100_N are denoted by the ordinal numbers of "third" to "N-th". Note that according to one embodiment of the present invention, an odd-numbered storage circuit and an even-numbered storage circuit will be described separately. In this case, in the description, the ordinal number of "first" denotes elements in the first-stage storage circuit which are given as examples of elements in the odd-numbered stage storage circuit, and the ordinal number of "second" denotes elements in the second-stage storage circuit which are given as examples of elements in the even-numbered stage storage circuit. In addition, the elements in the odd-numbered stage storage circuit can be regarded as elements in the (2m−1)-th stage storage circuit and can be denoted by the ordinal number of "first" (or "third"). The elements in the even-numbered stage storage circuit can be regarded as elements in the 2m-th stage storage circuit and can be denoted by the ordinal number of "second" (or "fourth").

As also illustrated in FIG. 2, the first data holding portion D_HOLD1 is connected to an insulator of each of the first transistor 111_1, the second transistor 111_2, the first capacitor 112_1, and the first data potential holding and outputting circuit 113_1, and leakage of electric charge through the insulator hardly occurs in the first data holding portion D_HOLD1. In the first data holding portion D_HOLD1, electric charge is input/output only through the first transistor 111_1 or the second transistor 111_2. Therefore, the potential of the first data holding portion D_HOLD1 can be held by reducing as much as possible the off-state current in the case where the first transistor 111_1 and the second transistor 111_2 are in a non-conductive state.

As also illustrated in FIG. 2, the second data holding portion D_HOLD2 is connected to an insulator of each of the second transistor 111_2, the third transistor 111_3, the second capacitor 112_2, and the second data potential holding and outputting circuit 113_2, and leakage of electric charge through the insulator hardly occurs in the second data holding portion D_HOLD2. In the second data holding portion D_HOLD2, electric charge is input/output only through the second transistor 111_2 or the third transistor 111_3. Therefore, the potential of the second data holding portion D_HOLD2 can be held by reducing as much as possible the off-state current in the cases where the second transistor 111_2 and the third transistor 111_3 are in a non-conductive state.

Note that a potential can also be held in a third data holding portion D_HOLD3 by reducing the off-state current of the third transistor 111_3 connected thereto, in a manner similar to that of the first data holding portion D_HOLD1 and the second data holding portion D_HOLD2.

In this embodiment, a transistor whose channel is formed in an oxide semiconductor layer is used as each of the first transistor 111_1 to an N-th transistor 111_N included in the storage circuits in the plurality of stages in order to reduce as much as possible the off-state current in the case where the transistors are in a non-conductive state. In drawings, as illustrated in FIG. 2, "OS" is written in order to indicate that the first transistor 111_1 to a fourth transistor 111_4, are each a transistor whose channel is formed in an oxide semiconductor layer.

An oxide semiconductor includes at least one element selected from In, Ga, Sn, and Zn. For example, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor; or a one-component metal oxide such as an In-based oxide semiconductor, a Sn-based oxide semiconductor, or a Zn-based oxide semiconductor can be used. In addition, any of the above oxide semiconductors may contain an element other than In, Ga, Sn, and Zn, for example, $SiO_2$.

As another element, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, an In—Ga—Zn-based oxide semiconductor means an oxide semiconductor containing indium (In), gallium (Ga), and zinc (Zn), and there is no limitation on the composition ratio thereof. In particular, in the case where an In—Sn—Zn-based oxide semiconductor is used for an oxide semiconductor film, the mobility of the transistor can be increased. Further, the use of an In—Sn—Zn-based oxide semiconductor for the transistor allows the threshold voltage of the transistor to be stably controlled.

As the oxide semiconductor, a thin film represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn-based material is to be used as an oxide semiconductor, a ratio of atoms of the metal elements of the target is In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for forming an In—Zn-based oxide semiconductor having an atomic ratio of In:Zn:O=X:Y:Z, the relation of Z>1.5X+Y is satisfied.

In the case where the In—Sn—Zn-based oxide semiconductor is used, a ratio of atoms of the metal elements of the target is In:Sn:Zn=1:1:1, In:Sn:Zn=2:1:3, In:Sn:Zn=1:2:2, or In:Sn:Zn=20:45:35 in an atomic ratio, for example.

The composition is not limited to those described above, and a material having an appropriate composition may be used depending on required semiconductor characteristics (e.g., mobility, threshold voltage, and variation). In order to obtain required semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case of using the In—Sn—Zn-based oxide semiconductor. However, mobility can be increased by reducing the defect density in a bulk also in the case of using an In—Ga—Zn-based oxide semiconductor.

The oxide semiconductor may be either single crystal or non-single-crystal. In the case where the oxide semiconductor is non-single-crystal, the oxide semiconductor is preferably polycrystal with which a field-effect mobility higher than that of an amorphous oxide semiconductor can be expected. Alternatively, in the case where the oxide semiconductor is non-single-crystal, the oxide semiconductor may be amorphous. Further, the oxide semiconductor may have an amorphous structure including a portion having crystallinity. Note that although the oxide semiconductor may be amorphous, it is preferable that the oxide semiconductor have a non-amorphous structure including a crystalline component in the oxide semiconductor in order to improve the field-effect mobility or reliability of the transistor.

Note that the surface of the oxide semiconductor is preferably flat. When a transistor is formed using an oxide semiconductor film whose surface is flat, interface scattering of carriers can be reduced, and relatively high mobility can be obtained with relative ease.

In order to improve the surface flatness, the oxide semiconductor is preferably formed over a flat surface. Specifically, the oxide semiconductor is preferably formed over a surface with the average surface roughness ($R_a$) of less than or equal to 1 nm, more preferably less than or equal to 0.3 nm, further preferably less than or equal to 0.1 nm.

Note that $R_a$ is obtained by three-dimension expansion of center line average roughness that is defined by JIS B 0601 to be applied to a plane. The $R_a$ can be expressed as an "average value of the absolute values of deviations from a reference surface to a specific surface" and is defined by the formula (1) below.

[FORMULA 1]

$$Ra = \frac{1}{S_0} \int_{y_1}^{y_2} \int_{x_1}^{x_2} |f(x, y) - Z_0| dx dy \quad (1)$$

In the formula (1), $S_0$ represents an area of a plane to be measured (a quadrangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

The off-state current density of a transistor whose channel is formed in an oxide semiconductor layer that is highly purified by thorough removal of hydrogen contained in the oxide semiconductor layer can be less than or equal to 100 zA/μm, preferably less than or equal to 10 zA/μm, more preferably less than or equal to 1 zA/μm. Thus, the off-state current of the transistor is extremely lower than that of a transistor including silicon with crystallinity. Consequently, the potential of the first data holding portion D_HOLD1 and the potential of the second data holding portion D_HOLD2 can be held for a long time when the first transistor 111_1, the second transistor 111_2, and the third transistor 111_3 are in a non-conductive state.

Note that in this specification, an off-state current is a current which flows between a source and a drain when a transistor is in a non-conductive state. In the case of an n-channel transistor (e.g., with a threshold voltage of about 0 V to 2 V), the off-state current means a current which flows between a source and a drain when a negative voltage is applied between a gate and the source.

A material which can realize off-state current characteristics equivalent to those of the oxide semiconductor material may be used instead of the oxide semiconductor material. For example, a wide gap material like silicon carbide (more specifically, a semiconductor material whose energy gap Eg is larger than 3 eV) can be used. Further, a MEMS switch or the like may be used instead of a transistor to break connection between wirings, whereby electric charge in the first data holding portion D_HOLD1 and electric charge in the second data holding portion D_HOLD2 can be held for a long time.

Figure 3A:
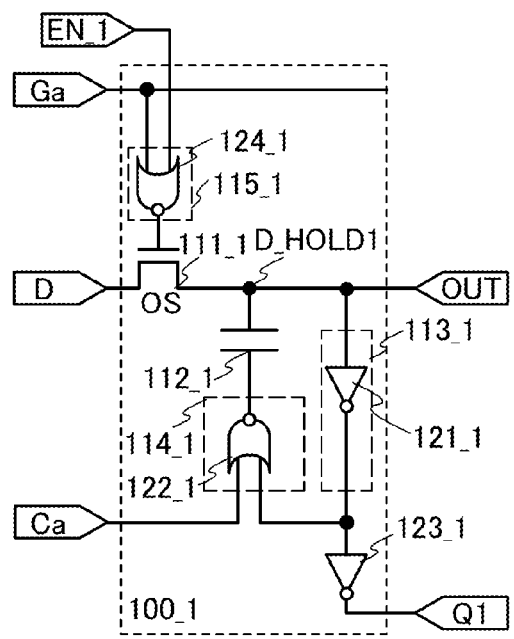
FIGS. 3A and 3B are circuit diagrams of a semiconductor storage device.
Figure 3B:
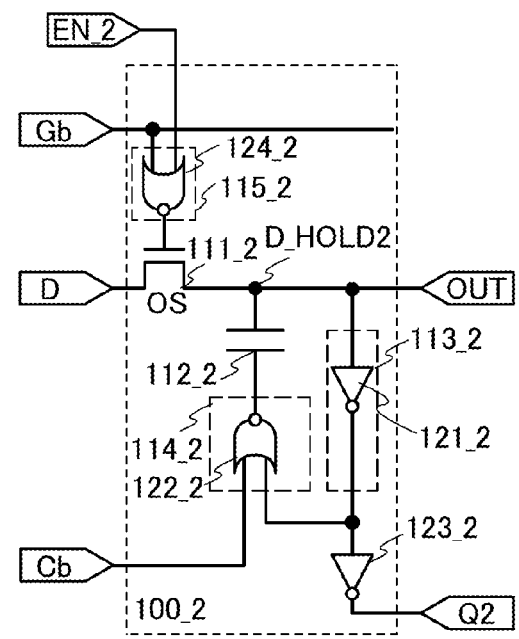
Figure 4:
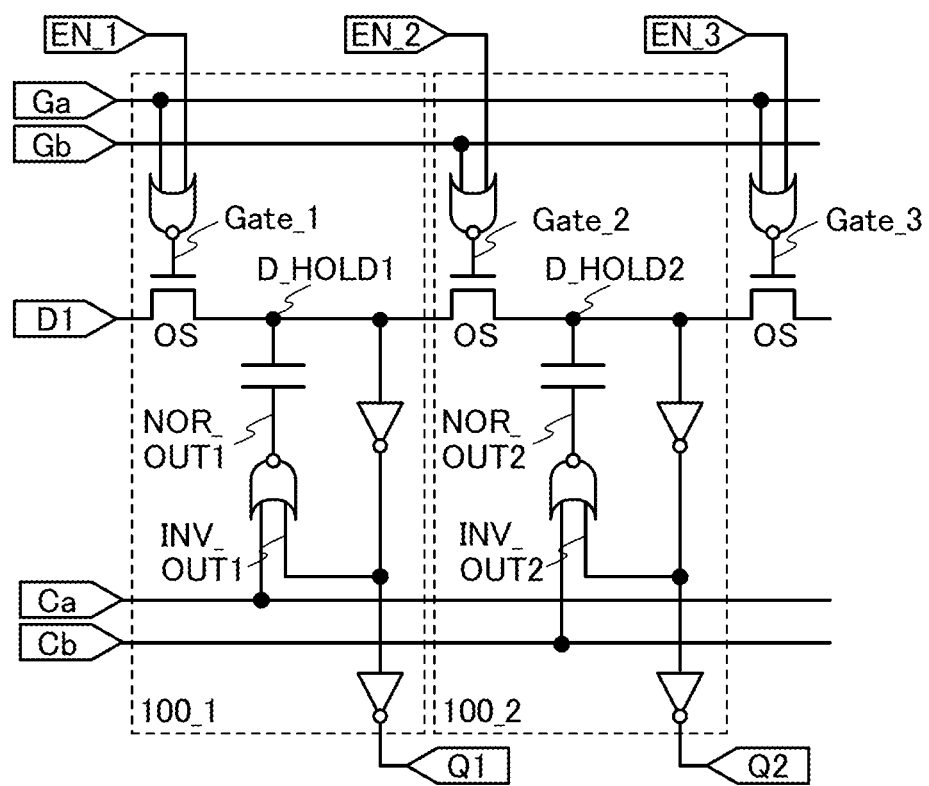
FIG. 4 is a circuit diagram of a semiconductor storage device.

Next, FIG. 3A is a circuit diagram illustrating a specific example of the first data potential holding and outputting circuit 113_1, the first data potential control circuit 114_1, and the first gate-selection signal generator circuit 115_1 in FIG. 1B. FIG. 3B is a circuit diagram illustrating a specific example of the second data potential holding and outputting circuit 113_2, the second data potential control circuit 114_2, and the second gate-selection signal generator circuit 115_2 in FIG. 1C. FIG. 4 illustrates the first-stage storage circuit 100_1 in FIG. 3A and the second-stage storage circuit 100_2 in FIG. 3B together.

In FIG. 3A, a first inverter circuit 121_1 is included in the first data potential holding and outputting circuit 113_1. Without changing the potential of the data held in the first data holding portion D_HOLD1, the first inverter circuit 121_1 can output a signal of the data whose logic is inverted. Note that an output signal of the first inverter circuit 121_1 can be referred to as "first data inverted signal INV_OUT1" in the following description. Note that in FIG. 4, the first data inverted signal INV_OUT1 is illustrated. Since the first data inverted signal INV_OUT1 becomes a signal whose logic is the inverted logic of the potential of the data in the first data holding portion D_HOLD1 by the first inverter circuit 121_1, the signal is output through an output data inverter circuit 123_1 as the output data Q1.

In FIG. 3A, a first NOR circuit 122_1 is included in the first data potential control circuit 114_1. The first NOR circuit 122_1 outputs, to the second electrode of the first capacitor 112_1, a signal whose logic is obtained by NOR of the first data inverted signal INV_OUT1 and the first capacitor control signal Ca. Note that even when the first transistor 111_1 and the second transistor 111_2 are in a non-conductive state when the first data holding portion D_HOLD1 is in an electrically floating state, the potential of the data held in the first data holding portion D_HOLD1 can be changed by changing the potential of the second electrode of the first capacitor 112_1. Note that an output signal of the first NOR circuit 122_1 is referred to as "first NOR output signal NOR_OUT1" in the following description. Note that in FIG. 4, the first NOR output signal NOR_OUT1 is illustrated.

In FIG. 3A, a NOR circuit (hereinafter referred to as first gate-selection NOR circuit 124_1) is included in the first gate-selection signal generator circuit 115_1. The first gate-selection NOR circuit 124_1 outputs, to the gate of the first transistor 111_1, a signal whose logic is obtained by NOR of the first gate control signal Ga and the first enable signal EN_1. The first transistor 111_1 is controlled to be in a conductive state or a non-conductive state in response to the potential of an output signal of the first gate-selection NOR circuit 124_1. Note that the output signal of the first gate-selection NOR circuit 124_1 is referred to as "first gate-selection signal Gate_1" in the following description. Note that in FIG. 4, the first gate-selection signal Gate_1 is illustrated.

In FIG. 3B, a second inverter circuit 121_2 is included in the second data potential holding and outputting circuit 113_2. Without changing the potential of the data held in the second data holding portion D_HOLD2, the second inverter circuit 121_2 can output a signal of the data whose logic is inverted. Note that an output signal of the second inverter circuit 121_2 can be referred to as "second data inverted signal INV_OUT2" in the following description. Note that in FIG. 4, the second data inverted signal INV_OUT2 is illustrated. Since the second data inverted signal INV_OUT2 becomes a signal whose logic is the inverted logic of the potential of the data in the second data holding portion D_HOLD2 by the second inverter circuit 121_2 outputs, the signal is output through an output data inverter circuit 123_2 as output data Q2.

In FIG. 3B, a second NOR circuit 122_2 is included in the second data potential control circuit 114_2. The second NOR circuit 122_2 outputs, to the second electrode of the second capacitor 112_2, a signal whose logic is obtained by NOR of the second data inverted signal INV_OUT2 and the second capacitor control signal Cb. Note that when the second data holding portion D_HOLD2 is in an electrically floating state and the second transistor 112_2 and the third transistor 111_3 are in a non-conductive state, the potential of the data held in the second data holding portion D_HOLD2 can be changed by changing the potential of the second electrode of the second capacitor 112_2. Note that an output signal of the second NOR circuit 122_2 is referred to as "second NOR output signal NOR_OUT2" in the following description. Note that in FIG. 4, the second NOR output signal NOR_OUT2 is illustrated.

In FIG. 3B, a NOR circuit (hereinafter referred to as second gate-selection NOR circuit 124_2) is included in the second gate-selection signal generator circuit 115_2. The second gate-selection NOR circuit 124_2 outputs, to the gate of the second transistor 111_2, a signal whose logic is obtained by NOR of the second gate control signal Gb and the second enable signal EN_2. The second transistor 111_2 is controlled to be in a conductive state or a non-conductive state in response to the potential of an output signal of the second gate-selection NOR circuit 124_2. Note that the output signal of the second gate-selection NOR circuit 124_2 is referred to as "second gate-selection signal Gate_2" in the following description. Note that in FIG. 4, the second gate-selection signal Gate_2 is illustrated.

Each of the first inverter circuit 121_1, the second inverter circuit 121_2, the output data inverter circuit 123_1, and the output data inverter circuit 123_2 in FIGS. 3A and 3B has a circuit configuration in which a p-channel transistor and an n-channel transistor are used in combination, for example.

Each of the first NOR circuit 122_1, the second NOR circuit 122_2, the first gate-selection NOR circuit 124_1, and the second gate-selection NOR circuit 124_2 in FIGS. 3A and 3B has a circuit configuration in which a p-channel transistor and an n-channel transistor are used in combination, for example.

Transistors included in the first inverter circuit 121_1, the second inverter circuit 121_2, the output data inverter circuit 123_1, the output data inverter circuit 123_2, the first NOR circuit 122_1, the second NOR circuit 122_2, the first gate-selection NOR circuit 124_1, and the second gate-selection NOR circuit 124_2 in FIGS. 3A and 3B can each be a transistor whose channel is formed in a layer or a substrate composed of a semiconductor other than an oxide semiconductor. For example, a transistor whose channel is formed in a silicon layer or a silicon substrate can be used.

Figure 5:
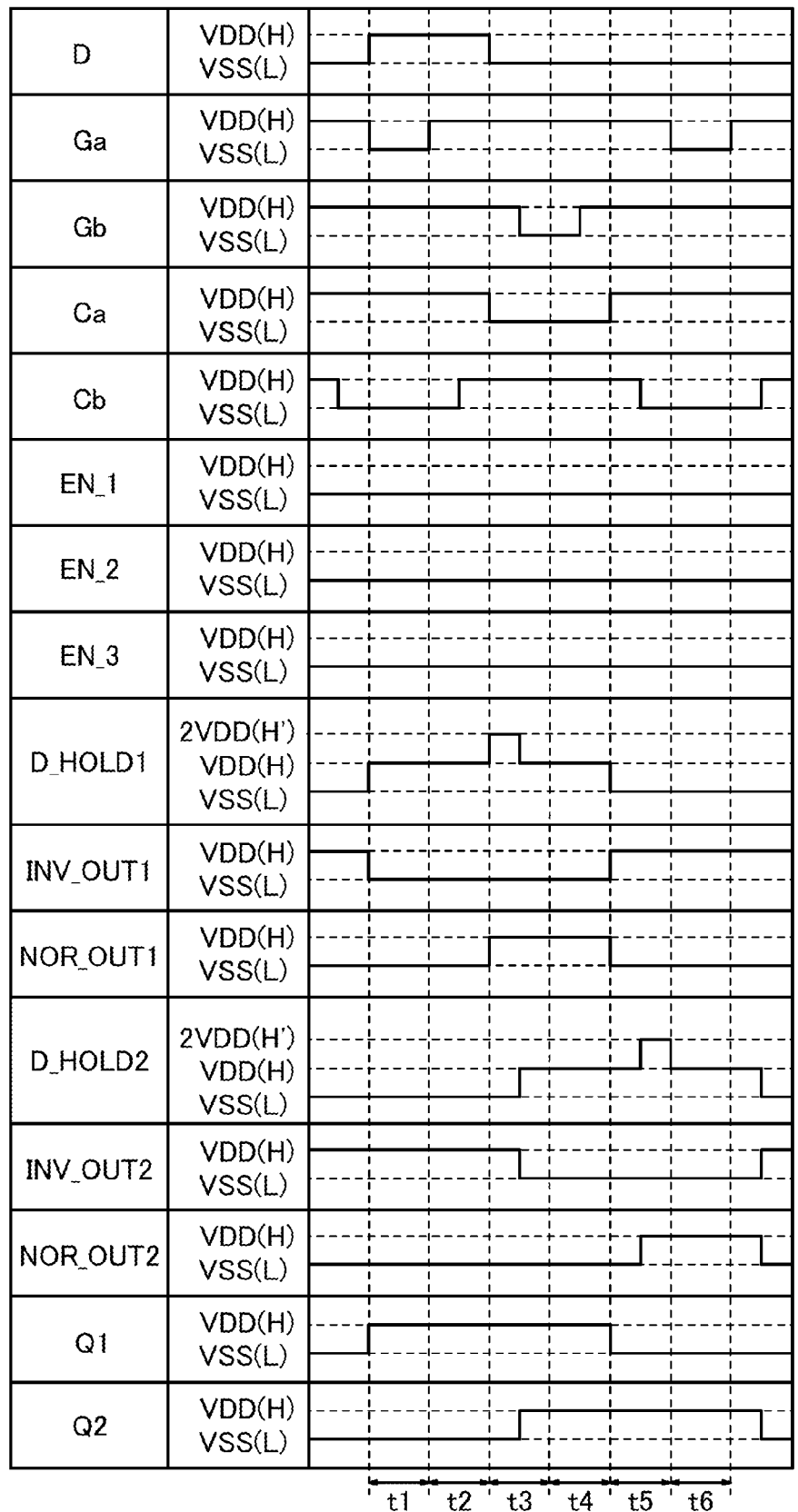
FIG. 5 is a timing chart showing the operation of a semiconductor storage device.

Next, operation of the semiconductor storage device at the time of holding and outputting N-bit data signals will be described. FIG. 5 is a timing chart at the time of inputting an H-level data signal (data "1") to the first-stage storage circuit 100_1 and the second-stage storage circuit 100_2 in FIG. 4 and holding the data signal. Description of the operation of the semiconductor storage device will be given with reference to the timing chart. In the timing chart of FIG. 5, D, Ga, Gb, Ca, Cb, EN_1, EN_2, EN_3, D_HOLD1, INV_OUT1, NOR_OUT1, D_HOLD2, INV_OUT2, NOR_OUT2, Q1, and Q2 correspond to the potentials of the input and the output signals, the terminals, and the wirings which are described in FIG. 4. In the timing chart of FIG. 5, for the description of a plurality of possible states of the first-stage storage circuit 100_1 and the second-stage storage circuit 100_2, a plurality of periods (periods t1 to t6) are shown with reference to FIGS. 6A and 6B, FIGS. 7A and 7B, and FIGS. 8A and 8B.

In the description of the operation in FIG. 5 below, transistors have the same conductivity types and logic circuits as the respective transistors illustrated in FIG. 4. Note that in the following description, the transistors do not necessarily have such conductivity types and logic circuits, and the conductivity type of each of the transistors, combination of the logic circuits, and the potential of each control signal can be determined as appropriate as long as the transistors perform the same operation in their conductive states. Each signal can be represented by an H signal (a high power supply potential VDD) and an L signal (a low power supply potential VSS). In the following description, the potential of the first data holding portion D_HOLD1 and the potential of the second data holding portion D_HOLD2 which are increased by capacitive coupling are each indicated by an "H' potential" (also referred to as 2VDD). Note that in the description of FIG. 5, FIGS. 6A and 6B, FIGS. 7A and 7B, and FIGS. 8A and 8B, the potential of the first data holding portion D_HOLD1 and the potential of the second data holding portion D_HOLD2 are each an L signal in an initial state.

Note that although each signal is described as an H signal or an L signal in the description of the timing chart, a potential of an H signal and an L signal may be different depending on the signals. For example, a decrease in potential, which corresponds to the threshold voltages of the first transistor 111_1 to the N-th transistor 111_N, can be suppressed by increasing potentials of H signals of the first gate control signal Ga, the second gate control signal Gb, and the first to N-th enable signals EN_1 to EN_N and potentials of the output signals of the first gate-selection NOR circuit 124_1 to an N-th gate-selection NOR circuit 124_N than a potential of an H-level of the data signal D.

The operation in the period t1 in FIG. 5 will be described. The period t1 is a period in which data of an H signal is taken into the first data holding portion D_HOLD1 from the data signal line.

Figure 6A:
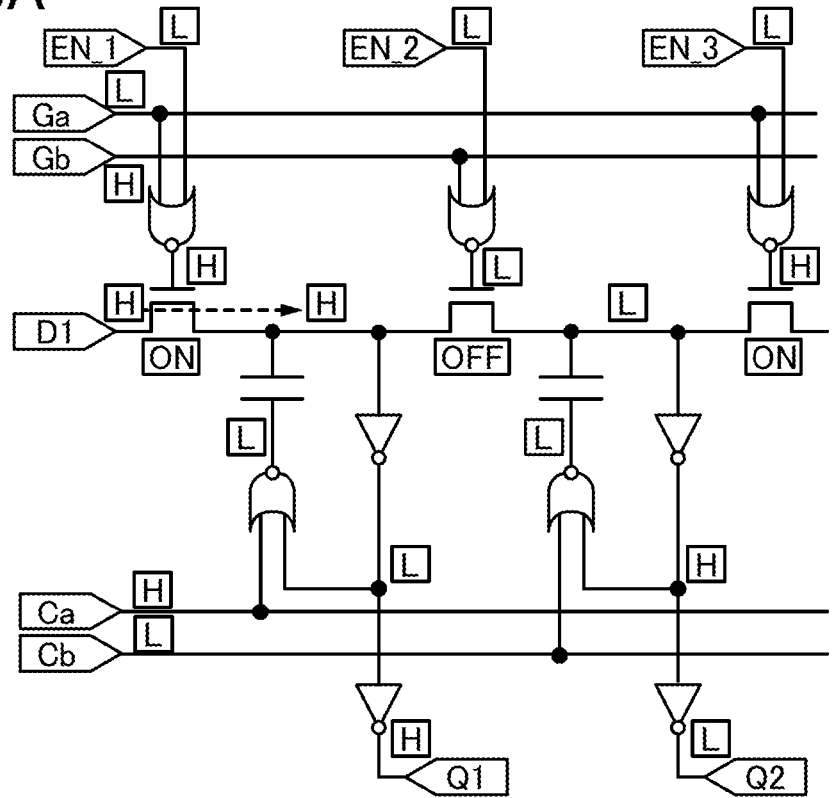
FIGS. 6A and 6B illustrate the operation of a semiconductor storage device.

FIG. 6A illustrates conductive states of the transistors and a flow of a current which is made visible in a dotted-line arrow in the first-stage storage device 100_1 and the second-stage storage circuit 100_2 in the period t1. Note that in the description of FIGS. 6A and 6B, FIGS. 7A and 7B, and FIGS. 8A and 8B, whereas "ON" is written to indicate that a transistor is in a conductive state, "OFF" is written to indicate that a transistor is in a non-conductive state. Further, in the description of FIGS. 6A and 6B, FIGS. 7A and 7B, and FIGS. 8A and 8B, "H" and "L" which correspond to an H signal and an L signal of the potentials of the input and output signals and the wirings, respectively, are also written.

In the period t1, the first transistor 111_1 is brought into conduction by setting the first gate control signal Ga to an L signal and the first enable signal EN_1 to an L signal so that the first gate-selection signal Gate_1 becomes an H signal. Then, an H signal is taken into the first data holding portion D_HOLD1 from the data signal line. In addition, the second transistor 111_2 is brought out of conduction by setting the second gate control signal Gb to an H signal and the second enable signal EN_2 to an L signal so that the second gate-selection signal Gate_2 becomes an L signal. At this time, the potential of the second data holding portion D_HOLD2 remains an L signal. Further, the third transistor 111_3 is brought into conduction by setting the first gate control signal Ga to the L signal and the third enable signal EN_3 to an L signal so that the third gate-selection signal Gate_3 becomes an H signal.

In the period t1, when the potential of the first data holding portion D_HOLD1 is the H signal, the first data inverted signal INV_OUT1 is an L signal. At this time, output data Q1 which is output from the output data inverter circuit 123_1 is an H signal. In addition, when the potential of the second data holding portion D_HOLD2 is the L signal, the second data inverted signal INV_OUT2 is an H signal. Further, output data Q2 which is output from the output data inverter circuit 123_2 is an L signal.

In the period t1, the first capacitor control signal Ca is set to an H signal, and then the H signal and the L signal are input to the first NOR circuit 122_1. Consequently, the first NOR output signal NOR_OUT1 is an L signal. In the period t1, the second capacitor control signal Cb is set to an L signal, and then the L signal and the H signal are input to the second NOR circuit 122_2. Consequently, the second NOR output signal NOR_OUT2 is an L signal.

The operation in the period t2 in FIG. 5 will be described. The period t2 is a period in which the data of an H signal is held in the first data holding portion D_HOLD1.

Figure 6B:
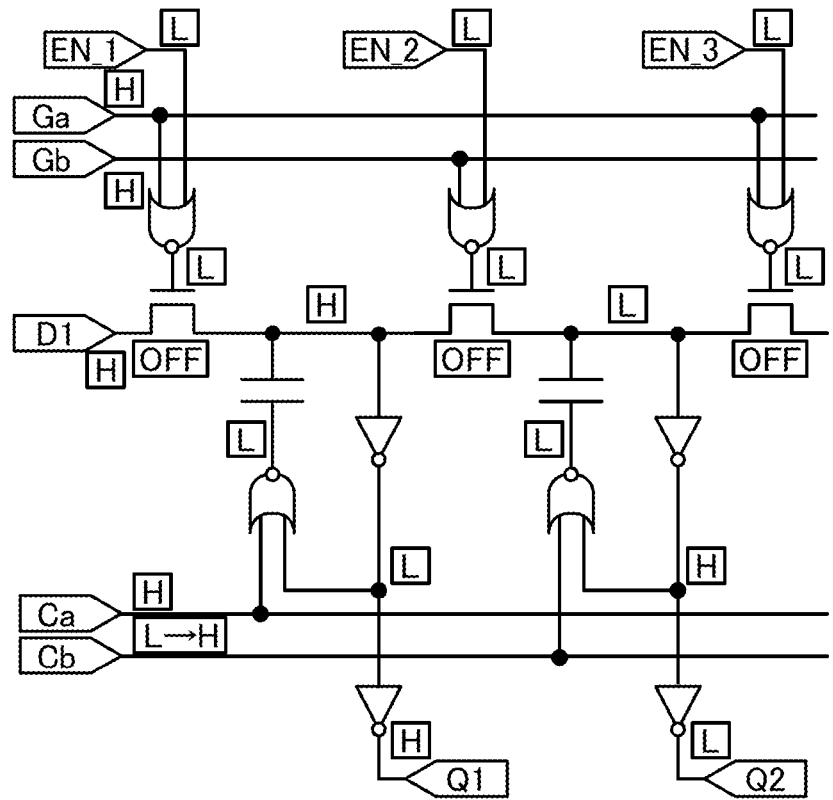

FIG. 6B illustrates conductive states of the transistors in the first-stage storage circuit 100_1 and the second-stage storage circuit 100_2 in the period t2.

In the period t2, the first transistor 111_1 is brought out of conduction by setting the first gate control signal Ga to an H signal and the first enable signal EN_1 to an L signal so that the first gate-selection signal Gate_1 becomes an L signal. At this time, the potential of the first data holding portion D_HOLD1 and the potential of the data signal line remain the H signals. In addition, the second transistor 111_2 is brought out of conduction by setting the second gate control signal Gb to an H signal and the second enable signal EN_2 to an L signal so that the second gate-selection signal Gate_2 becomes an L signal. At this time, the potential of the second data holding portion D_HOLD2 remains the L signal. Further, the third transistor 111_3 is brought out of conduction by setting the first gate control signal Ga to the L signal and the third enable signal EN_3 to an L signal so that the third gate-selection signal Gate_3 becomes an L signal.

In the period t2, when the potential of the first data holding portion D_HOLD1 is the H signal, the first data inverted signal INV_OUT1 is an L signal. At this time, output data Q1 which is output from the output data inverter circuit 123_1 is an H signal. In addition, when the potential of the second data holding portion D_HOLD2 is the L signal, the second data inverted signal INV_OUT2 is an H signal. Further, output data Q2 which is output from the output data inverter circuit 123_2 is an L signal.

In the period t2, the first capacitor control signal Ca is set to an H signal, and then the H signal and the L signal are input to the first NOR circuit 122_1. Consequently, the first NOR output signal NOR_OUT1 is an L signal. In the period t2, the second capacitor control signal Cb is switched from the L signal to an H signal, and then the L signal and the H signal are input to the second NOR circuit 122_2 or the H signal and the H signal are input to the second NOR circuit 122_2. Consequently, the second NOR output signal NOR_OUT2 is an L signal.

The operation in the period t3 in FIG. 5 will be described. The period t3 is a period in which the H signal of the first data holding portion D_HOLD1 is taken into the second data holding portion D_HOLD2.

Figure 7A:
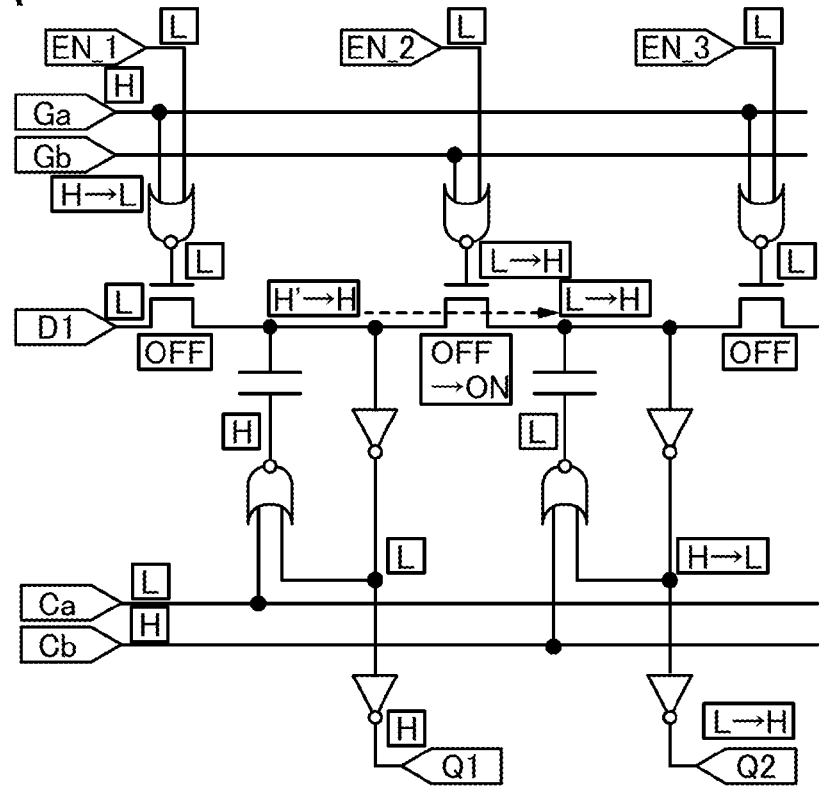
FIGS. 7A and 7B illustrate the operation of a semiconductor storage device.

FIG. 7A illustrates conductive states of the transistors and a flow of a current which is made visible in a dotted-line arrow in the first-stage storage circuit 100_1 and the second-stage storage circuit 100_2 in the period t3.

In the period t3, first, the first transistor 111_1 and the second transistor 111_2 are brought out of conduction by setting the first gate control signal Ga to an H signal and the first enable signal EN_1 to an L signal so that the first gate-selection signal Gate_1 becomes an L signal, and by setting the second gate control signal Gb to an H signal and the second enable signal EN_2 to an L signal so that the second gate-selection signal Gate_2 becomes an L signal, whereby the first data holding portion D_HOLD1 is made in an electrically floating state. At this time, the potential of the first data holding portion D_HOLD1 is raised to an H' signal by the capacitive coupling through the first capacitor 112_1. Then, in the period t3, the second transistor 111_2 is brought into conduction from the non-conductive state by setting the second gate control signal Gb to an L signal from the H signal and the second enable signal EN_2 to the L signal so that the second gate-selection signal Gate_2 becomes an H signal from the L signal. At this time, electric charge in the first data holding portion D_HOLD1 moves to the second data holding portion D_HOLD2, whereby the potential of the first data holding portion D_HOLD1 becomes an H signal from the H' signal, and the potential of the second data holding portion D_HOLD2 becomes an H signal from an L signal.

In the period t3, the third transistor 111_3 is brought out of conduction by setting the first gate control signal Ga to the H signal and the third enable signal EN_3 to an L signal so that the third gate-selection signal Gate_3 becomes an L signal.

In the period t3, when the potential of the first data holding portion D_HOLD1 is the H signal or the H' signal, the first data inverted signal INV_OUT1 is an L signal. At this time, output data Q1 which is output from the output data inverter circuit 123_1 is an H signal. In addition, when the potential of the second data holding portion D_HOLD2 is switched from the L signal to the H signal, the second data inverted signal INV_OUT2 is switched from the H signal to an L signal. Further, output data Q2 which is output from the output data inverter circuit 123_2 is switched from the L signal to an H signal.

In the period t3, the first capacitor control signal Ca is set to an L signal, and then both the L signals are input to the first NOR circuit 122_1. Consequently, the first NOR output signal NOR_OUT1 is switched from the L signal to an H signal. Therefore, as described above, the potential of the first data holding portion D_HOLD1, which is in an electrically floating state, is raised to the H' signal by the capacitive coupling through the first capacitor 112_1. In the period t3, the second capacitor control signal Cb is set to an H signal, and then the L signal and the H signal are input to the second NOR circuit 122_2 or the H signal and the H signal are input to the second NOR circuit 122_2. Consequently, the potential of the second NOR output signal NOR_OUT2 is an L signal.

The operation in the period t4 in FIG. 5 will be described. The period t4 is a period in which the data of the H signal is held in the second data holding portion D_HOLD2.

Figure 7B:
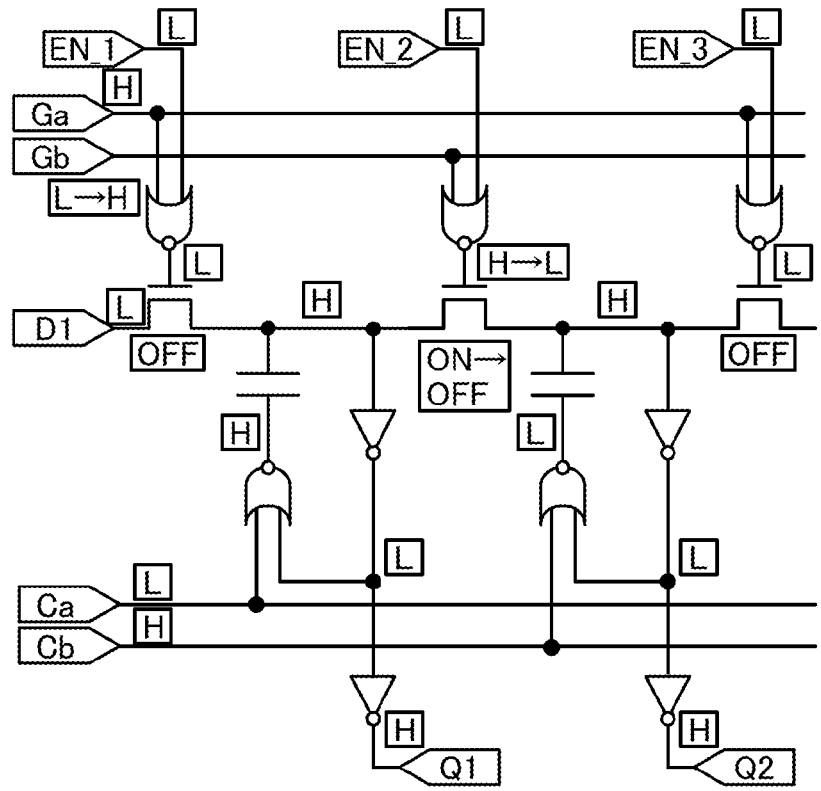

FIG. 7B illustrates conductive states of the transistors in the first-stage storage circuit 100_1 and the second-stage storage circuit 100_2 in the period t4.

In the period t4, the first transistor 111_1 is brought out of conduction by setting the first gate control signal Ga to an H signal and the first enable signal EN_1 to an L signal so that the first gate-selection signal Gate_1 becomes an L signal. At this time, the potential of the first data holding portion D_HOLD1 remains the H signal. The second transistor 111_2 is brought out of conduction from the conductive state by switching the second gate control signal Gb to an H signal from the L signal and setting the second enable signal EN_2 to an L signal so that the second gate-selection signal Gate_2 is switched to an L signal from the H signal. At this time, the potential of the second data holding portion D_HOLD2 remains the H signal. Further, the third transistor 111_3 is brought out of conduction by setting the first gate control signal Ga to the H signal and the third enable signal EN_3 to an L signal so that the third gate-selection signal Gate_3 becomes an L signal.

In the period t4, when the potential of the first data holding portion D_HOLD1 is the H signal, the first data inverted signal INV_OUT1 is an L signal. At this time, output data Q1 which is output from the output data inverter circuit 123_1 is an H signal. In addition, when the potential of the second data holding portion D_HOLD2 is an H signal, the second data inverted signal INV_OUT2 is an L signal. Further, output data Q1 which is output from the output data inverter circuit 123_2 is an H signal.

In the period t4, the first capacitor control signal Ca is set to an L signal, and then both the L signals are input to the first NOR circuit 122_1. Consequently, the first NOR output signal NOR_OUT1 is an H signal. In the period t4, the second capacitor control signal Cb is set to an H signal, and then the H signal and the L signal are input to the second NOR circuit 122_2. Consequently, the second NOR output signal NOR_OUT2 is an L signal.

The operation in the period t5 in FIG. 5 will be described. The period t5 is a period in which the data of the H signal in the first data holding portion D_HOLD1 is lowered to an L signal by utilization of the capacitive coupling through the first capacitor 112_1.

Figure 8A:
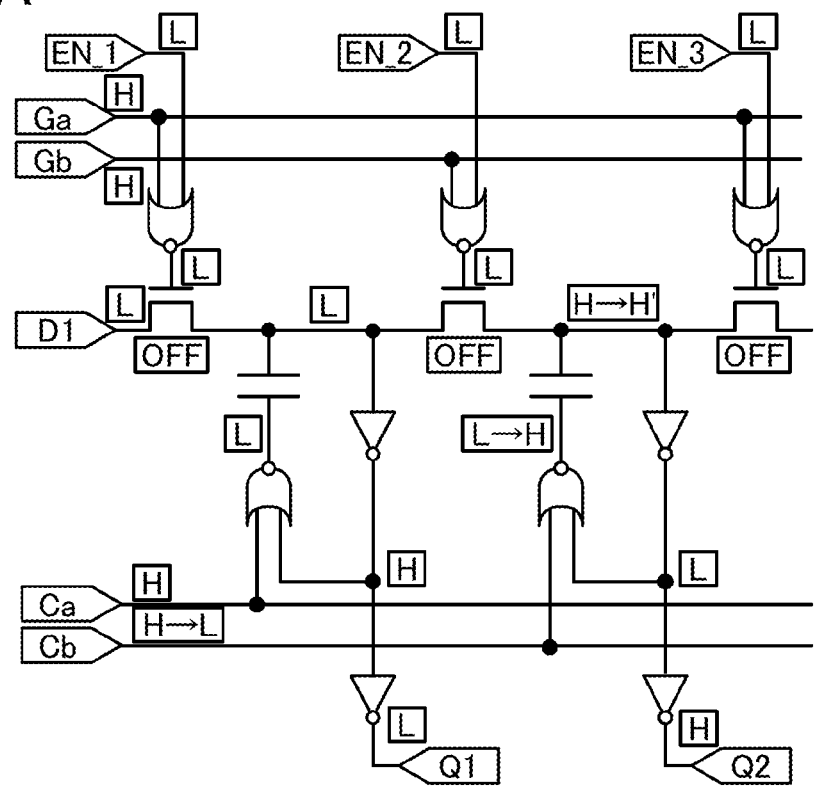
FIGS. 8A and 8B illustrate the operation of a semiconductor storage device.

FIG. 8A illustrates conductive states of the transistors in the first-stage storage device 100_1 and the second-stage storage circuit 100_2 in the period t5.

In the period t5, the first transistor 111_1 and the second transistor 111_2 are brought out of conduction by setting the first gate control signal Ga to an H signal and the first enable signal EN_1 to an L signal so that the first gate-selection signal Gate_1 becomes an L signal, and by setting the second gate control signal Gb to an H signal and the second enable signal EN_2 to an L signal so that the second gate-selection signal Gate_2 becomes an L signal, whereby the first data holding portion D_HOLD1 is made in an electrically floating state. At this time, the potential of the first data holding portion D_HOLD1 is lowered to an L signal by the capacitive coupling through the first capacitor 112_1.

In the period t5, the second transistor 111_2 and the third transistor 111_3 are brought out of conduction by setting the second gate control signal Gb to the H signal and the second enable signal EN_2 to the L signal so that the second gate-selection signal Gate_2 becomes an L signal, and by setting the first gate control signal Ga to the H signal and the third enable signal EN_3 to an L signal so that the third gate-selection signal Gate_3 becomes an L signal, whereby the second data holding portion D_HOLD2 is made in an electrically floating state. At this time, the potential of the second data holding portion D_HOLD2 is raised to an H' signal by the capacitive coupling through the second capacitor 112_2.

In the period t5, when the potential of the first data holding portion D_HOLD1 is the L signal, the first data inverted signal INV_OUT1 is an H signal. At this time, output data Q1 which is output from the output data inverter circuit 123_1 is an L signal. In addition, when the potential of the second data holding portion D_HOLD2 is switched from the H signal to the H' signal, the second data inverted signal INV_OUT2 is an L signal. Further, output data Q2 which is output from the output data inverter circuit 123_2 is an H signal.

In the period t5, the first capacitor control signal Ca is set to an H signal, and then both the H signals are input to the first NOR circuit 122_1. Consequently, the first NOR output signal NOR_OUT1 is switched from the H signal in the period t4 to an L signal. Therefore, as described above, the potential of the first data holding portion D_HOLD1, which is in an electrically floating state, is lowered to the L signal by the capacitive coupling through the first capacitor 112_1. In the period t5, the second capacitor control signal Cb is switched from the H signal to an L signal. Consequently, the potential of the second NOR circuit 122_2 is switched to a state in which both the L signals are input from the state in which the L signal and the H signal are input. Therefore, as described above, the potential of the second data holding portion D_HOLD2, which is in an electrically floating state, is raised to the H' signal by the capacitive coupling through the second capacitor 112_2.

The operation in the period t6 in FIG. 5 will be described. The period t6 is a period in which data of an H signal in the second data holding portion D_HOLD2 is output from an output signal OUT.

Figure 8B:
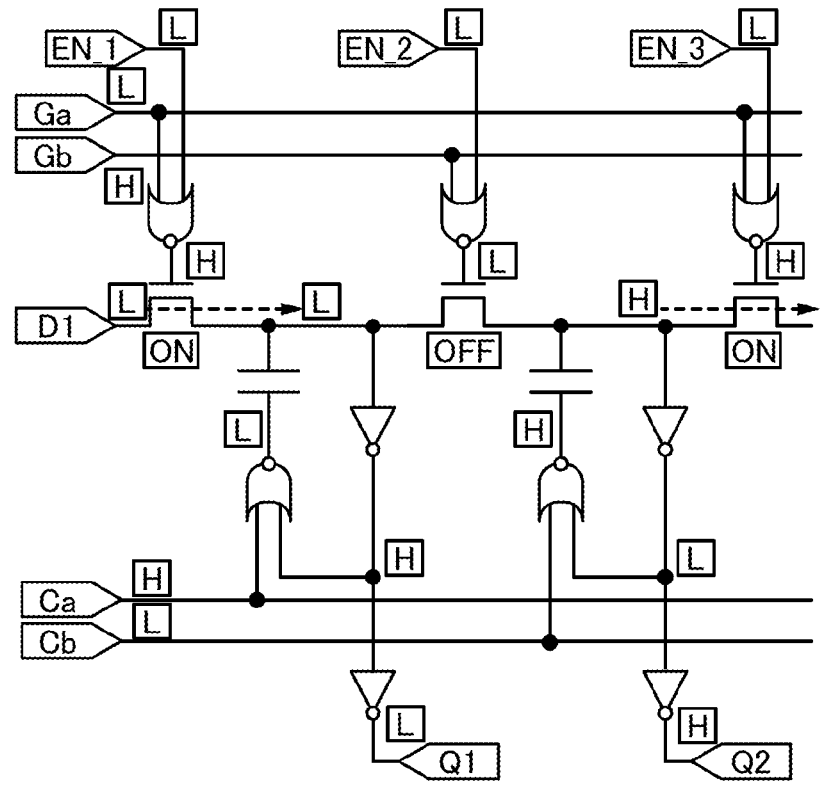

FIG. 8B illustrates conductive states of the transistors and flows of currents which are made visible in dotted-line arrows in the first-stage storage circuit 100_1 and the second-stage storage circuit 100_2 in the period t6.

In the period t6, the first transistor 111_1 is brought into conduction by setting the first gate control signal Ga to an L signal and the first enable signal EN_1 to an L signal so that the first gate-selection signal Gate_1 becomes an H signal. Then, an L signal is taken into the first data holding portion D_HOLD1 from the data signal line. In addition, the second transistor 111_2 is brought out of conduction by setting the second gate control signal Gb to an H signal and the second enable signal EN_2 to an L signal so that the second gate-selection signal Gate_2 becomes an L signal. Further, the third transistor 111_3 is brought into conduction by setting the first gate control signal Ga to the L signal and the third enable signal EN_3 to an L signal so that the third gate-selection signal Gate_3 becomes an H signal. At this time, electric charge in the second data holding portion D_HOLD2 moves to the third transistor 111_3 side, whereby the potential of the second data holding portion D_HOLD2 becomes an H signal from the H' signal.

In the period t6, when the potential of the first data holding portion D_HOLD1 is the L signal, the first data inverted signal INV_OUT1 is an H signal. At this time, output data Q1 which is output from the output data inverter circuit 123_1 is an L signal. In addition, when the potential of the second data holding portion D_HOLD2 is switched from the H' signal to the H signal, the second data inverted signal INV_OUT2 is an L signal. Further, output data Q2 which is output from the output data inverter circuit 123_2 is an H signal.

In the period t6, the first capacitor control signal Ca is set to an H signal, and then both the H signals are input to the first NOR circuit 122_1. Consequently, the first NOR output signal NOR_OUT1 is an L signal. In the period t6, the second capacitor control signal Cb is set to an L signal. Consequently, both the L signals are input to the second NOR circuit 122_2. Thus, the second NOR output signal NOR_OUT2 is an H signal.

The above is the description of the operation of the first-stage storage circuit 100_1 and the second-stage storage circuit 100_2 which is performed at the time of holding and outputting data signals.

According to one embodiment of the present invention, at the time of manufacturing a nonvolatile semiconductor storage device, a volatile storage device and a nonvolatile storage device can be provided without separation. In the semiconductor storage device, a data signal is held in a data holding portion connected to a transistor including a semiconductor layer containing an oxide semiconductor and a capacitor. Consequently, the potential of the data signal held in the data holding portion can be controlled by a data potential holding circuit and a data potential control circuit, and the data signal can be held and output. The data potential holding circuit can output a data signal without leaking electric charge, and the data potential control circuit can control the potential of the data signal held in the data holding portion without leaking electric charge by capacitive coupling through the capacitor.

Figure 9:
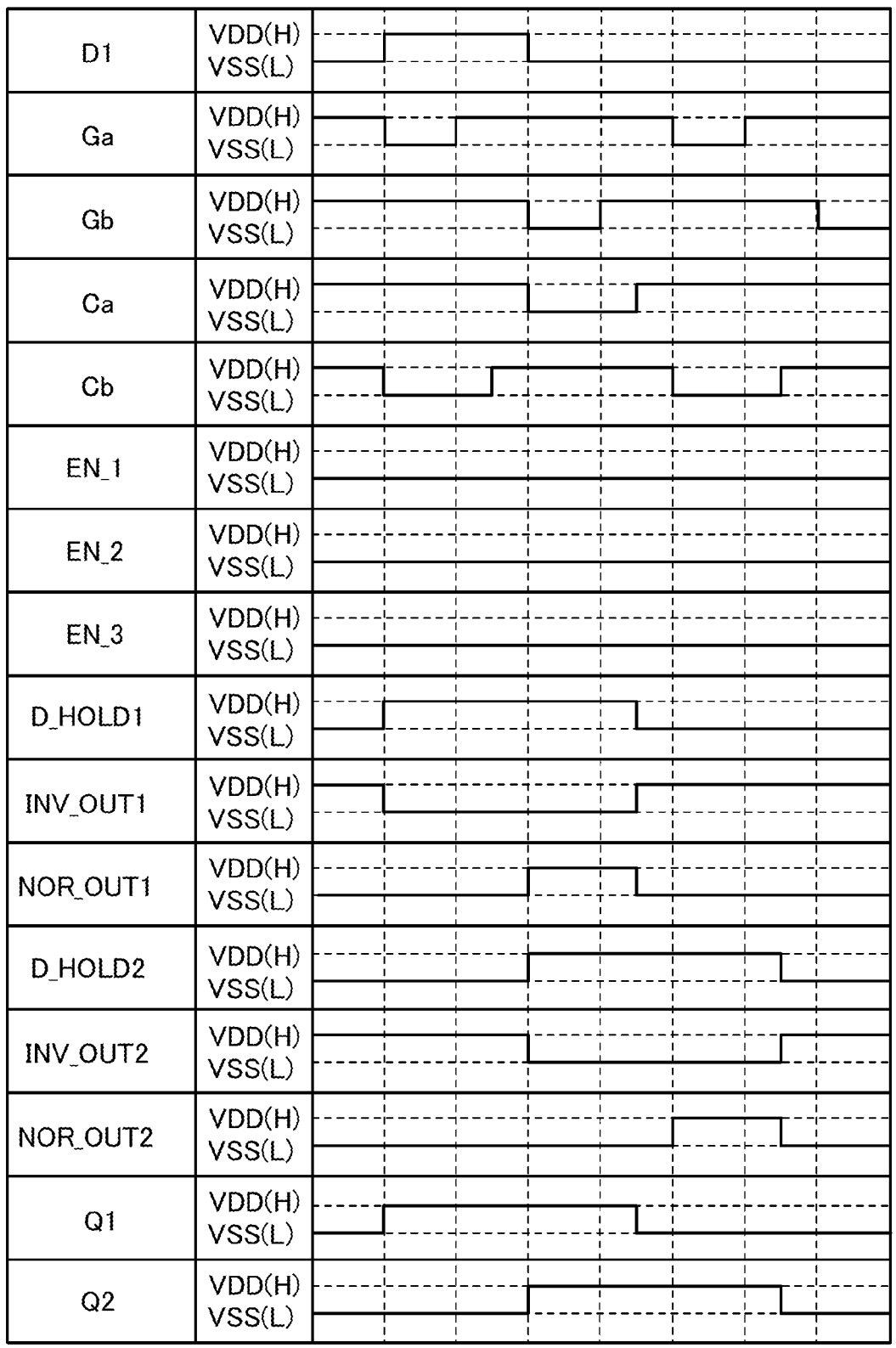
FIG. 9 is a timing chart showing the operation of a semiconductor storage device.

Note that the first-stage storage circuit 100_1 and the second-stage storage circuit 100_2 in FIG. 4 can operate in a manner different from that in FIG. 5. For example, it is possible to operate the first-stage storage circuit 100_1 and the second-stage storage circuit 100_2 in FIG. 4 as in a timing chart in FIG. 9. As illustrated in FIG. 9, data signals can be held and output even when toggle operations of the first gate control signal Ga, the second gate control signal Gb, the first capacitor control signal Ca, and the second capacitor control signal Cb are performed in a manner different from that in FIG. 5.

Figure 10:
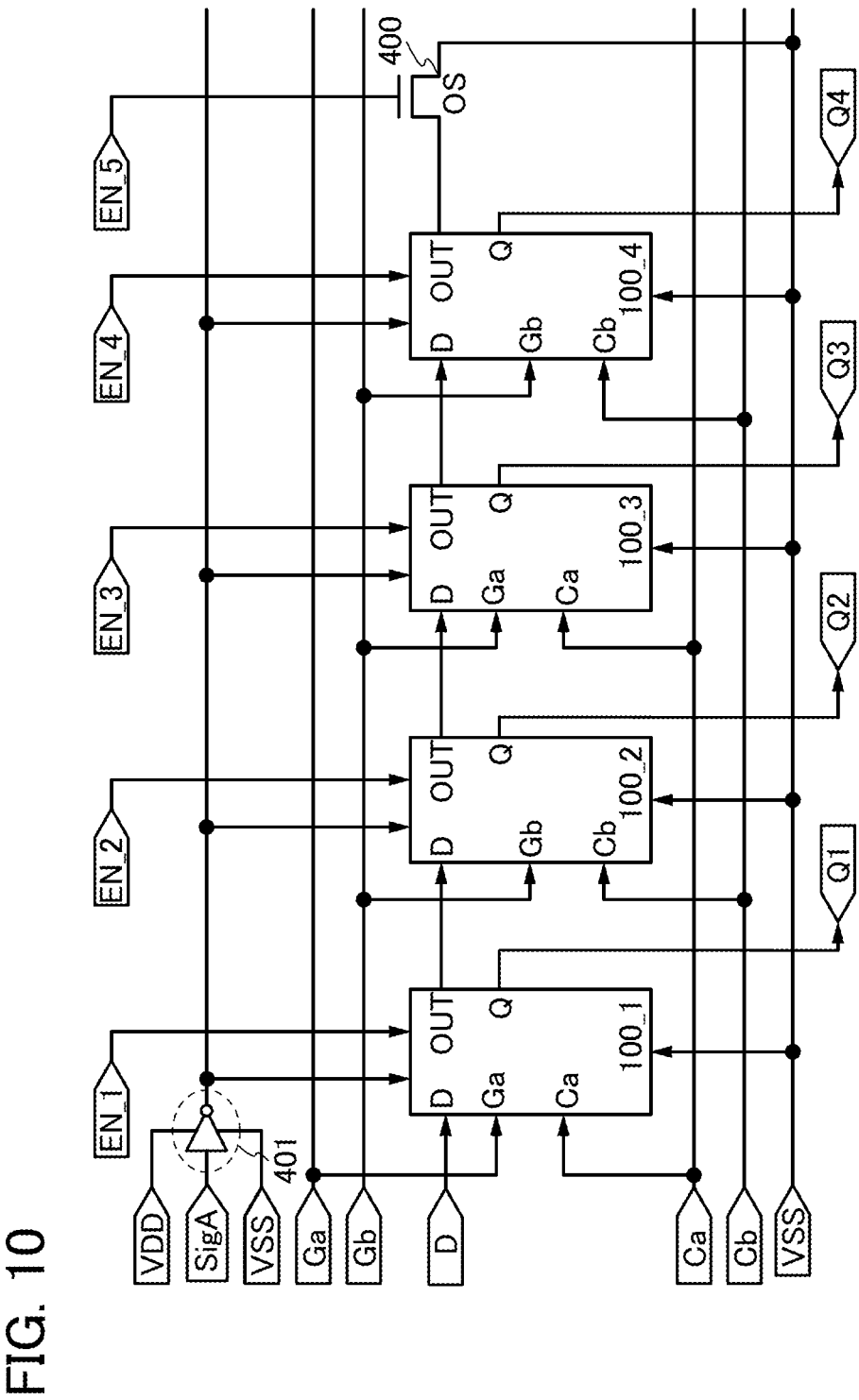
FIG. 10 is a circuit diagram of a semiconductor storage device.

Next, operation performed at the time of stopping and resuming the supply of power supply voltage when the semiconductor storage device of this embodiment is operated will be described with reference to FIG. 10, FIG. 11, FIG. 12, and FIG. 13. Specifically, in the following description, the semiconductor storage device including the N stages of the storage circuits in FIG. 1A includes four stages of the first-stage storage circuit 100_1 to the fourth-stage storage circuit 100_4 cascade-connected, as illustrated in FIG. 10. Note that although, in FIG. 10, an output terminal of the fourth-stage storage circuit 100_4 is provided with a transistor 400 whose channel is formed in an oxide semiconductor layer to hold a data signal, another stage, that is, a fifth-stage storage circuit may be provided. In the configuration of FIG. 10, an inverter circuit 401 connected to a high power supply potential VDD and a low power supply potential VSS is provided for a wiring for supplying the high power supply potential VDD, and the high power supply potential VDD or the low power supply potential VSS, which is switched by a selection signal SigA, is applied to each of the first-stage storage circuit 100_1 to the fourth-stage storage circuit 100_4 through the inverter circuit 401.

Next, the operation of the semiconductor storage device including the four stages of the cascade-connected first-stage storage circuit 100_1 to fourth-stage storage circuit 100_4, which is illustrated in FIG. 10, in the case where 4-bit data is held, will be described with reference to the timing chart of FIG. 12. The operation of the semiconductor storage device including the four stages of the cascade-connected first-stage storage circuit 100_1 to fourth-stage storage circuit 100_4, which is illustrated in FIG. 10, in the case where the supply of power supply voltage is stopped and resumed, will be described with reference to the timing chart of FIG. 13.

Figure 11:
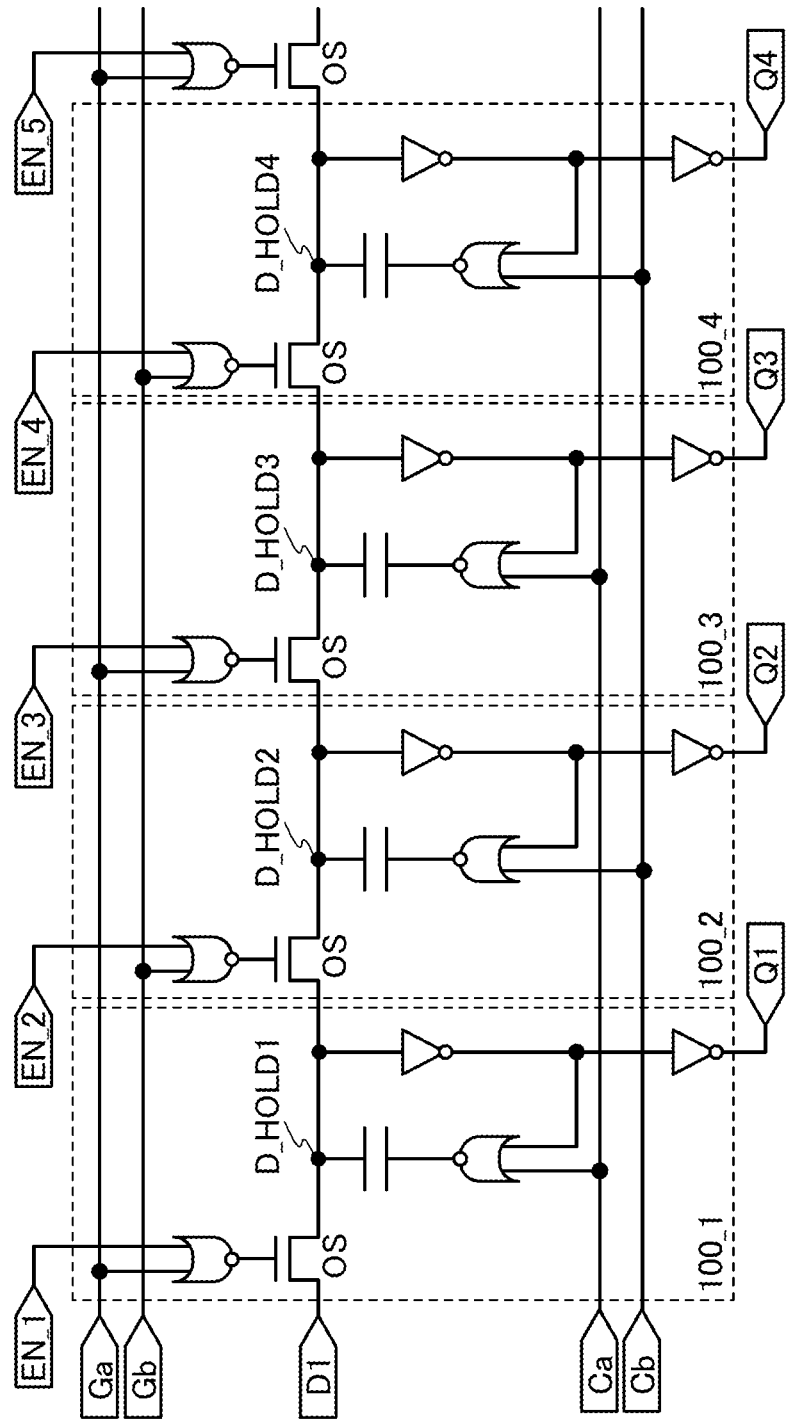
FIG. 11 is a circuit diagram of a semiconductor storage device.
Figure 12:
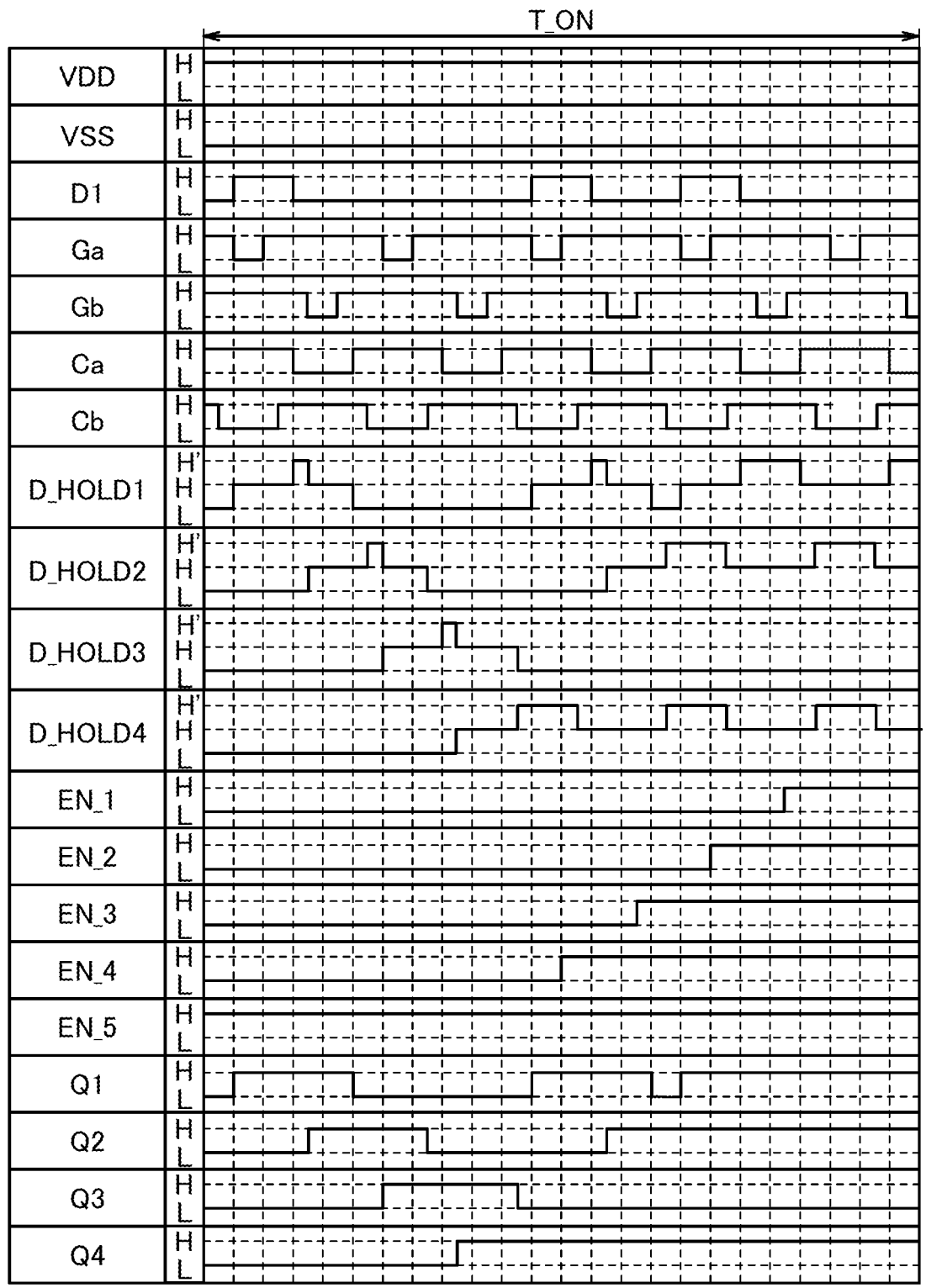
FIG. 12 is a timing chart showing the operation of a semiconductor storage device.
Figure 13:
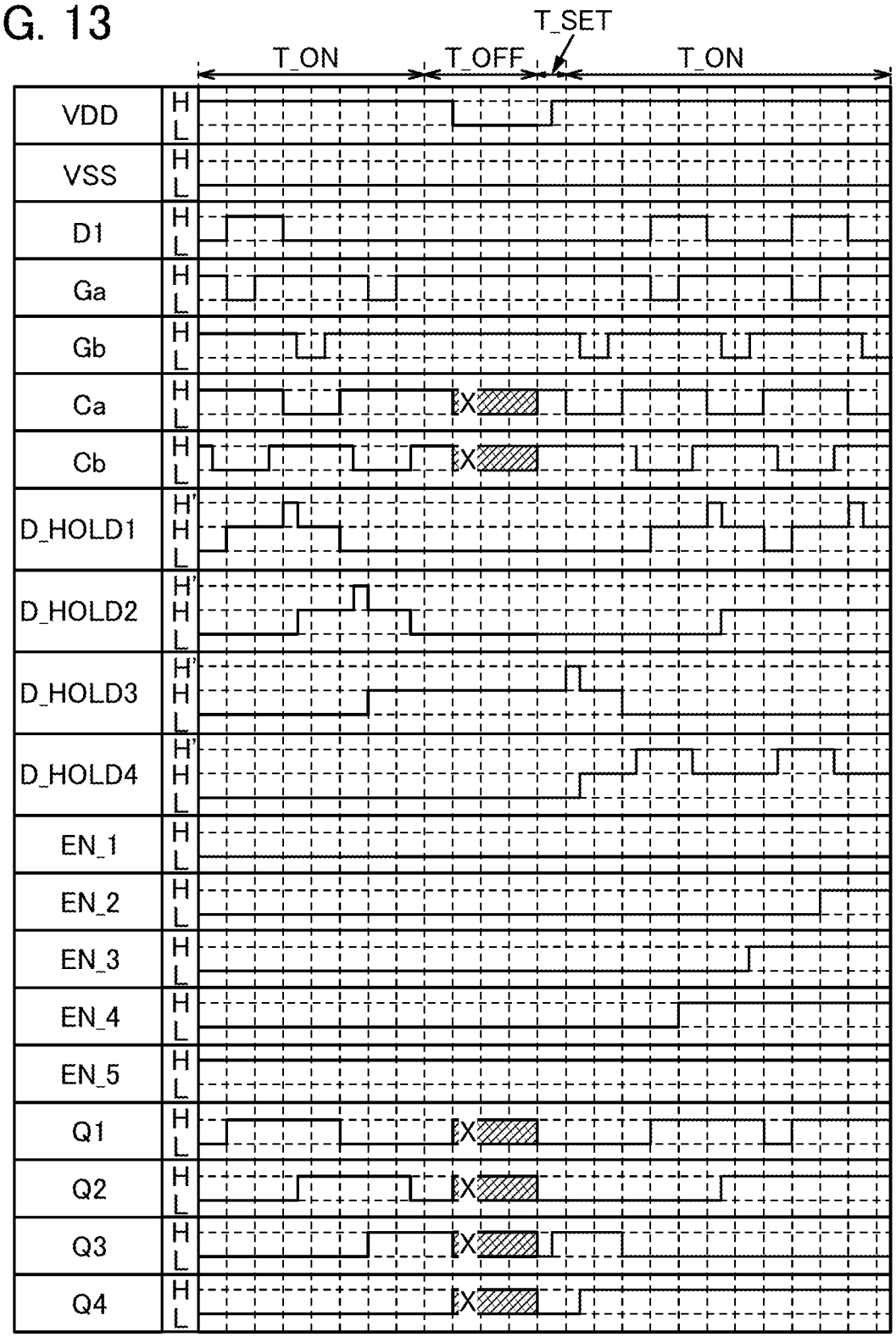
FIG. 13 is a timing chart showing the operation of a semiconductor storage device.

In a timing chart of FIG. 12 and FIG. 13 in each of which operation performed at the time of stopping and resuming the supply of power supply voltage is illustrated, a potential of a first data holding portion D_HOLD1 in the first-stage storage device 100_1 is denoted by D_HOLD1 as illustrated in FIG. 11. A potential of a second data holding portion D_HOLD2 in the second-stage storage device 100_2 is denoted by D_HOLD2 as illustrated in FIG. 11. A potential of the third data holding portion D_HOLD3 in the third-stage storage device 100_3 is denoted by D_HOLD3 as illustrated in FIG. 11. A potential of a fourth data holding portion D_HOLD4 in the fourth-stage storage device 100_4 is denoted by D_HOLD4 as illustrated in FIG. 11. Note that FIG. 11 illustrates a configuration in which a gate of the transistor 400 illustrated in FIG. 10 is provided with a NOR circuit and the transistor 400 is controlled by the NOR circuit.

Note that in the timing charts in FIG. 12 and FIG. 13, data signals of "1, 1, 0, and 1" are used as data to be stored in 4-bit registers. In the description of this embodiment, an H signal corresponding to data "1" to be the first-bit data is held in the first data holding portion D_HOLD1 of the first-stage storage circuit 100_1. An H signal corresponding to data "1" to be the second-bit data is held in the second data holding portion D_HOLD2 in the second-stage storage circuit 100_2. An L signal corresponding to data "0" to be the third-bit data is held in the third data holding portion D_HOLD3 in the third-stage storage circuit 100_3. An H signal corresponding to data "1" to be the fourth-bit data is held in the fourth data holding portion D_HOLD4 in the fourth-stage storage circuit 100_4.

The data "1, 1, 0, and 1" which are input by repeating the operation described with reference to FIG. 5, FIGS. 6A and 6B, FIGS. 7A and 7B, and FIGS. 8A and 8B are held in the 4-bit registers including the four stages of the storage circuits in the timing chart of FIG. 12. To prevent new data signal from being input to the data holding portion where the data is held, a conductive state of the transistor connected to the storage circuit after data signal is input is controlled by switching the enable signal which is input to the transistor to an H signal.

For example, a fifth enable signal EN_5 is set to an H signal so that the transistor 400 is brought out of conduction and the potential of the data signal is held in the fourth data holding portion D_HOLD4. The transistor 400 can be in a non-conductive state in a period during which the fifth enable signal EN_5 is the H signal.

A fourth enable signal EN_4 is set to an H signal after the H signal corresponding to data "1" to be the fourth-bit data is held in the fourth data holding portion D_HOLD4. At this time, the fourth transistor 111_4 is in a non-conductive state. Consequently, the data signal can be held in the fourth data holding portion D_HOLD4 regardless of whether power supply voltage is supplied or not.

The third enable signal EN_3 is set to an H signal after the L signal corresponding to data "0" to be the third-bit data is held in the third data holding portion D_HOLD3. At this time, the third transistor 111_3 is in a non-conductive state. Consequently, the data signal can be held in the third data holding portion D_HOLD3 regardless of whether power supply voltage is supplied or not.

The second enable signal EN_2 is set to an H signal after the H signal corresponding to data "1" to be the second-bit data is held in the second data holding portion D_HOLD2. At this time, the second transistor 111_2 is in a non-conductive state. Consequently, the data signal can be held in the second data holding portion D_HOLD2 regardless of whether power supply voltage is supplied or not.

The first enable signal EN_1 is set to an H signal after the H signal corresponding to data "1" to be the first-bit data is held in the first data holding portion D_HOLD1. At this time, the first transistor 111_1 is in a non-conductive state. Consequently, the data signal can be held in the first data holding portion D_HOLD1 regardless of whether power supply voltage is supplied or not.

Note that, here, an example is shown in which the data signals are input in a manner such that the H signal of the fourth-bit data, the L signal of the third-bit data, the H signal of the second-bit data, and the H signal of the first-bit data are input in this order from the data signal line in synchronization with the timing at which the first gate control signal Ga becomes an L signal.

The above is the description of the operation for holding data in the 4-bit registers including the four stages of the storage circuits. Note that a period needed to hold the data signals, during which the supply of power supply voltage is not stopped and resumed, is referred to as normal operation period T_ON as shown in FIG. 12.

Next, operation performed at the time of stopping the supply of power supply voltage and operation when the supply of power supply voltage is stopped will be described with reference to the timing chart of FIG. 13. The description of FIG. 13 is made separately in the following periods: a normal operation period T_ON in which power supply voltage is supplied, a period T_OFF in which the supply of power supply voltage is stopped, and a period T_set after the supply of power supply voltage is resumed to be another normal operation period T_ON.

The operation during the period T_ON in FIG. 13 is similar to the operation described with reference to FIG. 12; thus, description thereof is omitted here.

Next, the operation during the period T_OFF in FIG. 13 will be described.

In the period T_OFF, first, each of the first gate control signal Ga and the second gate control signal Gb is fixed to an H signal. Thus, in the four stages of the storage circuits, the output signals of the gate-selection signal generator circuits each become an L signal, and the first transistor 111_1 to the fourth transistor 111_4 are brought out of conduction at the same time. Accordingly, the potentials of the first data holding portion D_HOLD1 to the fourth data holding portion D_HOLD4 are held. In addition, the first capacitor control signal Ca and the second capacitor control signal Cb are each fixed to an H signal, and in addition the first gate control signal Ga and the second gate control signal Gb are each fixed to an H signal. Thus, the output signals of the first data potential control circuit 114_1 to the fourth data potential control circuit 114_4 in the four stages of the storage circuits are each fixed to the L signal at the same time; accordingly, the potentials of the first data holding portion D_HOLD1 to the fourth data holding portion D_HOLD4 are fixed. Next, the potential of the wiring for supplying a high power supply potential VDD is set to a low power supply potential VSS in order to stop the supply of power supply voltage. Then, the output of the first capacitor control signal Ca and the second capacitor control signal Cb are each in a restricted combination (a forbidden state). Further, the output data Q1 to Q4 are each in a restricted combination (a forbidden state).

Through the above operation, the supply of power supply voltage can be stopped without causing malfunction in the period T_OFF. Note that it is preferable to fix each of the first gate control signal Ga and the second gate control signal Gb to an H signal during a period in which the supply of power supply voltage is stopped.

Note that in the description of FIG. 13, a period of "X" with hatching is a period in a restricted combination, in which a signal is not supplied on the basis of the power supply voltage of an H signal or an L signal.

Next, the operation during the period T_SET in FIG. 13 will be described.

In the period T_SET, first, each of the first capacitor control signal Ca and the second capacitor control signal Cb is fixed to an H signal. Thus, the potentials of the first data holding portion D_HOLD1 to the fourth data holding portion D_HOLD4 are held in an H signal or L signals. Next, the potential of the wiring for supplying a high power supply potential is set to a high power supply potential VDD in order to resume the supply of high power supply potential VDD. Then, toggle operations of the first gate control signal Ga, the second gate control signal Gb, the first capacitor control signal Ca, and the second capacitor control signal Cb are started and then the operation returns to the period T_ON in which operation similar to that described in FIG. 12 is performed.

The above is the description of the operation of the semiconductor storage device including the plurality of stages of the storage circuits which is performed at the time of stopping and resuming the supply of power supply voltage. Since a data signal can be held even after the supply of power supply voltage is stopped according to one embodiment of the present invention, operation for holding the data signal performed before the supply of power supply voltage is stopped can be continued when the supply of power supply voltage is resumed.

As described above, according to one embodiment of the present invention, at the time of manufacturing a nonvolatile semiconductor storage device, a volatile storage device and a nonvolatile storage device can be provided without separation. In the storage circuits in the plurality of stages which form the semiconductor storage device, a data signal is held in a data holding portion connected to a transistor including a semiconductor layer containing an oxide semiconductor and a capacitor. Consequently, the potential of data signal held in the data holding portion can be controlled by a data potential holding circuit and a data potential control circuit, which enable output of pulse signals. The data potential holding circuit can output a data signal without leaking electric charge, and the data potential control circuit can control the potential of the data signal held in the data holding portion without leaking electric charge by capacitive coupling through the capacitor. Moreover, since a data signal can be held even after the supply of power supply voltage is stopped according to one embodiment of the present invention, the operation for holding data signals before the supply of power supply voltage is stopped can be continued when the supply of power supply voltage is resumed.

This embodiment can be combined with any of the other embodiments as appropriate.

Embodiment 2

In this embodiment, a modified example of the storage circuits in the semiconductor storage device described above in Embodiment 1 will be described.

Figure 14A:
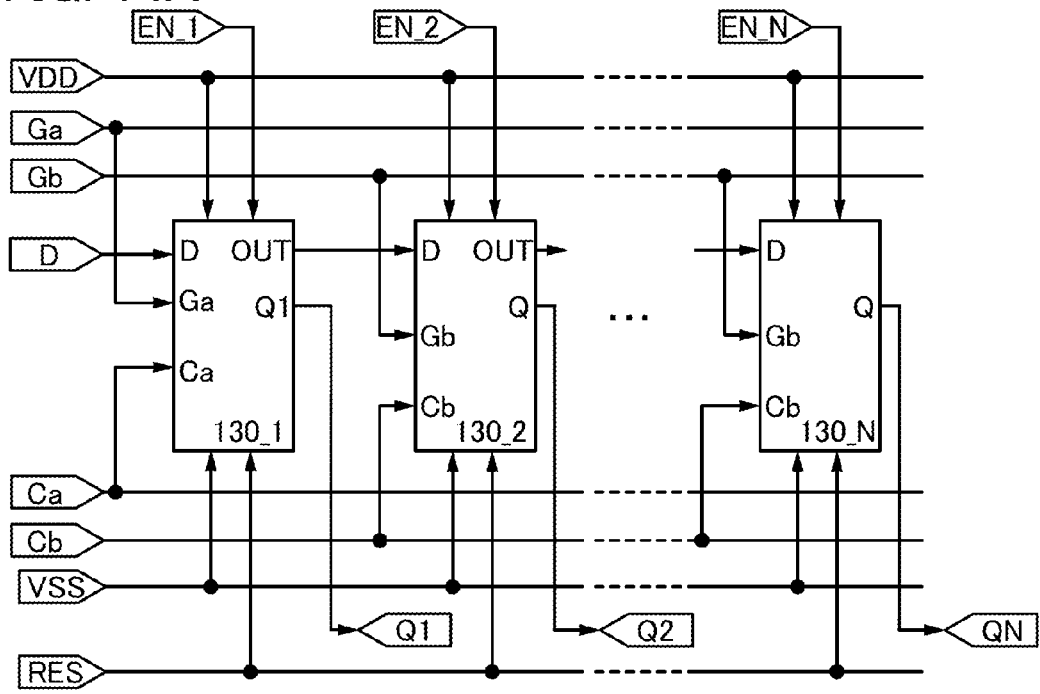
FIGS. 14A and 14B are circuit diagrams of a semiconductor storage device.

A modified example of the storage circuit, in which a reset circuit for initializing the potentials of the first data holding portion D_HOLD1 to an N-th data holding portion D_HOLDN is provided, can be given. A specific circuit configuration thereof is illustrated in FIG. 14A. FIG. 14A illustrates a first-stage storage circuit 130_1 to an N-th stage storage circuit 130_N in which a reset signal RES is supplied from a wiring for supplying a reset signal RES to each of the first-stage storage circuit 100_1 to the N-th stage storage circuit 100_N in FIG. 1A.

Figure 14B:
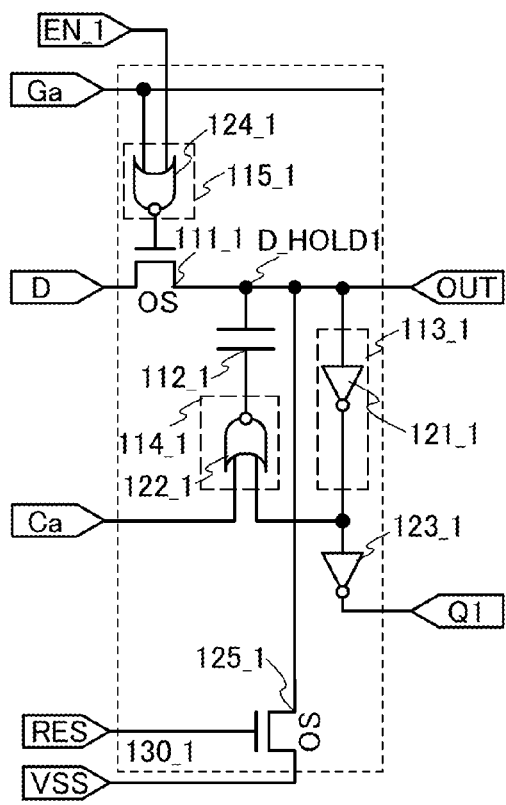

An example of a specific circuit configuration of the first-stage storage circuit 130_1 is illustrated in FIG. 14B. The circuit diagram in FIG. 14B includes a reset transistor 125_1 in addition to the circuit configuration in FIG. 3A.

A first terminal of the reset transistor 125_1 is connected to the first data holding portion D_HOLD1. A second terminal of the reset transistor 125_1 is connected to a wiring for supplying a low power supply potential VSS. A gate of the reset transistor 125_1 is connected to the wiring for supplying a reset signal RES. Note that the reset transistor 125_1 can be provided in each stage of the storage circuit as the first reset transistor 125_1 to an N-th reset transistor 125_N.

Note that in a manner similar to that of the first transistor 111_1 included in the storage circuit 130_1, a transistor whose channel is formed in an oxide semiconductor layer is used as each of the first reset transistor 125 to the N-th reset transistor 125_N in order to reduce as much as possible the off-state current in the case where the transistors are in a non-conductive state. In drawings, "OS" is written in order to indicate that the reset transistor 125_1 is a transistor whose channel is formed in an oxide semiconductor layer.

Note that the reset signal RES operates in a non-conductive state except during initialization operation in which the potentials of the first data holding portion D_HOLD1 to the N-th data holding portion D_HOLDN are each set to an L signal. A transistor whose channel is formed in an oxide semiconductor layer is used for each of the first reset transistor 125_1 to the N-th reset transistor 125_N, whereby leakage of electric charge from the first data holding portion D_HOLD1 to the N-th data holding portion D_HOLDN can be made to occur hardly.

Figure 15:
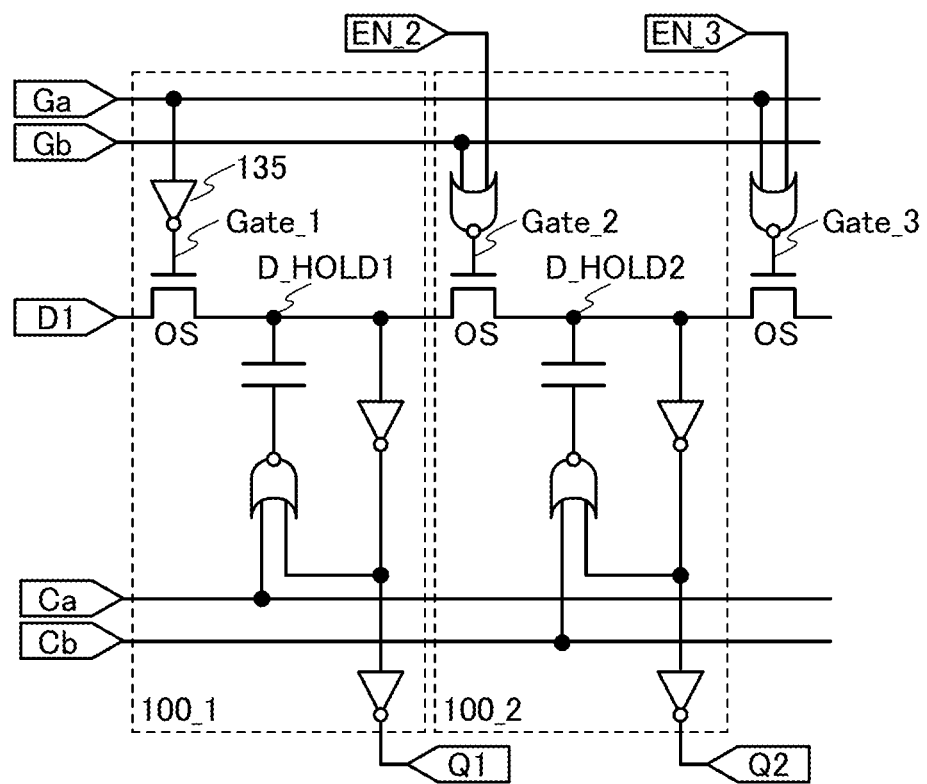
FIG. 15 is a circuit diagram of a semiconductor storage device.

As another modified example of the storage circuits, FIG. 15 illustrates a configuration in which an inverter circuit is provided as the first gate-selection signal generator circuit of the first-stage storage circuit. An operation which is the same as that in Embodiment 1 can be performed even if an inverter circuit 135 to which the first gate control signal Ga is input is used. The number of transistors used in the first gate-selection signal generator circuit in the case of employing the inverter circuit 135 can be made smaller than that in the case of employing the NOR circuit.

Another modified example of the storage device, in which a logic circuit is provided for each gate of the first transistor, the second transistor, and the third transistor, can be given. In this circuit configuration, which will be described below, the operation is performed in a manner similar to that in the circuit configuration in FIG. 4.

Figure 16A:
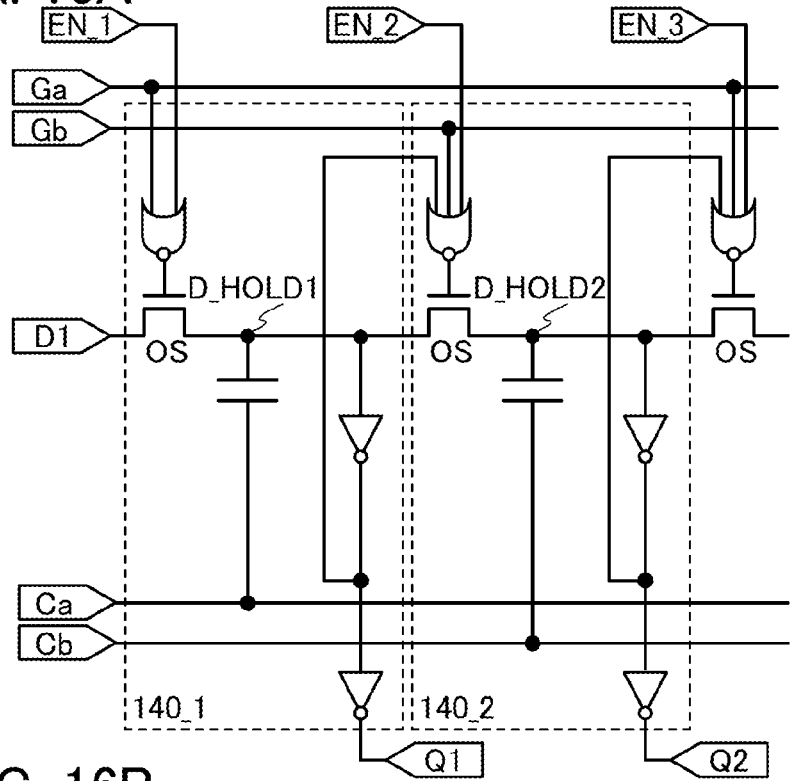
FIGS. 16A and 16B are circuit diagrams of a semiconductor storage device.

A specific circuit configuration of a first-stage storage circuit 140_1 to an N-th storage circuit 140_N is illustrated in FIG. 16A. In FIG. 16A, in addition to the first gate control signal Ga or the second gate control signal Gb, and the enable signal corresponding to each stage, an output signal of the data potential holding and outputting circuit included in each stage of the storage circuit is input into the NOR circuit which is the gate-selection signal generator circuit connected to each gate of the second transistor 111_2 to the N-th transistor 111_N. In FIG. 16A, the first capacitor control signal Ca is connected to the second electrode of the first capacitor 112_1 in the odd-numbered storage circuit, and the second capacitor control signal Cb is connected to the second electrode of the second capacitor 112_2 in the even-numbered storage circuit.

Figure 16B:
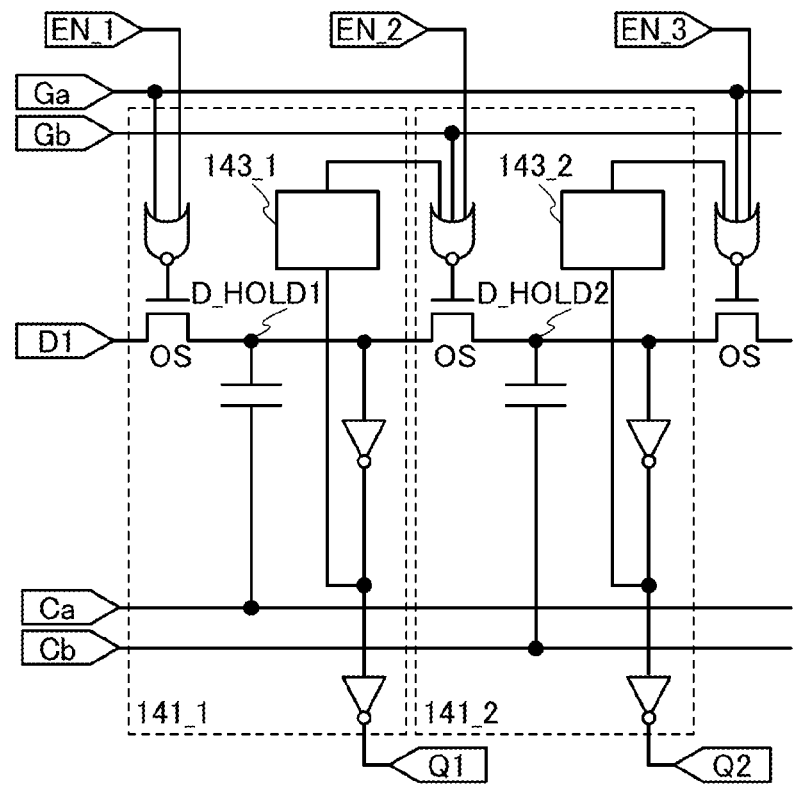

In FIG. 16A, the toggle operations of the data D, the first gate control signal Ga, the second gate control signal Gb, the first capacitor control signal Ca, and the second capacitor control signal Cb are performed in the same manner as those in FIG. 5, whereby the output data Q which are similar to those in the operation described in FIG. 5 can be obtained. As illustrated in FIG. 16B, in the storage circuits in the respective stages, level shifter circuits 143_1 to 143_N may be provided between the data potential holding and outputting circuit and the gate-selection signal generator circuit of the storage circuits.

This embodiment can be combined with any of the other embodiments as appropriate.

Embodiment 3

In this embodiment, a structure of a signal processing unit including the semiconductor storage device described in Embodiment 1 will be described.

Figure 17:
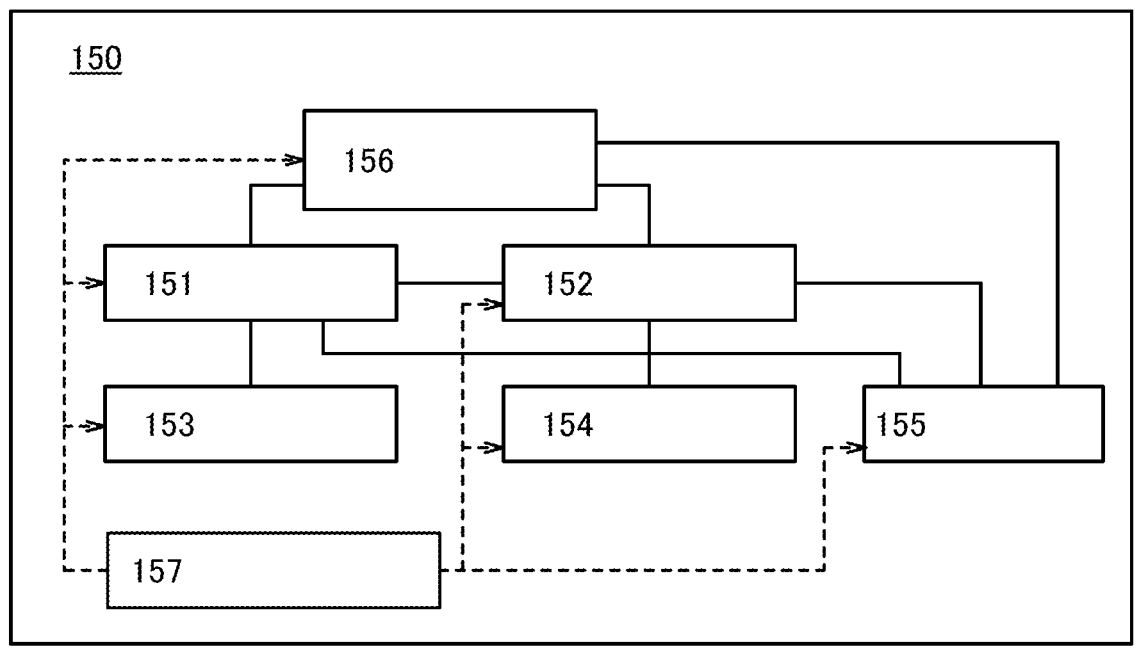
FIG. 17 is a block diagram of a signal processing unit.

FIG. 17 illustrates an example of a signal processing unit according to one embodiment of the present invention. The signal processing unit includes at least one or a plurality of arithmetic units and one or a plurality of semiconductor storage devices. Specifically, a signal processing unit 150 illustrated in FIG. 17 includes an arithmetic unit 151, an arithmetic unit 152, a semiconductor storage device 153, a semiconductor storage device 154, a semiconductor storage device 155, a control unit 156, and a power supply control circuit 157.

The arithmetic units 151 and 152 each include, as well as a logic circuit which carries out simple logic arithmetic processing, an adder, a multiplier, various arithmetic units, and the like. The semiconductor storage device 153 functions as a register which temporarily holds a data signal when the arithmetic processing is carried out in the arithmetic unit 151. The semiconductor storage device 154 functions as a register which temporarily holds a data signal when the arithmetic processing is carried out in the arithmetic unit 152.

In addition, the semiconductor storage device 155 can be used as a main memory and can store a program executed by the control unit 156 as a data signal or can store a data signal from the arithmetic unit 151 and the arithmetic unit 152.

The control unit 156 is a circuit which collectively controls operations of the arithmetic unit 151, the arithmetic unit 152, the semiconductor storage device 153, the semiconductor storage device 154, and the semiconductor storage device 155 included in the signal processing unit 150. Note that in FIG. 17, a structure in which the control unit 156 is provided in the signal processing unit 150 as a part thereof is illustrated, but the control unit 156 may be provided outside the signal processing unit 150.

By using the semiconductor storage device described in Embodiment 1 for the semiconductor storage device 153, the semiconductor storage device 154, and the semiconductor storage device 155, a data signal can be held without increasing the number of signals to be controlled even when the supply of power supply voltage to the semiconductor storage device 153, the semiconductor storage device 154, and the semiconductor storage device 155 is stopped. In the above manner, the supply of power supply voltage to the entire signal processing unit 150 can be stopped, whereby power consumption can be suppressed. Alternatively, the supply of power supply voltage to one or more of the semiconductor storage device 153, the semiconductor storage device 154, and the semiconductor storage device 155 can be stopped, whereby power consumption of the signal processing unit 150 can be suppressed. After the supply of the power supply voltage is resumed, the semiconductor storage device can return to the state same as that before the supply of the power supply voltage is stopped in a short time.

In addition, as well as the supply of the power supply voltage to the semiconductor storage device, the supply of power supply voltage to the control circuit or the arithmetic unit which transmits/receives a data signal to/from the semiconductor storage device may be stopped. For example, when the arithmetic unit 151 and the semiconductor storage device 153 are not operated, the supply of power supply voltage to the arithmetic unit 151 and the semiconductor storage device 153 may be stopped.

In addition, the power supply control circuit 157 controls the level of the power supply voltage which is supplied to the arithmetic unit 151, the arithmetic unit 152, the semiconductor storage device 153, the semiconductor storage device 154, the semiconductor storage device 155, and the control unit 156 included in the signal processing unit 150. Further, in the case where the supply of the power supply voltage is stopped, it may be stopped in the power supply control circuit 157, or in each of the arithmetic unit 151, the arithmetic unit 152, the semiconductor storage device 153, the semiconductor storage device 154, the semiconductor storage device 155, and the control unit 156.

A semiconductor storage device functioning as a cache memory may be provided between the semiconductor storage device 155 that is a main memory and each of the arithmetic unit 151, the arithmetic unit 152, and the control unit 156. By providing the cache memory, low-speed access to the main memory can be reduced and the speed of the signal processing such as arithmetic processing can be made higher. By applying the above-described semiconductor storage device also to the semiconductor storage device functioning as a cache memory, power consumption of the signal processing unit 150 can be suppressed without increasing the number of signals to be controlled.

This embodiment can be combined with any of the other embodiments as appropriate.

Embodiment 4

In this embodiment, a configuration of a CPU, which is one of signal processing units according to one embodiment of the present invention, will be described.

Figure 18:
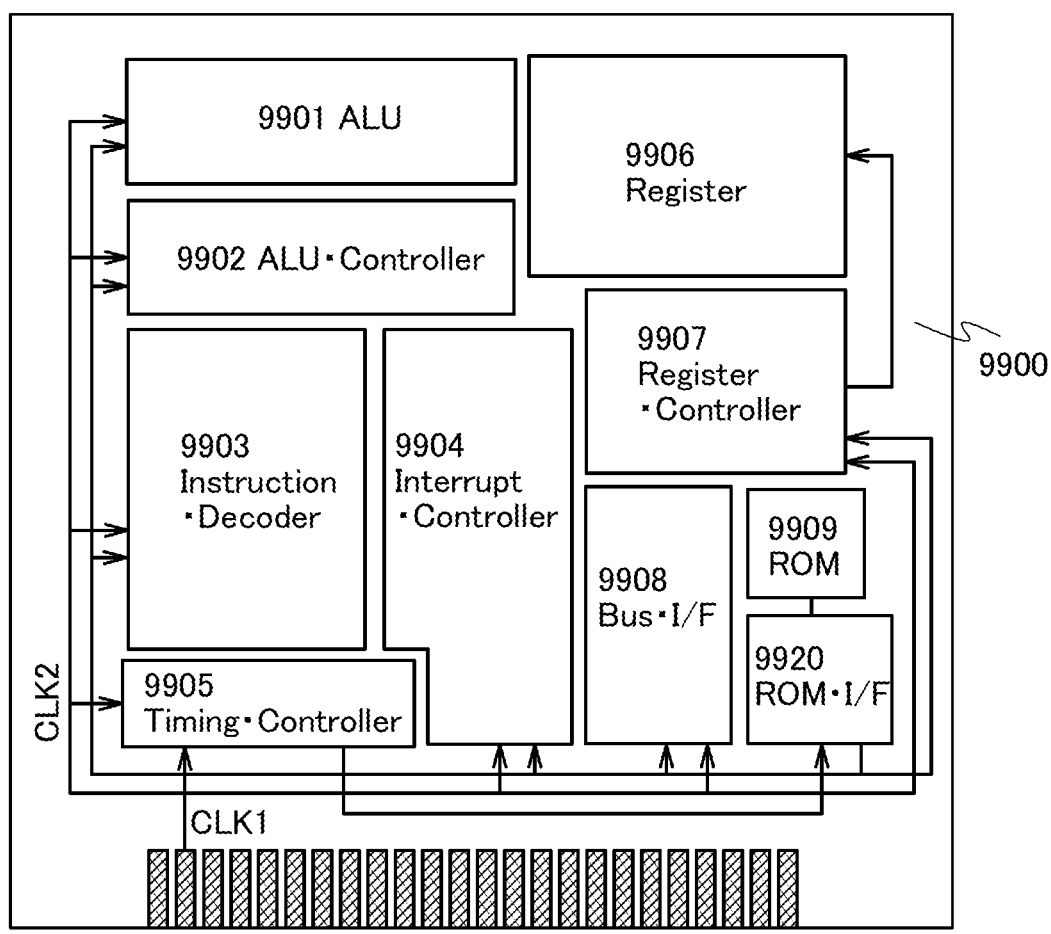
FIG. 18 is a block diagram of a CPU including a semiconductor storage device.

FIG. 18 illustrates a configuration of the CPU in this embodiment. The CPU illustrated in FIG. 18 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 18 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the operation of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, a semiconductor storage device having the structure described in any of the above embodiments is provided in the register 9906. In response to an instruction from the ALU 9901, the register controller 9907 can stop the supply of power supply voltage in the semiconductor storage device of the register 9906 without the necessity of saving and returning a data signal.

In such a manner, even in the case where the operation of the CPU is temporarily stopped and the supply of the power supply voltage is stopped, a data signal can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing unit according to one embodiment of the present invention is not limited to the CPU and can be applied to an LSI such as a microprocessor, an image processing circuit, a digital signal processor (DSP), or a field programmable gate array (FPGA).

This embodiment can be combined with any of the other embodiments as appropriate.

Embodiment 5

This embodiment describes a method for manufacturing the semiconductor storage device 10, specifically, the transistor which is included in the first inverter circuit 121_1 and whose channel is formed in silicon (hereinafter a transistor 191), the first transistor 111_1 whose channel is formed in an oxide semiconductor layer, and the first capacitor 112_1 in the semiconductor storage device in FIG. 3A.

Figure 19A:
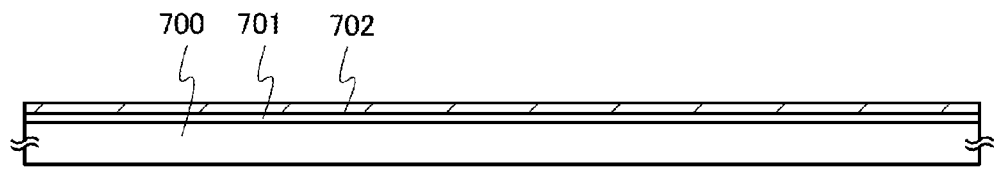
FIGS. 19A to 19D illustrate steps of manufacturing a semiconductor storage device.

As illustrated in FIG. 19A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is used.

In this embodiment, an example in which the semiconductor film 702 is formed using single crystal silicon is given as a manufacturing method of the transistor 191. Note that a specific example of a forming method of the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately greater than or equal to 1 N/cm$^2$ and less than or equal to 500 N/cm$^2$, preferably greater than or equal to 11 N/cm$^2$ and less than or equal to 20 N/cm$^2$ is applied to part of the bond substrate and part of the substrate 700 so that the substrates are attached to each other. When the pressure is applied, bonding between the bond substrate and the insulating film 701 starts from the portion, which results in bonding of the entire surface where the bond substrate and the insulating film 701 are in close contact with each other. Subsequently, heat treatment is performed, whereby microvoids that exist in the fragile layer are combined, so that the microvoids increase in volume. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which has not been patterned or may be added to the semiconductor film 702 which is formed through the patterning. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which has not been patterned or the semiconductor film 702 which is formed through the patterning in order to finely control the threshold voltage.

Note that although the single crystal semiconductor film is used in this embodiment, the present invention is not limited to this structure. For example, a polycrystalline, microcrystalline, or amorphous semiconductor film which is formed over the insulating film 701 by a vapor deposition method may be used. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, a crystallization method combined with a thermal crystallization method using an electrically heated furnace, a lamp annealing crystallization method using infrared light, a crystallization method using a catalytic element, or a high-temperature annealing method at approximately 950° C. may be used.

Figure 19B:
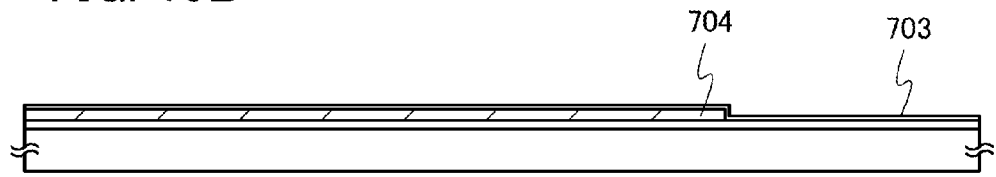

Next, as illustrated in FIG. 19B, a semiconductor film 704 is formed using the semiconductor film 702. Then, a gate insulating film 703 is formed over the semiconductor film 704.

The gate insulating film 703 can be formed to have a single-layer structure or a layered structure using a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by, for example, a plasma-enhanced CVD method or a sputtering method.

Note that in this specification, an oxynitride is a substance which includes more oxygen than nitrogen, and a nitride oxide is a substance which includes more nitrogen than oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma-enhanced CVD method.

Figure 19C:
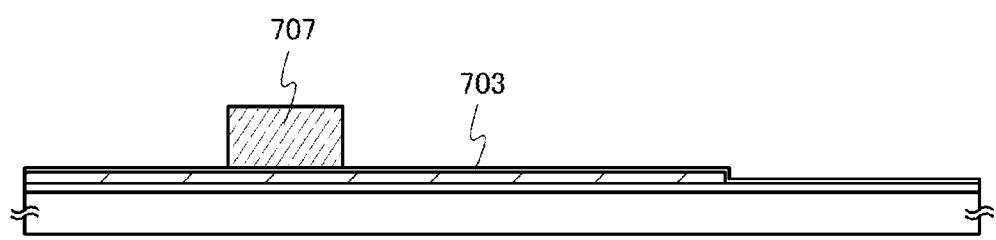

Next, a gate electrode 707 is formed as illustrated in FIG. 19C.

The gate electrode 707 can be formed in a manner such that a conductive film is formed and then is processed (patterned) into a predetermined shape. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy including the above metal as a main component or a compound including the above metal may be used as the conductive film. Alternatively, a semiconductor film formed using a semiconductor such as polycrystalline silicon doped with an impurity element such as phosphorus imparting conductivity may be used as the conductive film.

Note that although the gate electrode 707 is formed using a single-layer conductive film in this embodiment, this embodiment is not limited to this structure. The gate electrode 707 may be formed of a plurality of stacked conductive films.

As a combination of two conductive films, tantalum nitride or tantalum can be used for a first conductive film and tungsten can be used for a second conductive film. As well as the example, any of the following combination can be used as the combination of the two conductive films: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three or more conductive films are stacked, a layered structure of a molybdenum film, an aluminum film, and a molybdenum film is preferably used.

A light-transmitting oxide conductive film of indium oxide, indium oxide-tin oxide, indium oxide-zinc oxide, zinc oxide, zinc aluminum oxide, zinc aluminum oxynitride, gallium zinc oxide, or the like can be used for the gate electrode 707.

Alternatively, the gate electrode 707 may be selectively formed by a droplet discharge method without the use of a mask. A droplet discharge method is a method for forming a predetermined pattern by discharge or ejection of a droplet containing a predetermined composition from an orifice, and includes an ink-jet method in its category.

In addition, the gate electrode 707 can be formed in a manner such that a conductive film is formed and then is etched by an inductively coupled plasma (ICP) etching method under appropriately controlled conditions (e.g., the amount of electric power applied to a coiled electrode layer, the amount of electric power applied to an electrode layer on the substrate side, and the electrode temperature on the substrate side) to be tapered in a desired shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 19D:
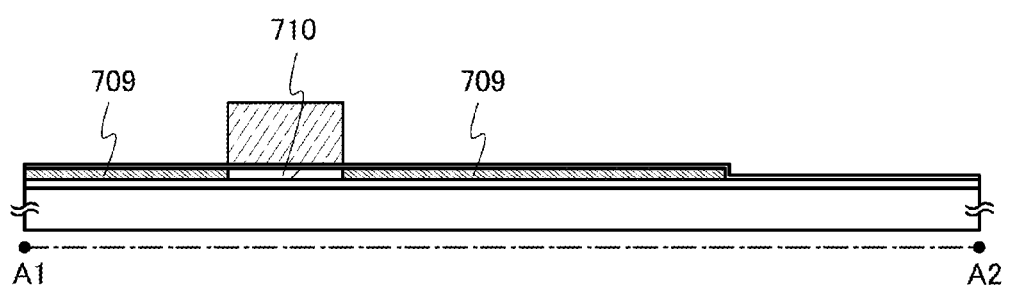

Next, as illustrated in FIG. 19D, when an impurity element imparting one conductivity is added to the semiconductor film 704 with the gate electrode 707 used as a mask, a channel formation region 710 overlapping with the gate electrode 707 and a pair of impurity regions 709 between which the channel formation region 710 is provided are formed in the semiconductor film 704.

In this embodiment, the case where an impurity element imparting p-type conductivity (e.g., boron) is added to the semiconductor film 704 is given as an example.

Figure 20A:
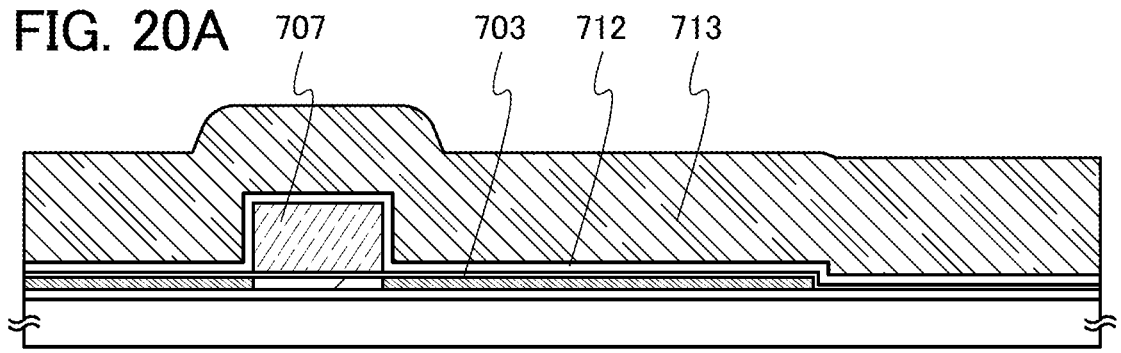
FIGS. 20A to 20C illustrate steps of manufacturing a semiconductor storage device.

Next, as illustrated in FIG. 20A, an insulating film 712 and an insulating film 713 are formed to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating film 712 and the insulating film 713. In particular, the insulating film 712 and the insulating film 713 are preferably formed using a low dielectric constant (low-k) material because capacitance due to overlapping of electrodes or wirings can be sufficiently reduced. Note that a porous insulating film including such a material may be used as the insulating film 712 and the insulating film 713. Since the porous insulating film has lower dielectric constant than a dense insulating film, parasitic capacitance due to electrodes or wirings can be further reduced.

In this embodiment, the case where silicon oxynitride is used for the insulating film 712 and silicon nitride oxide is used for the insulating film 713 is given as an example. In addition, in this embodiment, the insulating film 712 and the insulating film 713 are formed over the gate electrode 707; however, as one embodiment of the present invention, only one insulating film may be formed over the gate electrode 707, or three or more insulating films may be stacked.

Figure 20B:
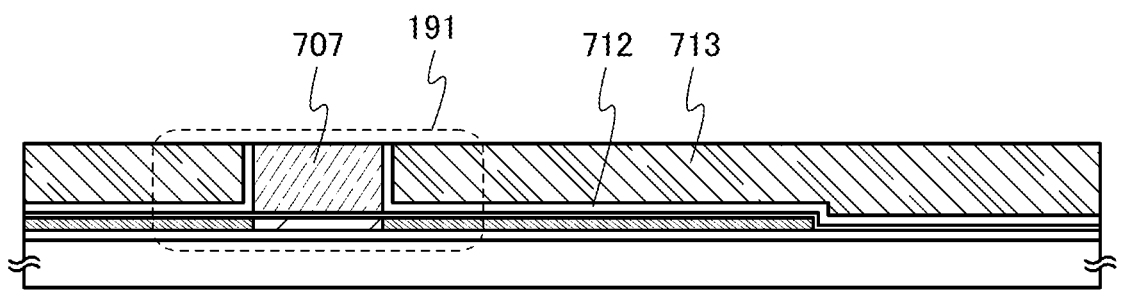

Next, as illustrated in FIG. 20B, the insulating film 713 is subjected to chemical mechanical polishing (CMP) treatment or etching, so that the exposed upper surface of the insulating film 713 is planarized. Note that in order to improve the characteristics of the first transistor 111_1 which is formed later, the surface of the insulating film 713 is preferably planarized as much as possible.

Through the above process, the transistor 191 can be formed.

Figure 20C:
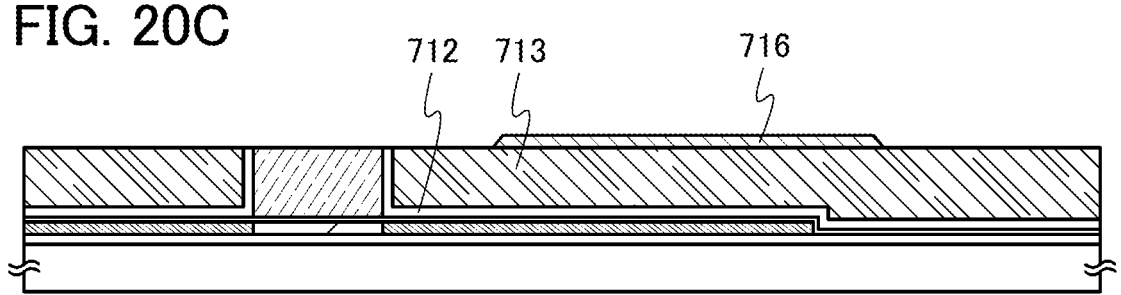

Next, a method for manufacturing the first transistor 111_1 will be described. First, as illustrated in FIG. 20C, an oxide semiconductor layer 716 is formed over the insulating film 713.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by a sputtering method using an oxide semiconductor as a target. Alternatively, the oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is deposited by a sputtering method, dust attached onto the surface of the insulating film 713 is preferably removed by reverse sputtering in which an argon gas is introduced and plasma is generated. The reverse sputtering is a method in which, without application of voltage to a target side, an RF power source is used for application of voltage to a substrate side in an argon atmosphere, and plasma is generated in the vicinity of the substrate so that a substrate surface is modified. Note that a nitrogen atmosphere, a helium atmosphere, or the like may be used instead of the argon atmosphere. Alternatively, an argon atmosphere to which oxygen, nitrous oxide, or the like is added may be used. Alternatively, an argon atmosphere to which oxygen, nitrous oxide, or the like is added may be used.

For example, for the oxide semiconductor film, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, a Sn—Al—Zn-based oxide semiconductor, or an Hf—In—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based material; or a one-component metal oxide such as an In-based oxide semiconductor, a Sn-based oxide semiconductor, or a Zn-based oxide semiconductor can be used.

In particular, in the case where an In—Sn—Zn-based oxide semiconductor is used as the oxide semiconductor film, the mobility of the transistor can be increased. Further, the use of an In—Sn—Zn-based oxide semiconductor for the transistor allows the threshold voltage of the transistor to be stably controlled. In the case where the In—Sn—Zn-based oxide semiconductor is used, a ratio of atoms of the metal elements of the target may be In:Sn:Zn=1:2:2, In:Sn:Zn=2:1:3, or In:Sn:Zn=1:1:1 in an atomic ratio, for example.

In this embodiment, a 30-nm-thick In—Ga—Zn-based oxide semiconductor thin film which is obtained by a sputtering method using a target including indium (In), gallium (Ga), and zinc (Zn) is used as the oxide semiconductor film. A target with a composition ratio of metals, In:Ga:Zn=1:1:0.5, In:Ga:Zn=1:1:1, or In:Ga:Zn=1:1:2 can be used as the target, for example. The filling rate of the target including In, Ga, and Zn is higher than or equal to 90% and lower than or equal to 100%, preferably higher than or equal to 95% and lower than 100%. With the use of the target with a high filling rate, a dense oxide semiconductor film is deposited.

In this embodiment, the oxide semiconductor film is deposited in a manner such that the substrate is held in the treatment chamber kept in a reduced pressure state, moisture remaining in the treatment chamber is removed, the sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an evacuation unit. For example, a hydrogen atom, a compound containing a hydrogen atom, such as water ($H_2O$) (preferably a compound containing a carbon atom), and the like are evacuated from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the power of the direct current (DC) power source is 0.5 kW, and the atmosphere is an oxygen atmosphere (the proportion of the oxygen flow rate is 100%). Note that it is preferable that pulsed direct-current (DC) power source be used because dust generated during deposition can be reduced and the film thickness can be uniform.

Further, when the leakage rate of the treatment chamber of the sputtering apparatus is set lower than or equal to $1\times10^{-10}$ Pa·m$^3$/second, entry of impurities such as alkali metal or hydride into the oxide semiconductor film that is being formed by a sputtering method can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and evacuated by preheating of the substrate 700 over which the insulating film 712 and the insulating film 713 are formed in a preheating chamber of the sputtering apparatus, as pretreatment for deposition. The temperature of the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that the preheating treatment can be omitted. This preheating may be similarly performed on the substrate 700 over which a conductive film 719 and a conductive film 720 are formed before the deposition of a gate insulating film 721 in a later step.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, organic acid such as citric acid or oxalic acid, or the like can be used. In this embodiment, ITO-07N (produced by KANTO CHEMICAL CO., INC.) is used.

A resist mask for forming the oxide semiconductor layer 716 may be formed by an ink-jet method. When the resist mask is formed by an ink-jet method, a photomask is not used; thus, manufacturing cost can be reduced.

Note that it is preferable that reverse sputtering be performed before a conductive film is formed in a subsequent step so that resist residues and the like that attach onto surfaces of the oxide semiconductor layer 716, the insulating film 712, and the insulating film 713 are removed.

Note that the oxide semiconductor film deposited by sputtering or the like contains a large amount of moisture or hydrogen (including a hydroxyl group) as an impurity in some cases. Moisture or hydrogen easily forms a donor level and thus serves as an impurity in the oxide semiconductor. Thus, in one embodiment of the present invention, in order to reduce impurities such as moisture or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately longer than or equal to 3 minutes and shorter than or equal to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus with which heat treatment is performed using a high-temperature gas. As the gas, an inert gas which does not react with an object by heat treatment, such as nitrogen or a rare gas (e.g., argon), is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably higher than or equal to 6N (99.9999%), more preferably higher than or equal to 7N (99.99999%) (that is, the impurity concentration is lower than or equal to 1 ppm, preferably lower than or equal to 0.1 ppm).

Note that it has been pointed out that an oxide semiconductor is insensitive to impurities, there is no problem when a considerable amount of metal impurities is contained in the film, and soda-lime glass which contains a large amount of alkali metal such as sodium and which is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, deterioration of characteristics of a transistor, such as a normally-on state of the transistor due to negative shift of the threshold voltage, or a decrease in mobility, occurs. Variation in characteristics also occurs. Such deterioration of characteristics and variation in characteristics of the transistor due to the impurity remarkably appear when the concentration of hydrogen in the oxide semiconductor layer is extremely low. Thus, when the concentration of hydrogen in the oxide semiconductor layer is lower than or equal to $1 \times 10^{18}$ atoms/$cm^3$, preferably lower than or equal to $1 \times 10^{17}$ atoms/cm$^3$, the concentration of the impurity is preferably lowered. Specifically, the measurement value of a Na concentration by secondary ion mass spectrometry is preferably lower than or equal to $5 \times 10^{16}$ atoms/cm$^3$, more preferably lower than or equal to $1 \times 10^{16}$ atoms/cm$^3$, further preferably lower than or equal to $1 \times 10^{15}$ atoms/cm$^3$. Similarly, the measurement value of a Li concentration is preferably lower than or equal to $5 \times 10^{15}$ atoms/cm$^3$, more preferably lower than or equal to $1 \times 10^{15}$ atoms/cm$^3$. Similarly, the measurement value of a K concentration is preferably lower than or equal to $5 \times 10^{15}$ atoms/cm$^3$, more preferably lower than or equal to $1 \times 10^{15}$ atoms/cm$^3$.

Through the above steps, the concentration of hydrogen in the oxide semiconductor layer 716 can be lowered and the oxide semiconductor layer 716 can be purified. Accordingly, the oxide semiconductor layer can be stable. In addition, the heat treatment at a temperature lower than or equal to the glass transition temperature makes it possible to form an oxide semiconductor layer with extremely low carrier density and a wide band gap. Thus, the transistor can be formed using a large substrate, so that mass productivity can be increased. In addition, by using the oxide semiconductor layer in which the hydrogen concentration is reduced and the purity is improved, it is possible to form a transistor with high withstand voltage and an extremely low off-state current. The heat treatment can be performed at any time after the oxide semiconductor layer is deposited.

Note that the oxide semiconductor layer may be either amorphous or crystalline. As an oxide semiconductor layer having crystallinity, a crystalline oxide semiconductor layer with c-axis orientation (also referred to as c-axis aligned crystalline oxide semiconductor (CAAC-OS)) is also preferable because the advantageous effect of improving the reliability of a transistor can be obtained.

Specifically, the CAAC-OS is a non-single-crystal semiconductor that has a triangular, hexagonal, equilateral triangular, or regular hexagonal atomic arrangement when seen from a direction perpendicular to an a-b plane. Moreover, the CAAC-OS has a phase in which metal atoms are arranged in a layered manner in the c-axis direction or a phase in which metal atoms and oxygen atoms are arranged in a layered manner in the c-axis direction.

In the CAAC-OS, metal atoms and oxygen atoms are bonded in an orderly manner in comparison with an amorphous oxide semiconductor. In other words, the number of oxygen atoms coordinated to a metal atom might vary between metal atoms in the case where an oxide semiconductor is amorphous, whereas the number of oxygen atoms coordinated to metal atoms is substantially the same in the CAAC-OS. Therefore, microscopic defects of oxygen can be reduced, and instability and moving of charge due to attachment and detachment of hydrogen atoms (including hydrogen ions) or alkali metal atoms can be reduced.

Accordingly, a transistor is formed using an oxide semiconductor film including the CAAC-OS, whereby the amount of shift of the threshold voltage of the transistor, which occurs after light irradiation and a bias-temperature (BT) stress test are performed on the transistor, can be reduced. Accordingly, a transistor having stable electric characteristics can be formed.

The oxide semiconductor film including the CAAC-OS can also be formed by a sputtering method. In order to obtain the CAAC-OS by a sputtering method, it is important that hexagonal crystals be formed in the initial stage of deposition of an oxide semiconductor film and other crystals grow on the hexagonal crystals serving as seed crystals. In order to achieve this, it is preferable that the distance between the target and the substrate be made longer (e.g., 150 mm to 200 mm) and the substrate heating temperature be 100° C. to 500° C., more preferably 200° C. to 400° C., further preferably 250° C. to 300° C.

The proportion of oxygen gas in an atmosphere is preferably set high when the oxide semiconductor film including the CAAC-OS is deposited by a sputtering method. For sputtering in a mixed gas atmosphere of argon and oxygen, for example, the proportion of oxygen gas is preferably set 30% or higher, more preferably 40% or higher. This is because supply of oxygen from the atmosphere promotes crystallization of the CAAC-OS.

When the oxide semiconductor film including the CAAC-OS is deposited by a sputtering method, a substrate over which the oxide semiconductor film including the CAAC-OS is deposited is heated preferably to a temperature higher than or equal to 150° C., more preferably higher than or equal to 170° C. This is because a rise in substrate temperature promotes crystallization of the CAAC-OS.

After being subjected to heat treatment in a nitrogen atmosphere or in vacuum, the oxide semiconductor film including the CAAC-OS is preferably subjected to heat treatment in an oxygen atmosphere or a mixed atmosphere of oxygen and another gas. This is because oxygen vacancies due to the former heat treatment can be compensated by supply of oxygen from the atmosphere in the latter heat treatment.

A film surface on which the oxide semiconductor film including the CAAC-OS is deposited (deposition surface) is preferably flat. This is because irregularity of the deposition surface provides grain boundaries in the oxide semiconductor film including of the CAAC-OS because the c-axis approximately perpendicular to the deposition surface exists in the oxide semiconductor film including the CAAC-OS. For that reason, the deposition surface is preferably subjected to planarization treatment such as chemical mechanical polishing (CMP) before the oxide semiconductor film including the CAAC-OS is deposited. The average roughness of the deposition surface is preferably 0.5 nm or less, further preferably 0.3 nm or less.

Figure 21A:
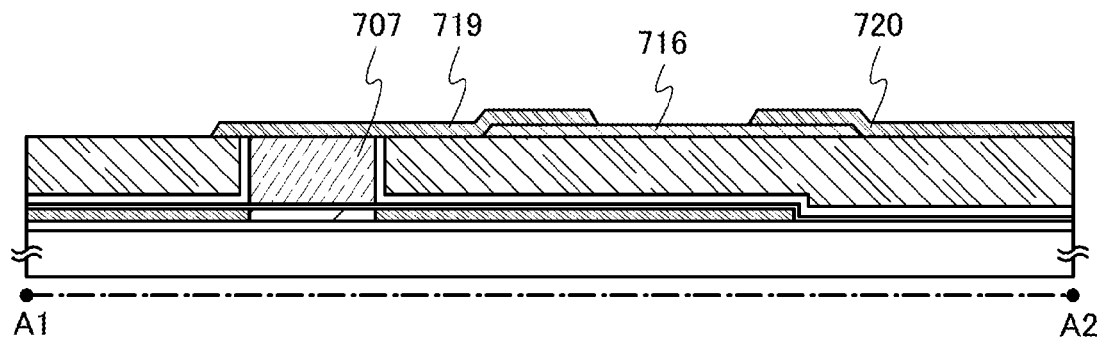
FIGS. 21A to 21C illustrate steps of manufacturing a semiconductor storage device.

Next, as illustrated in FIG. 21A, the conductive film 719 which is in contact with the gate electrode 707 and the oxide semiconductor layer 716, and the conductive film 720 which is in contact with the oxide semiconductor layer 716 are formed. The conductive film 719 and the conductive film 720 function as source and drain electrodes.

Specifically, the conductive film 719 and the conductive film 720 can be formed in a manner such that a conductive film is formed to cover the gate electrode 707 and the insulating film 713 by a sputtering method or a vacuum vapor deposition method and then is processed (patterned) into a predetermined shape.

As the conductive film which serves as the conductive film 719 and the conductive film 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive film 719 and the conductive film 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, for the conductive film 719 and the conductive film 720, a layered structure is employed in which a conductive film including a Cu—Mg—Al alloy, a Mo—Ti alloy, Ti, or Mo is used for a lower layer and a conductive film including Cu is used for an upper layer. Consequently, the adhesion between an insulating film which is an oxide film and the conductive film 719 and the conductive film 720 can be increased.

For the conductive film which serves as the conductive film 719 and the conductive film 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor layer 716 is not removed as much as possible during etching of the conductive film. Depending on the etching conditions, an exposed portion of the oxide semiconductor layer 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

Note that in order to reduce the number of photomasks used in a photolithography step and to reduce the number of processes, an etching step may be performed using a resist mask formed using a multi-tone mask through which light is transmitted to have a plurality of intensities. A resist mask formed using a multi-tone mask has a plurality of thicknesses, and can be changed in shape by etching; thus, the resist mask can be used in a plurality of etching steps for processing films into different patterns. Accordingly, a resist mask corresponding to at least two or more kinds of different patterns can be formed by one multi-tone mask. Thus, the number of exposure masks and the number of corresponding photolithography steps can be reduced, so that the process can be simplified.

Further, an oxide conductive film functioning as source and drain regions may be provided between the oxide semiconductor layer 716, and the conductive film 719 and the conductive film 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive film 719 and the conductive film 720 may be performed concurrently.

With provision of the oxide conductive film functioning as source and drain regions, resistance between the oxide semiconductor layer 716, and the conductive film 719 and the conductive film 720 can be lowered, so that the transistor can operate at high speed. In addition, with provision of the oxide conductive film functioning as source and drain regions, the withstand voltage of the transistor can be increased.

Next, plasma treatment may be performed using a gas such as $N_2O$, $N_2$, or Ar. With this plasma treatment, water and the like attached onto an exposed surface of the oxide semiconductor layer are removed. Alternatively, plasma treatment may be performed using a mixture gas of oxygen and argon.

Figure 21B:
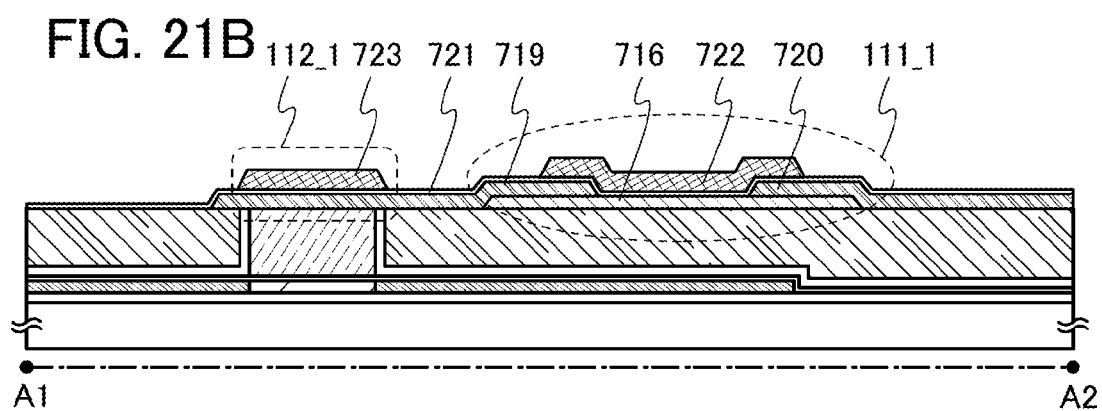

After the plasma treatment, as illustrated in FIG. 21B, the gate insulating film 721 is formed to cover the conductive film 719, the conductive film 720, and the oxide semiconductor layer 716. Then, a gate electrode 722 is formed over the gate insulating film 721 to overlap with the oxide semiconductor layer 716, and a conductive film 723 is formed over the gate insulating film 721 to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, or an aluminum nitride oxide film can be used, for example. When a plurality of insulating films stacked are used, an insulating film having low proportion of nitrogen, such as a silicon oxide film or a silicon oxynitride film, is formed on a side which is closer to the oxide semiconductor layer 716 than the insulating film having a high barrier property. Then, the insulating film having a high barrier property is formed to overlap with the conductive film 719 and the conductive film 720, and the oxide semiconductor layer 716 with the insulating film having low proportion of nitrogen provided therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed to be in contact with the oxide semiconductor layer 716, so that the insulating film having a high barrier property can be prevented from being in direct contact with the oxide semiconductor layer 716.

In this embodiment, the gate insulating film 721 with a structure in which a 100-nm-thick silicon nitride film formed by a sputtering method is stacked over a 200-nm-thick silicon oxide film formed by a sputtering method is formed. The substrate temperature during deposition may be higher than or equal to room temperature and lower than or equal to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the content of water in the gas be lower than or equal to 20 ppm, preferably lower than or equal to 1 ppm, more preferably lower than or equal to 10 ppb. In this embodiment, for example, heat treatment is performed at 250° C. in a nitrogen atmosphere for an hour. Alternatively, RTA treatment for a short time at a high temperature may be performed before the conductive film 719 and the conductive film 720 are formed in a manner similar to that of the former heat treatment performed on the oxide semiconductor layer for reduction of moisture or hydrogen. Even when oxygen defects are generated in the oxide semiconductor layer 716 by the former heat treatment performed on the oxide semiconductor layer 716 by performing the heat treatment after the gate insulating film 721 containing oxygen is provided, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition ratio can be satisfied. The oxide semiconductor layer 716 preferably contains oxygen whose composition exceeds the stoichiometric composition. As a result, the oxide semiconductor layer 716 can be made substantially intrinsic and variation in electric characteristics of the transistor due to oxygen defects can be reduced; thus, the electric characteristics can be improved. The timing of this heat treatment is not particularly limited as long as it is after the formation of the gate insulating film 721. When this heat treatment serves as heat treatment in another step (e.g., heat treatment during formation of a resin film or heat treatment for lowering the resistance of a transparent conductive film), the oxide semiconductor layer 716 can be made substantially intrinsic without the increase in the number of steps.

Alternatively, the oxygen defects that serve as donors in the oxide semiconductor layer 716 may be reduced by performing heat treatment on the oxide semiconductor layer 716 in an oxygen atmosphere so that oxygen is added to the oxide semiconductor. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in oxygen is lower than or equal to 1 ppm, preferably lower than or equal to 0.1 ppm).

Alternatively, oxygen may be added to the oxide semiconductor layer 716 by ion implantation, ion doping, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in a manner such that a conductive film is formed over the gate insulating film 721 and then is patterned. The gate electrode 722 and the conductive film 723 can be formed using a material similar to that of the gate electrode 707, or the conductive film 719 and the conductive film 720.

The thickness of the gate electrode 722 and the conductive film 723 is 10 nm to 400 nm, preferably 100 nm to 200 nm. In this embodiment, after a 150-nm-thick conductive film for the gate electrode is formed by a sputtering method using a tungsten target, the conductive film is processed (patterned) into a desired shape by etching, so that the gate electrode 722 and the conductive film 723 are formed. A resist mask may be formed by an ink-jet method. When the resist mask is formed by an ink-jet method, a photomask is not used; thus, manufacturing cost can be reduced.

Through the above steps, the first transistor 111_1 is formed.

Note that a portion where the conductive film 719 and the conductive film 723 overlap with each other with the gate insulating film 721 provided therebetween corresponds to the first capacitor 112_1.

Although the first transistor 111_1 is described as a single-gate transistor, a dual gate or multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film which is in contact with the oxide semiconductor layer, the state of the interface with the oxide semiconductor layer can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pileup of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 716 preferably contains oxygen in a proportion higher than that in the stoichiometric composition by heat treatment in an oxygen atmosphere, oxygen doping, or the like. "Oxygen doping" refers to addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be set to be $Ga_2O_X$ (X=3+α, 0<α<1) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ (X=3+α, 0<α<1) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+α}$ (0<X<2, 0<α<1) by heat treatment in an oxygen atmosphere or oxygen doping.

By oxygen doping, an insulating film including a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen vacancies in the oxide semiconductor layer or at the interface between the oxide semiconductor layer and the insulating film are reduced. Thus, the oxide semiconductor layer can be an intrinsic oxide semiconductor or a substantially intrinsic oxide semiconductor.

The oxide semiconductor layer in which oxygen vacancies have been reduced by supplying excessive oxygen in the insulating film to the oxide semiconductor layer is a highly purified oxide semiconductor layer in which hydrogen concentration is sufficiently reduced and defect levels in the energy gap due to oxygen vacancies are reduced by sufficient supply of oxygen. Consequently, an oxide semiconductor layer in which carrier concentration is extremely low, which enables the transistor to have an extremely low off-state current, can be obtained. When such a transistor having an extremely low off-state current is used as the first transistor according to the above embodiment, the first transistor can be considered substantially as an insulator when brought out of conduction. Thus, this means, when such a transistor is used as the first transistor 111_1 and the second transistor 111_2, a reduction in the potentials of the first data holding portion D_HOLD1 can be kept to an extremely low level. As a result, variations in the potential of the first data holding portion D_HOLD1 can be reduced and the stored data can be prevented from being lost even in the case where the supply of power supply voltage is stopped.

The insulating film including a region where the proportion of oxygen is higher than that in the stoichiometric composition may be used for either the insulating film placed on an upper side of the oxide semiconductor layer or the insulating film placed on a lower side of the oxide semiconductor layer of the insulating films which are in contact with the oxide semiconductor layer 716; however, it is preferable to use such an insulating film for both the insulating films which are in contact with the oxide semiconductor layer 716. The above advantageous effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ (X=3+α, 0<α<1). Alternatively, one of the insulating films on the upper side and the lower side may be formed using gallium oxide whose composition is $Ga_2O_X$ (X=3+α, 0<α<1) and the other may be formed using aluminum oxide whose composition is $Al_2O_X$ (X=3+α, 0<α<1).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ (X=3+α, 0<α<1) is formed and gallium aluminum oxide (aluminum gallium oxide) whose composition is $Ga_XAl_{2-X}O_{3+α}$ (0<X<2, 0<α<1) is formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 21C:
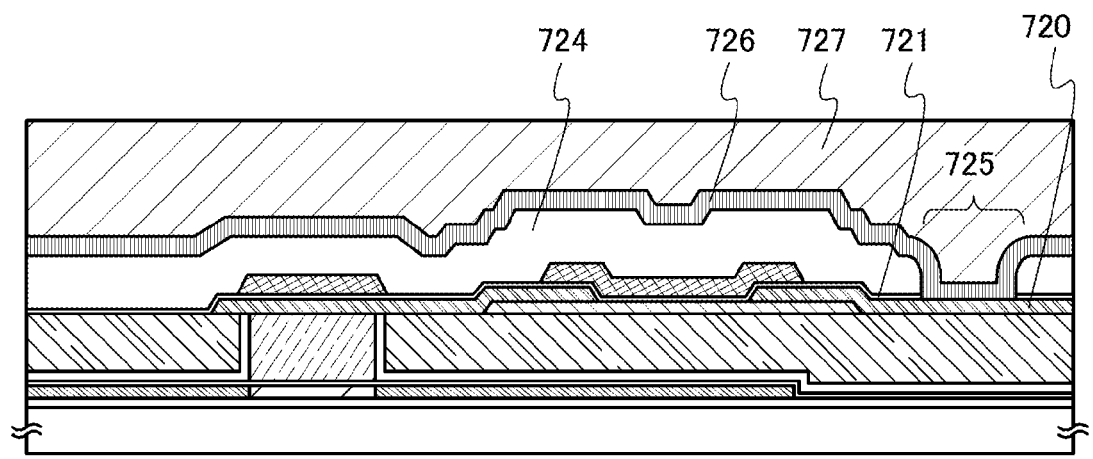

Next, as illustrated in FIG. 21C, an insulating film 724 is formed to cover the gate insulating film 721 and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by a PVD method or a CVD method and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by a PVD method and a thin titanium film (with a thickness of approximately 5 nm)

is formed by a PVD method, and then an aluminum film is formed to be embedded in the opening 725. Here, the titanium film formed by a PVD method has a function of reducing an oxide film (e.g., a native oxide film) formed on a surface over which the titanium film is formed to decrease the contact resistance with the lower electrode or the like (here, the conductive film 720). In addition, hillocks of the aluminum film can be prevented. A copper film may be formed by a plating method after a barrier film of titanium, titanium nitride, or the like is formed.

Here, the case where a connection position of the conductive film 720 and the wiring 726 overlap with each other will be described. In this case, after the conductive film 720 is formed, an opening is formed in a region overlapping with an opening in the lower portion in the gate insulating film 721 and the insulating film 724, and then the wiring 726 is formed.

Next, an insulating film 727 is formed to cover the wiring 726. Through the series of steps, the semiconductor storage device can be formed.

Note that in the manufacturing method, the conductive film 719 and the conductive film 720 functioning as source and drain electrodes are formed after the formation of the oxide semiconductor layer 716. Thus, as illustrated in FIG. 21B, in the first transistor 111_1 obtained by the manufacturing method, the conductive film 719 and the conductive film 720 are formed over the oxide semiconductor layer 716. However, in the first transistor 111_1, the conductive films functioning as source and drain electrodes may be formed below the oxide semiconductor layer 716, that is, between the oxide semiconductor layer 716, and the insulating film 712 and the insulating film 713.

Figure 22:
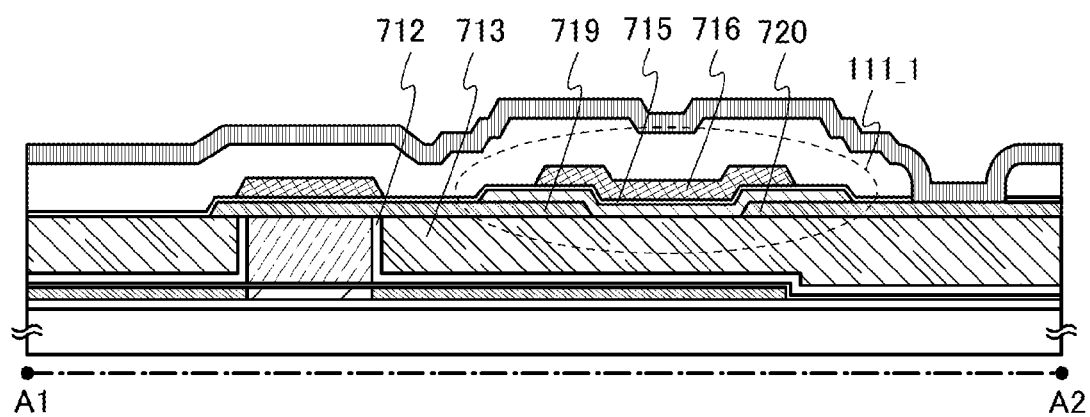
FIG. 22 is a cross-sectional view illustrating a structure of a semiconductor storage device.

FIG. 22 illustrates a cross-sectional view of the first transistor 111_1 in the case where the conductive film 719 and the conductive film 720 functioning as source and drain electrodes are provided between the oxide semiconductor layer 716, and the insulating film 712 and the insulating film 713. The first transistor 111_1 illustrated in FIG. 22 can be obtained in a manner such that the conductive film 719 and the conductive film 720 are formed after the formation of the insulating film 713 and then the oxide semiconductor layer 716 is formed.

Figure 23A:
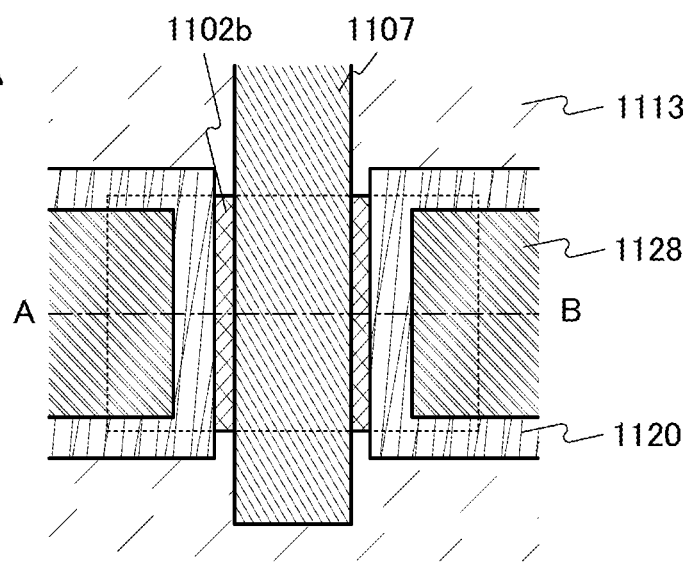
FIGS. 23A and 23B illustrate a structure of a transistor.
Figure 23B:
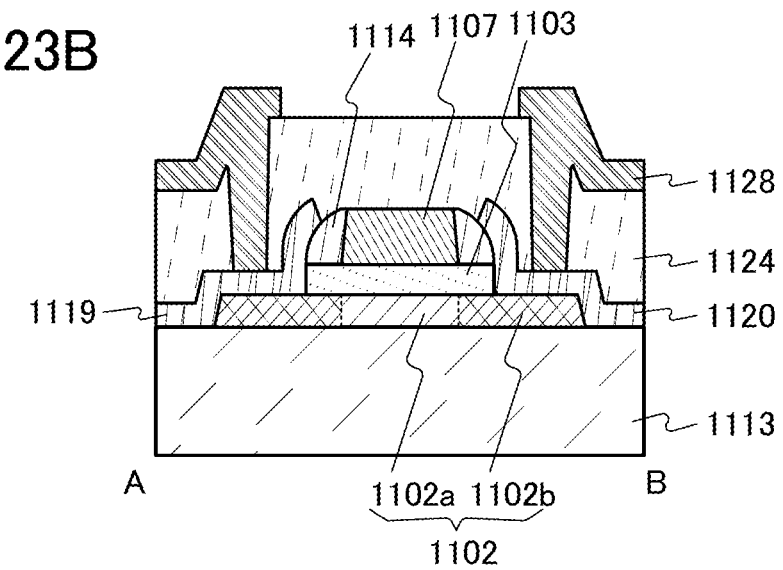

Note that the first transistor 111_1 is not limited to the mode illustrated in FIG. 22 and a planar type which is suitable for miniaturization can be employed. FIGS. 23A and 23B illustrate an example thereof. An example of a transistor in which an In—Sn—Zn—O film is used as an oxide semiconductor film will be described with reference to FIGS. 23A and 23B.

FIGS. 23A and 23B are a top view and a cross-sectional view of a coplanar transistor having a top-gate top-contact structure. FIG. 23A is the top view of the transistor. FIG. 23B illustrates a cross section A-B along the dashed-dotted line A-B in FIG. 23A.

The transistor illustrated in FIG. 23B includes an oxide semiconductor film 1102 which is provided over an insulating film 1113 and includes a high-resistance region 1102a and low-resistance regions 1102b; a gate insulating film 1103 provided over the oxide semiconductor film 1102; a gate electrode 1107 provided to overlap with the oxide semiconductor film 1102 with the gate insulating film 1103 provided therebetween; sidewall insulating films 111_4 provided in contact with side surfaces of the gate electrode 1107; a conductive film 1119 and a conductive film 1120 provided in contact with at least the low-resistance regions 1102b; an insulating film 1124 provided to cover at least the oxide semiconductor film 1102, the gate electrode 1107, the conductive film 1119, and the conductive film 1120; and wirings 1128 provided to be connected to the conductive film 1119 and the conductive film 1120 through openings formed in the insulating film 1124.

Although not illustrated, a protective film may be provided to cover the insulating film 1124 and the wirings 1128. With the protective film, a minute amount of leakage current generated by surface conduction of the insulating film 1124 can be reduced, so that the off-state current of the transistor can be reduced.

Figure 24A:
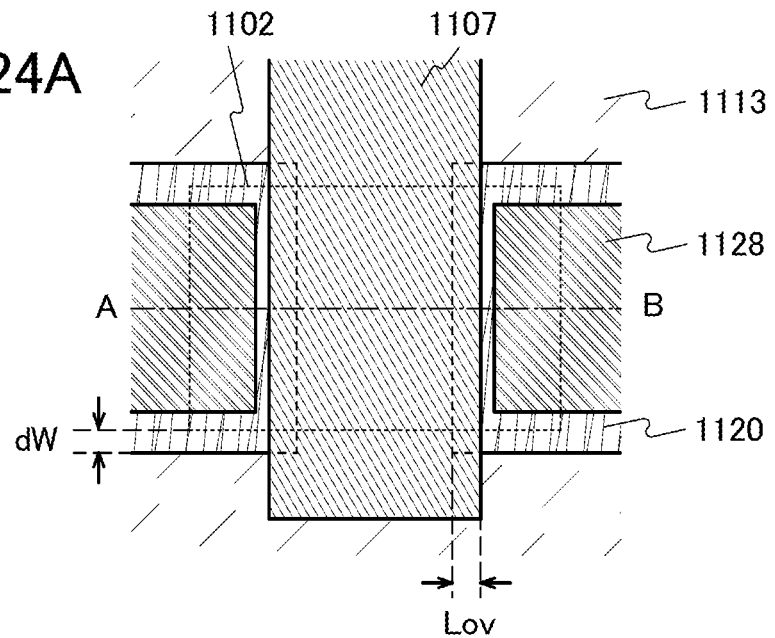
FIGS. 24A and 24B illustrate a structure of a transistor.
Figure 24B:
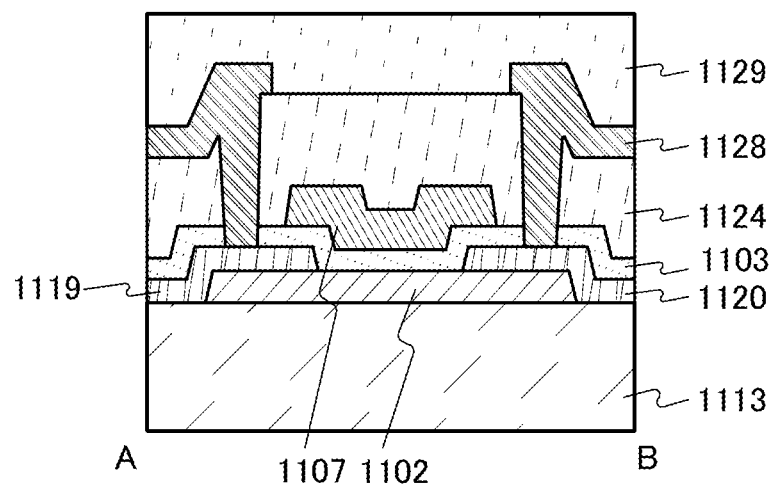

FIGS. 24A and 24B are a top view and a cross-sectional view illustrating a structure of another transistor. FIG. 24A is the top view of the transistor. FIG. 24B is a cross-sectional view taken along the dashed-dotted line A-B in FIG. 24A.

The transistor illustrated in FIG. 24B includes an oxide semiconductor film 1102 which is provided over an insulating film 1113; a conductive film 1119 and a conductive film 1120 provided in contact with the oxide semiconductor film 1102; a gate insulating film 1103 which is provided over the oxide semiconductor film 1102, the conductive film 1119, and the conductive film 1120; a gate electrode 1107 provided to overlap with the oxide semiconductor film 1102 with the gate insulating film 1103 provided therebetween; an insulating film 1124 provided to cover the gate insulating film 1103 and the gate electrode 1107; wirings 1128 provided to be connected to the conductive film 1119 and the conductive film 1120 through openings formed in the insulating film 1124; and a protective film 1129 provided to cover the insulating film 1124 and the wirings 1128.

As the insulating film 1113, a silicon oxide film is used. As the oxide semiconductor film 1102, an In—Sn—Zn—O film is used. As the conductive film 1119 and the conductive film 1120, a tungsten film is used. As the gate insulating film 1103, a silicon oxide film is used. The gate electrode 1107 has a layered structure of a tantalum nitride film and a tungsten film. The insulating film 1124 has a layered structure of a silicon oxynitride film and a polyimide film. The wirings 1128 have a layered structure in which a titanium film, an aluminum film, and a titanium film are formed in this order. As the protective film 1129, a polyimide film is used.

Note that in the transistor having the structure illustrated in FIG. 24A, the width of a portion where the gate electrode 1107 overlaps with the conductive film 1119 or the conductive film 1120 is referred to as Lov. Similarly, the width of a portion of the conductive film 1119 or the conductive film 1120, which does not overlap with the oxide semiconductor film 1102, is referred to as dW.

Here, the field-effect mobility of a transistor whose channel is formed using an oxide semiconductor is considered. The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility is expressed by the following formula (2).

[FORMULA 2]

$$\mu = \mu_0 \exp\left(-\frac{E}{kT}\right) \quad (2)$$

In the formula (2), E represents the height of the potential barrier, k represents the Boltzmann constant, and T represents the absolute temperature. When the potential barrier is assumed to be attributed to a defect, the height of the potential barrier is expressed by the following formula (3) according to the Levinson model.

[FORMULA 3]

$$E = \frac{e^2 N^2}{8\varepsilon n} = \frac{e^3 N^2 t}{8\varepsilon C_{ox} V_g} \quad (3)$$

Here, e represents the elementary electric charge, N represents the average defect density per unit area in a channel, ∈ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region is expressed by the following formula (4).

[FORMULA 4]

$$I_d = \frac{W \mu V_g V_d C_{ox}}{L} \exp\left(-\frac{E}{kT}\right) \quad (4)$$

In the formula (4), L represents the channel length and W represents the channel width, and L and W are each 10 p.m. In addition, $V_d$ represents the drain voltage. When dividing both sides of the formula (4) by $V_g$ and then taking logarithms of both sides, the following formula (5) can be obtained.

[FORMULA 5]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad (5)$$

The right side of the formula (5) is a function of $V_g$. From the equation, it is found that the defect density N can be obtained from the slope of a line with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm$^2$/Vs from the formula (2) and the formula (3). The measured mobility of an In—Sn—Zn-based oxide including a defect is approximately 35 cm$^2$/Vs. However, assuming that no defect exists inside the semiconductor and at the interface between the semiconductor and an insulating film, the mobility $\mu_o$ of the oxide semiconductor is expected to be 120 cm$^2$/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following formula (6).

[FORMULA 6]

$$\frac{1}{\mu_1} = \frac{1}{\mu_0} + \frac{D}{B} \exp\left(-\frac{x}{G}\right) \quad (6)$$

In the formula (6), D represents the electric field in the gate direction, and B and G are constants. B and G can be obtained from actual measurement results, and according to the above measurement results, B is $4.75 \times 10^7$ cm/s and G is 10 nm (the depth to which the influence of interface scattering reaches). When D is increased (i.e., when the gate voltage is increased), the second term of the formula (6) is increased, so that the mobility $\mu_1$ is decreased.

Figure 25:
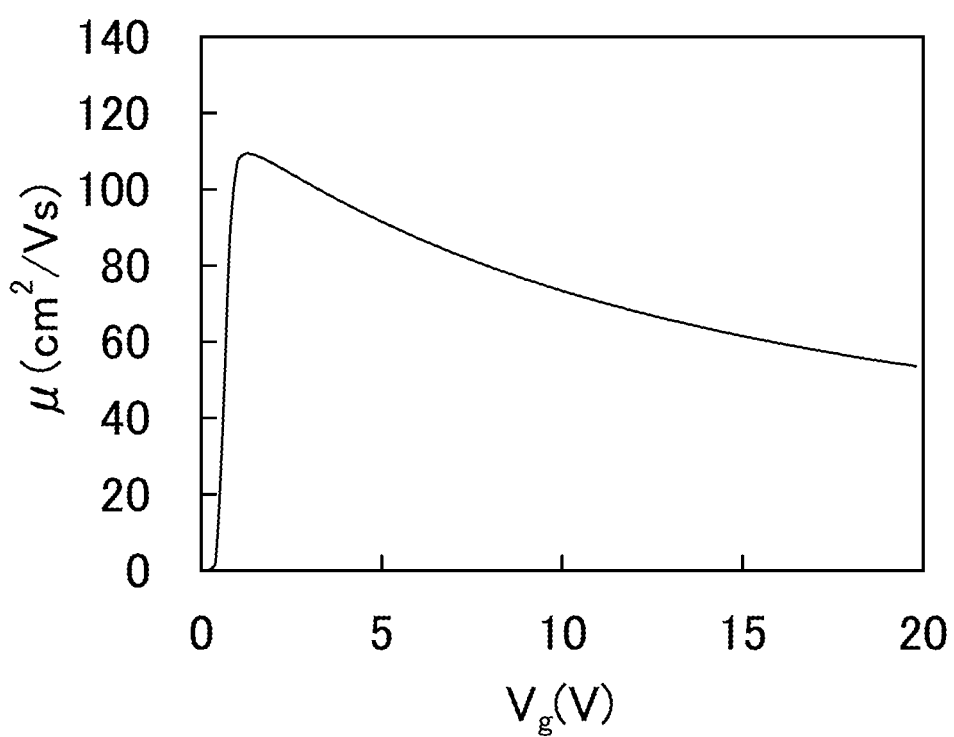
FIG. 25 shows gate voltage dependence of mobility obtained by calculation.

Calculation results of the mobility $\mu_2$ of a transistor whose channel includes an ideal oxide semiconductor without a defect inside the semiconductor are shown in FIG. 25. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 25, the mobility has a peak of 100 cm$^2$/Vs or more at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a mobility are shown in FIGS. 26A to 26C, FIGS. 27A to 27C, and FIGS. 28A to 28C. FIGS. 29A and 29B illustrate cross-sectional structures of the transistors used for the calculation. The transistors illustrated in FIGS. 29A and 29B each include low-resistance regions 1102b which have n'-type conductivity in an oxide semiconductor layer. The resistivity of the low-resistance 1102b is $2 \times 10^{-3}$ Ωcm.

The transistor illustrated in FIG. 29A is formed over an insulating film 1113 and an embedded insulator 1115 that is embedded in the insulating film 1113 and is formed of aluminum oxide. The transistor includes the low-resistance regions 1102b including an oxide semiconductor, a high-resistance region 1102a that is placed therebetween and serves as a channel formation region, and a gate electrode 1107. The width of the gate electrode 1107 is 33 nm.

A gate insulating film 1108 is formed between the gate electrode 1107 and the high-resistance region 1102a. Sidewall insulating films 111_4 are formed on both side surfaces of the gate electrode 1107, and an insulating layer 1117 is formed over the gate electrode 1107 to prevent a short circuit between the gate electrode 1107 and another wiring. The sidewall insulating films 111_4 each have a width of 5 nm. In addition, a conductive film 1119 and a conductive film 1120 which serve as source and drain electrodes are formed in contact with the low-resistance regions 1102b. Note that the channel width of this transistor is 40 nm.

The transistor in FIG. 29B is the same as the transistor in FIG. 29A in that it is formed over the insulating film 1113 and the embedded insulator 1115 formed of aluminum oxide and that it includes the low-resistance regions 1102b including an oxide semiconductor, the high-resistance region 1102a including an oxide semiconductor provided therebetween, the gate electrode 1107 having a width of 33 nm, the gate insulating film 1108, the sidewall insulating films 1114, the insulating layer 1117, and the conductive film 1119 and the conductive film 1120 which serve as the source and drain electrodes.

The difference between the transistor in FIG. 29A and the transistor in FIG. 29B is the conductivity type of semiconductor regions under the sidewall insulating films 1114. In the transistor in FIG. 29A, the semiconductor regions under the sidewall insulating films 1114 are parts of the low-resistance regions 1102b having n$^+$-type conductivity, whereas in the transistor in FIG. 29B, the semiconductor regions under the sidewall insulating films 1114 are parts of the high-resistance region 1102a. In other words, there is a region with a width $L_{off}$, in which the gate electrode 1107 does not overlap with the low-resistance region 1102b. This region is called an offset region, and the width $L_{off}$ is called an offset length. As is seen from the drawing, the offset length is equal to the width of the sidewall insulating film 1114.

Figure 26A:
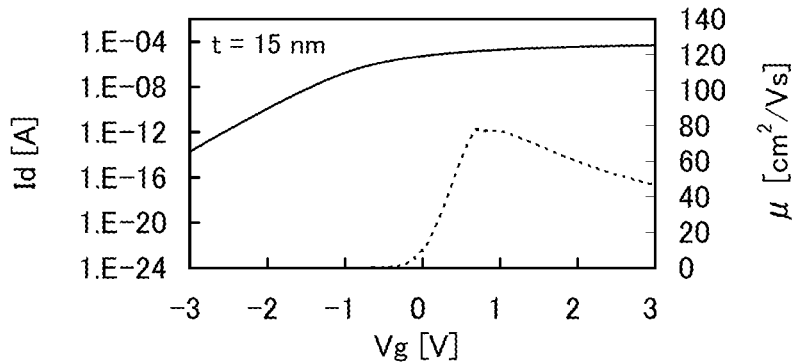
FIGS. 26A to 26C show gate voltage dependence of drain current and mobility obtained by calculation.
Figure 26B:
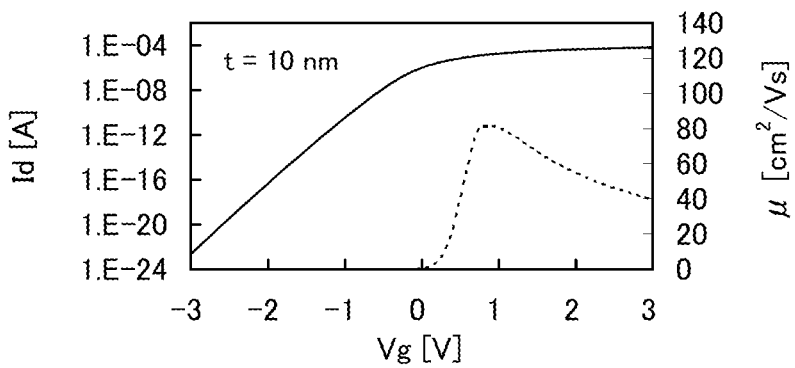
Figure 26C:
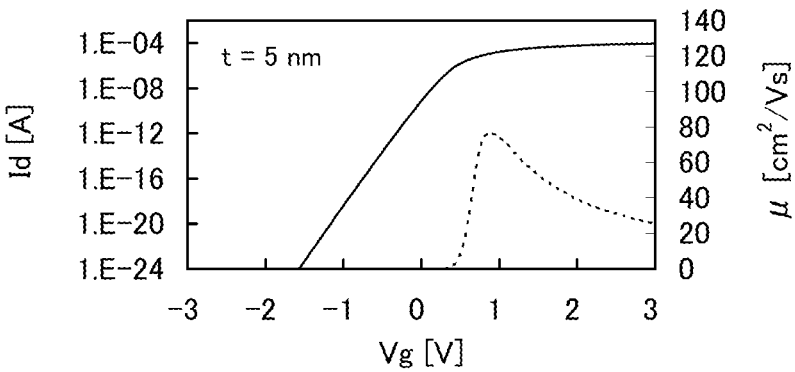

The other parameters used in calculation are as described above. For the calculation, device simulation software Sentaurus Device manufactured by Synopsys, Inc. was used. FIGS. 26A to 26C show the gate voltage ($V_g$: a potential difference between the gate and the source) dependence of the drain current ($I_d$, a solid line) and the mobility ($\mu$, a dotted line) of the transistor having the structure illustrated in FIG. 29A. The drain current $I_d$ is obtained by calculation under the assumption that the drain voltage (a potential difference between the drain and the source) is +1 V, and the mobility $\mu$ is obtained by calculation under the assumption that the drain voltage is +0.1 V.

FIG. 26A shows the gate voltage dependence of the transistor in the case where the thickness of the gate insulating film is 15 nm, FIG. 26B shows that of the transistor in the case where the thickness of the gate insulating film is 10 nm, and FIG. 26C shows that of the transistor in the case where the thickness of the gate insulating film is 5 nm. As the gate insulating film is thinner, the drain current $I_d$ particularly in the off state (off-state current) is significantly decreased. In contrast, there is no noticeable change in the peak value of the mobility $\mu$ and the drain current $I_d$ in the on state (on-state current).

Figure 27A:
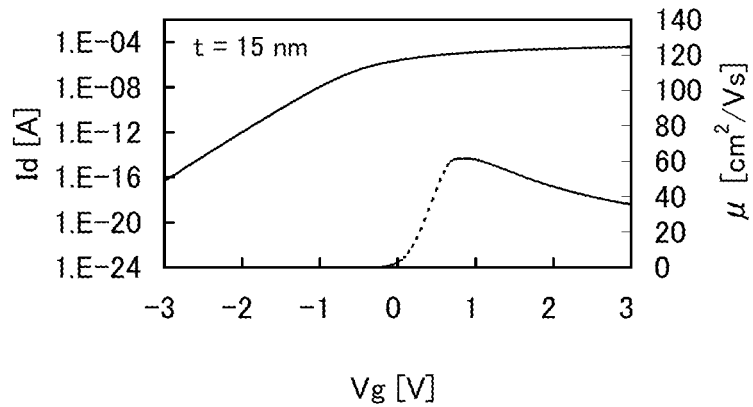
FIGS. 27A to 27C show gate voltage dependence of drain current and mobility obtained by calculation.
Figure 27B:
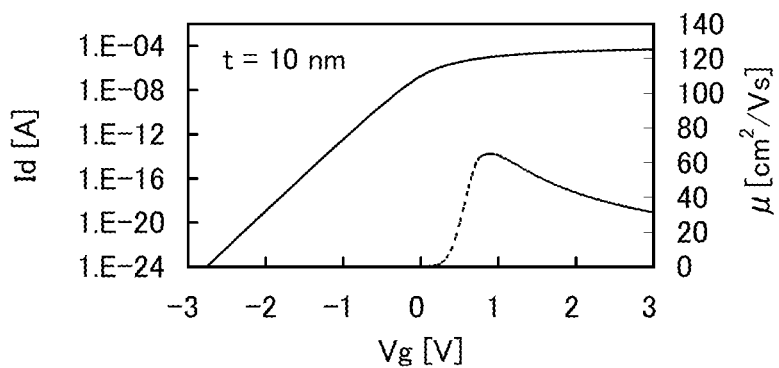
Figure 27C:
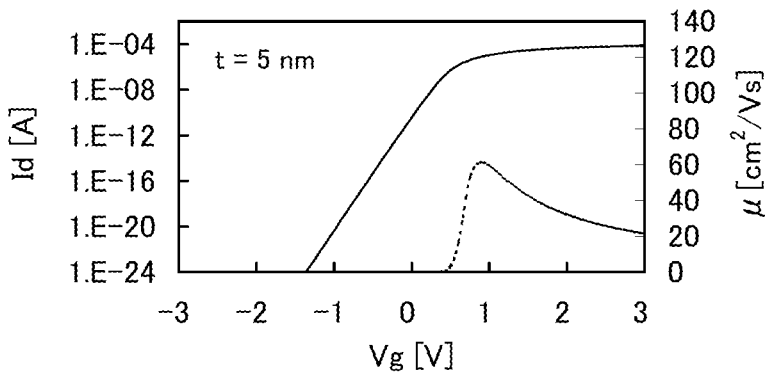

FIGS. 27A to 27C show the gate voltage $V_g$ dependence of the drain current $I_d$ (a solid line) and the mobility $\mu$ (a dotted line) of the transistor having the structure in FIG. 29B and an offset length $L_{off}$ of 5 nm. The drain current $I_d$ is obtained by calculation under the assumption that the drain voltage is +1 V and the mobility $\mu$ is obtained by calculation under the assumption that the drain voltage is +0.1 V. FIG. 27A shows the gate voltage dependence of the transistor in the case where the thickness of the gate insulating film is 15 nm, FIG. 27B shows that of the transistor in the case where the thickness of the gate insulating film is 10 nm, and FIG. 27C shows that of the transistor in the case where the thickness of the gate insulating film is 5 nm.

Figure 28A:
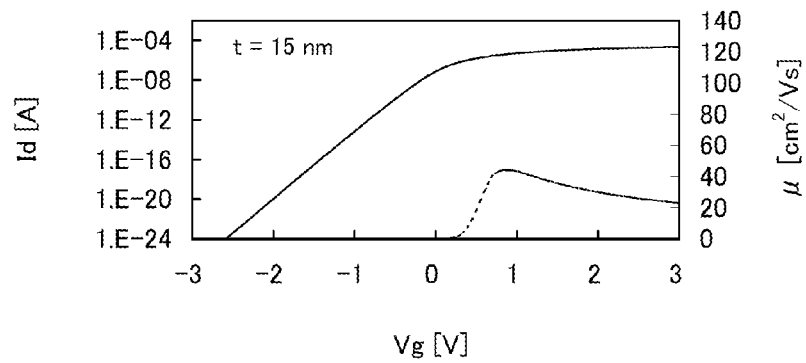
FIGS. 28A to 28C show gate voltage dependence of drain current and mobility obtained by calculation.
Figure 28B:
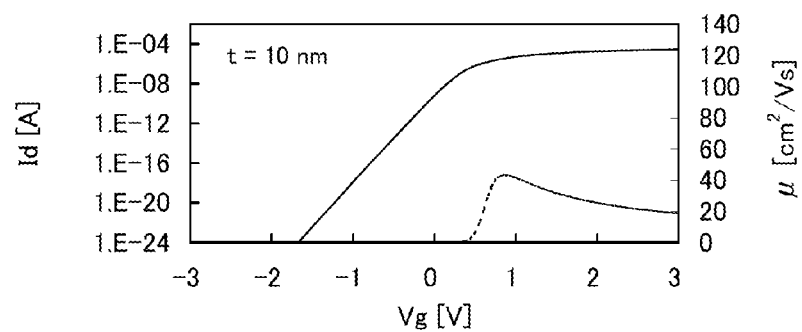
Figure 28C:
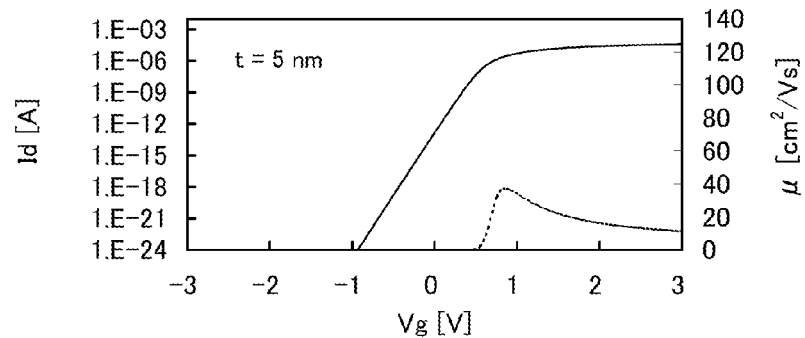
Figure 29A:
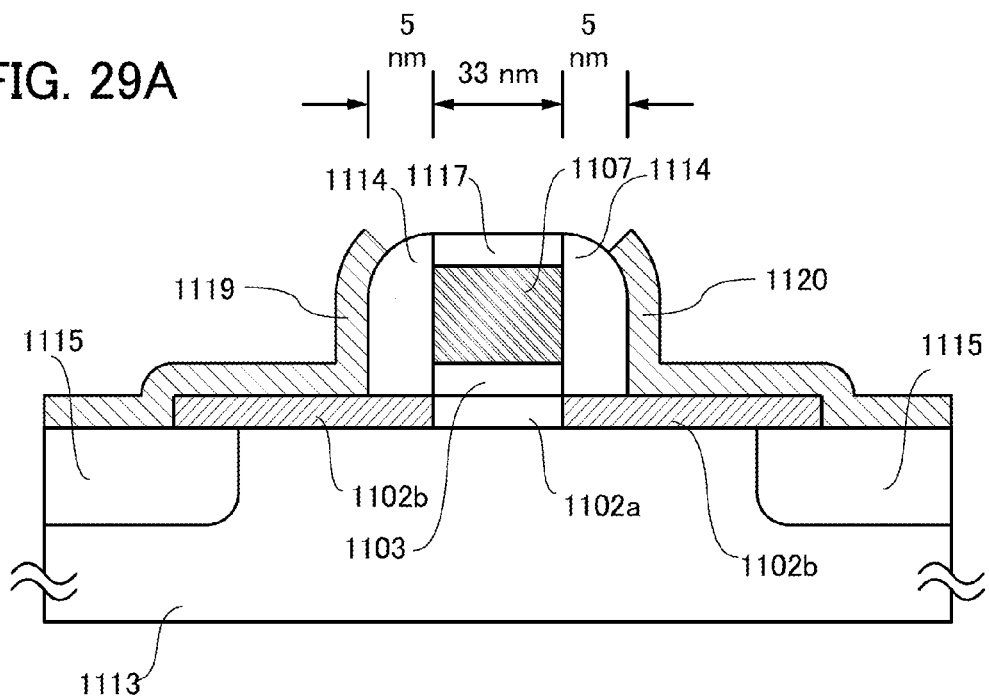
FIGS. 29A and 29B illustrate cross-sectional structures of transistors used for calculation.
Figure 29B:
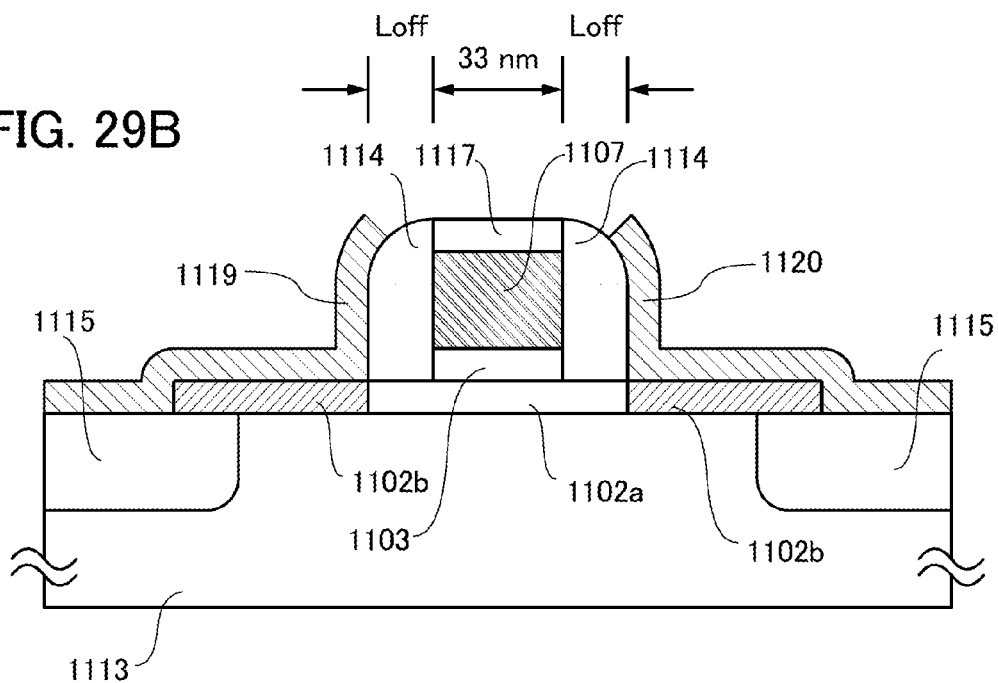

FIGS. 28A to 28C show the gate voltage dependence of the drain current $I_d$ (a solid line) and the mobility $\mu$ (a dotted line) of the transistor having the structure in FIG. 29B and an offset length $L_{off}$ of 15 nm. The drain current $I_d$ is obtained by calculation under the assumption that the drain voltage is +1 V and the mobility $\mu$ is obtained by calculation under the assumption that the drain voltage is +0.1 V. FIG. 28A shows the gate voltage dependence of the transistor in the case where the thickness of the gate insulating film is 15 nm, FIG. 28B shows that of the transistor in the case where the thickness of the gate insulating film is 10 nm, and FIG. 28C shows that of the transistor in the case where the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 26A to 26C, approximately 60 cm$^2$/Vs in FIGS. 27A to 27C, and approximately 40 cm$^2$/Vs in FIGS. 28A to 28C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

As described above, the field-effect mobility of the transistor is described in detail; however, this embodiment can be combined with any of the above embodiments as appropriate.

Embodiment 6

In this embodiment, a c-axis aligned crystalline oxide semiconductor (CAAC-OS) film will be described.

The CAAC-OS film is not completely single crystal nor completely amorphous. The CAAC-OS film is an oxide semiconductor film with a crystal-amorphous mixed phase structure where a crystal part (crystal region) and an amorphous part (amorphous region) are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Nitrogen may be substituted for part of oxygen which is a constituent of the CAAC-OS film.

An example of a crystal structure of the CAAC-OS film will be described in detail with reference to FIGS. 30A to 30E, FIGS. 31A to 31C, and FIGS. 32A to 32C. In FIGS. 30A to 30E, FIGS. 31A to 31C, and FIGS. 32A to 32C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 30A to 30E, O surrounded by a circle represents tetracoordinate O and O surrounded by a double circle represents tricoordinate O.

Figure 30A:
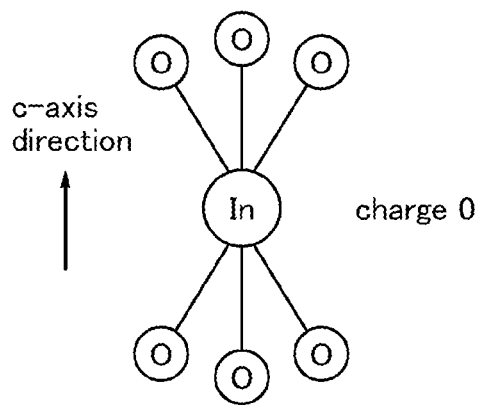
FIGS. 30A to 30E illustrate a structure of an oxide material according to one embodiment of the present invention.

FIG. 30A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 30A is actually an octahedral structure, but is illustrated as a planar structure for simplicity. Note that three tetracoordinate O atoms exist in each of an upper half and a lower half in FIG. 30A. In the small group illustrated in FIG. 30A, electric charge is 0 (zero).

Figure 30D:
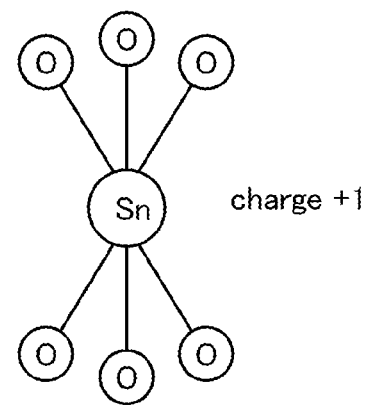
Figure 30B:
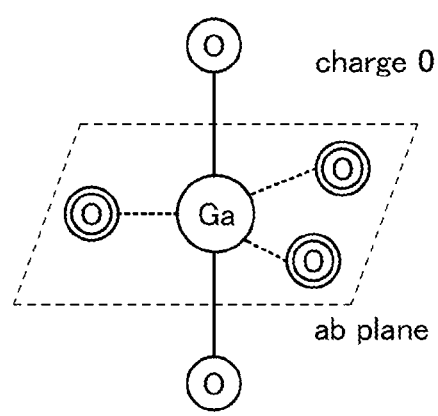

FIG. 30B illustrates a structure including one pentacoordinate Ga atom, three tricoordinate oxygen (hereinafter referred to as tricoordinate O) atoms proximate to the Ga atom, and two tetracoordinate O atoms proximate to the Ga atom (or near neighbor Ga atom). All the tricoordinate O atoms exist on the a-b plane. One tetracoordinate O atom exists in each of an upper half and a lower half in FIG. 30B. An In atom can also have the structure illustrated in FIG. 30B because an In atom can have five ligands. In the small group illustrated in FIG. 30B, electric charge is 0.

Figure 30E:
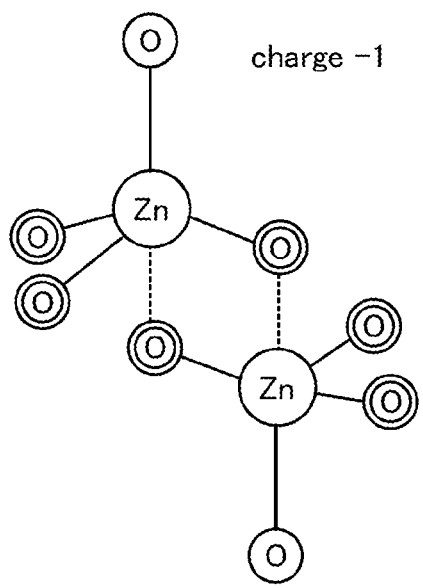
Figure 30C:
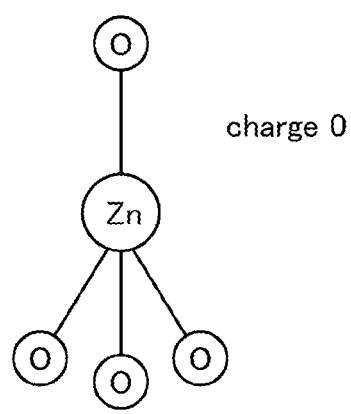

FIG. 30C illustrates a structure including one tetracoordinate Zn atom and four tetracoordinate O atoms proximate to the Zn atom. In FIG. 30C, one tetracoordinate O atom exists in an upper half and three tetracoordinate O atoms exist in a lower half. Alternatively, in FIG. 30C, three tetracoordinate O atoms may exist in an upper half and one tetracoordinate O atom may exist in a lower half In the small group illustrated in FIG. 30C, electric charge is 0.

FIG. 30D illustrates a structure including one hexacoordinate Sn atom and six tetracoordinate O atoms proximate to the Sn atom. In FIG. 30D, three tetracoordinate O atoms exist in each of an upper half and a lower half. In the small group illustrated in FIG. 30D, electric charge is +1.

FIG. 30E illustrates a small group including two Zn atoms. In FIG. 30E, one tetracoordinate O atom exists in each of an upper half and a lower half In the small group illustrated in FIG. 30E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 30A has three proximate In atoms in the downward direction, and the three O atoms in the lower half has three proximate In atoms in the upward direction. The one O atom in the upper half with respect to the pentacoordinate Ga atom in FIG. 30B has one proximate Ga atom in the downward direction, and the one O atom in the lower half has one proximate Ga atom in the upward direction. The one O atom in the upper half with respect to the one tetracoordinate Zn atom in FIG. 30C has one proximate Zn atom in the downward direction, and the three O atoms in the lower half has three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, a medium group can also be formed in a different manner by combining a plurality of small groups so that the total electric charge of the layered structure is 0.

FIG. 31A illustrates a model of a medium group included in a layered structure of an In—Sn—Zn-based oxide. FIG. 31B illustrates a large group including three medium groups. FIG. 31C illustrates an atomic arrangement where the layered structure in FIG. 31B is observed from the c-axis direction.

In FIG. 31A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 31A, one tetracoordinate O atom existing in each of an upper half and a lower half with respect to an In atom is denoted by circled 1. FIG. 31A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 31A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 30E can be given. For example, with one small group including two Zn atoms, electric charge of one small group including a Sn atom can be cancelled, so that the total electric charge of the layered structure can be 0.

When the large group illustrated in FIG. 31B is repeated, a crystal of an In—Sn—Zn-based oxide ($In_2SnZn_3O_8$) can be obtained. Note that a layered structure of the obtained In—Sn—Zn—O-based crystal can be expressed as a composition formula, $In_2SnZn_2O_2(ZnO)_m$ (m is 0 or a natural number).

The above-described rule also applies to the following materials: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and a single-component metal oxide such as an In-based oxide, a Sn-based oxide, or a Zn-based oxide.

Figure 32A:
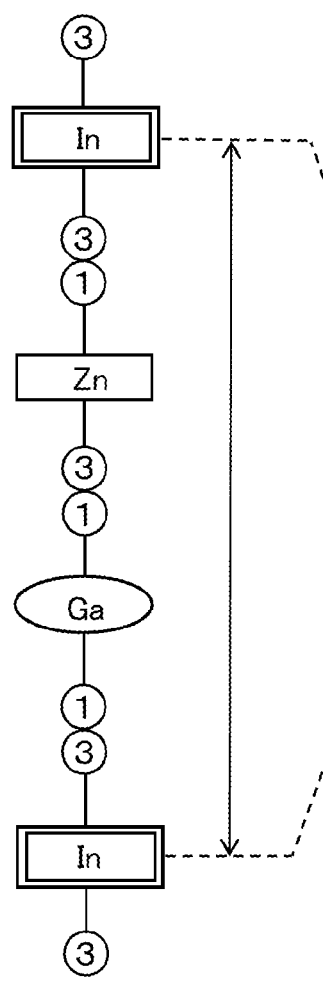
FIGS. 32A to 32C illustrate a structure of an oxide material according to one embodiment of the present invention.

For example, FIG. 32A illustrates a model of a medium group included in a layered structure of an In—Ga—Zn-based oxide.

In the medium group included in the layered structure of the In—Ga—Zn-based oxide in FIG. 32A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 32B:
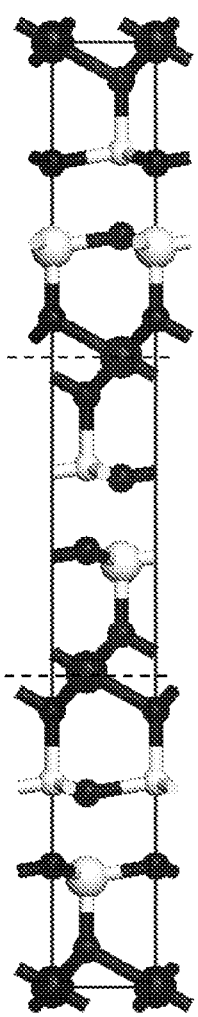
Figure 32C:
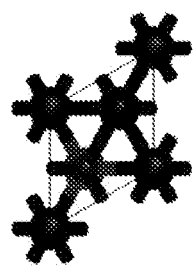

FIG. 32B illustrates a large group including three medium groups. Note that FIG. 32C illustrates an atomic arrangement in the case where the layered structure in FIG. 32B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 32A but also a medium group in which the arrangement of the In atom, the Ga atom, and the Zn atom is different from that in FIG. 32A.

When the large group illustrated in FIG. 32B is repeated, a crystal of an In—Ga—Zn-based oxide can be obtained. Note that a layered structure of the obtained In—Ga—Zn—O-based crystal can be expressed as a composition formula, $InGaO_3(ZnO)_n$ (n is a natural number).

Figure 40A:
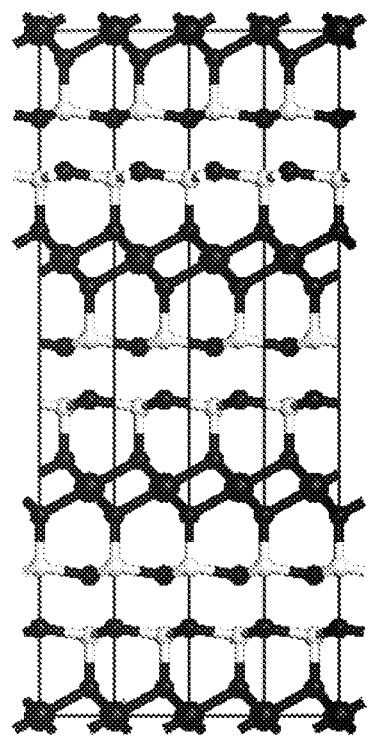
FIGS. 40A and 40B illustrate a crystal structure of an oxide material.

In the case where n=1 ($InGaZnO_4$), a crystal structure illustrated in FIG. 40A can be obtained, for example. Note that in the crystal structure in FIG. 40A, since a Ga atom and an In atom each have five ligands as described in FIG. 30B, a structure in which Ga is replaced with In can be obtained.

Figure 40B:
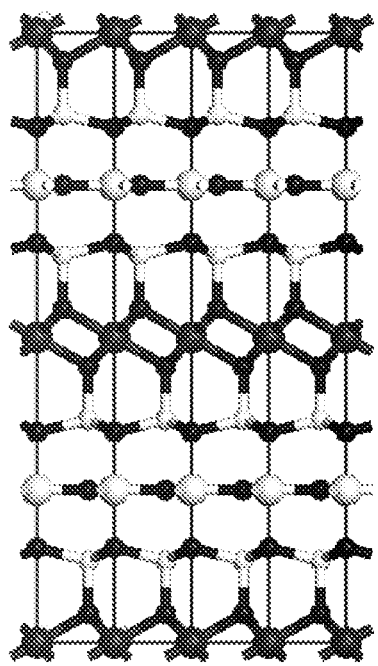

In the case where n=2 ($InGaZn_2O_5$), a crystal structure illustrated in FIG. 40B can be obtained, for example. Note that in the crystal structure in FIG. 40B, since a Ga atom and an In atom each have five ligands as described in FIG. 30B, a structure in which Ga is replaced with In can be obtained.

This embodiment can be combined with any of the other embodiments as appropriate.

Embodiment 7

A transistor whose channel formation region includes an oxide semiconductor including In, Sn, and Zn as main components can have favorable characteristics by depositing the oxide semiconductor while heating a substrate or by performing heat treatment after an oxide semiconductor film is formed. Note that a main component refers to an element included in a composition ratio at 5 atomic % or more.

By intentionally heating the substrate after deposition of the oxide semiconductor film including In, Sn, and Zn as main components, the field-effect mobility of the transistor can be improved. Further, the threshold voltage of the transistor can be positively shifted to make the transistor normally off.

Figure 33A:
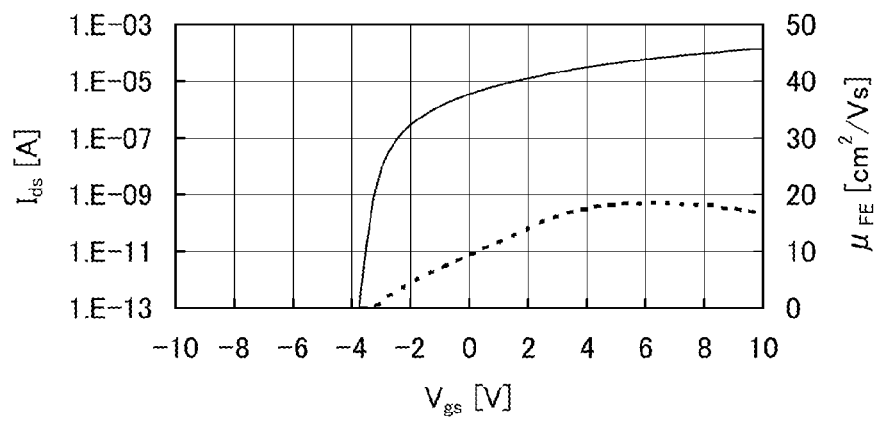
FIGS. 33A to 33C are graphs each showing characteristics of a transistor including an oxide semiconductor film.
Figure 33B:
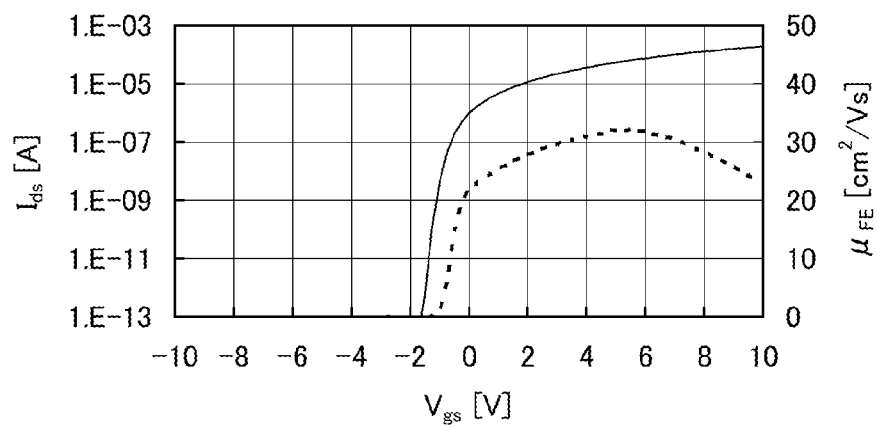
Figure 33C:
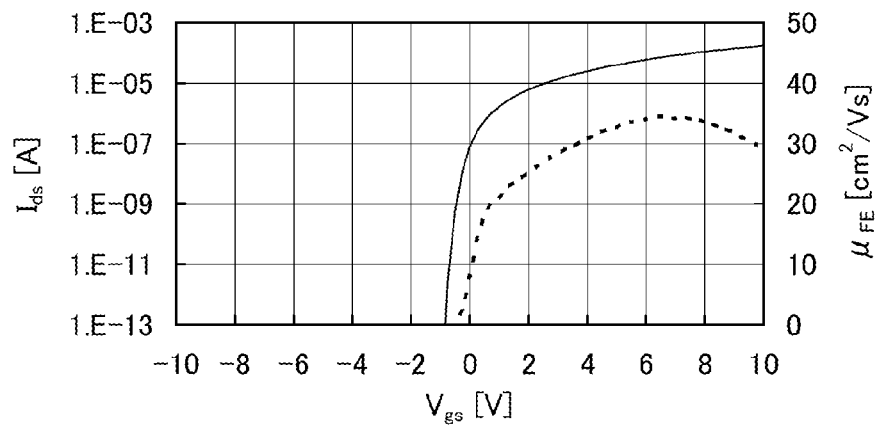

For example, FIGS. 33A to 33C each show characteristics of a transistor that includes an oxide semiconductor film including In, Sn, and Zn as main components and having a channel length L of 3 μm and a channel width W of 10 μm, and a gate insulating film with a thickness of 100 nm. Note that $V_d$ was set to 10 V.

FIG. 33A shows characteristics of a transistor whose oxide semiconductor film including In, Sn, and Zn as main components was formed by a sputtering method without heating a substrate intentionally. The field-effect mobility of the transistor is 18.8 cm$^2$/Vs. On the other hand, when the oxide semiconductor film including In, Sn, and Zn as main components is formed while heating the substrate intentionally, the field-effect mobility can be improved. FIG. 33B shows characteristics of a transistor whose oxide semiconductor film including In, Sn, and Zn as main components was formed while heating a substrate at 200° C. The field-effect mobility of the transistor is 32.2 cm$^2$/Vs.

The field-effect mobility can be further improved by performing heat treatment after the oxide semiconductor film including In, Sn, and Zn as main components is formed. FIG. 33C shows characteristics of a transistor whose oxide semiconductor film including In, Sn, and Zn as main components was deposited by a sputtering method at 200° C. and then subjected to heat treatment at 650° C. The field-effect mobility of the transistor is 34.5 cm$^2$/Vs.

The intentional heating of the substrate can reduce moisture taken into the oxide semiconductor film during the deposition by a sputtering method. Further, the heat treatment after deposition enables hydrogen, a hydroxyl group, or moisture to be released and removed from the oxide semiconductor film. In this manner, the field-effect mobility can be improved. It is presumed that such an improvement in field-effect mobility is achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm$^2$/Vs is expected to be realized.

The oxide semiconductor including In, Sn, and Zn as main components may be crystallized in the following manner oxygen ions are implanted into the oxide semiconductor; hydrogen, a hydroxyl group, or moisture included in the oxide semiconductor is released by heat treatment; and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during deposition and/or the heat treatment after the deposition contributes not only to improving field-effect mobility but also to making the transistor normally off. In a transistor whose channel formation region is formed in an oxide semiconductor film including In, Sn, and Zn as main components without heating a substrate intentionally, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; such a tendency can be confirmed by comparison between FIGS. 33A and 33B.

Note that the threshold voltage can also be controlled by changing the ratio of In, Sn, and Zn; when the composition ratio of In, Sn, and Zn is 2:1:3, a normally-off transistor can be expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., more preferably higher than or equal to 400° C. When deposition or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2 MV/cm at 150° C. for an hour, drift of the threshold voltage can be less than ±1.5 V, preferably less than ±1.0 V.

A BT test was performed on the following two transistors: Sample 1 on which heat treatment was not performed after deposition of an oxide semiconductor film; and Sample 2 on which heat treatment at 650° C. was performed after deposition of an oxide semiconductor film.

First, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of 20 V was applied so that the intensity of an electric field applied to the gate insulating film was 2 MV/cm, and the condition was kept for an hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of −20 V was applied so that the intensity of an electric field applied to the gate insulating film was −2 MV/cm, and the condition was kept for an hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 34A:
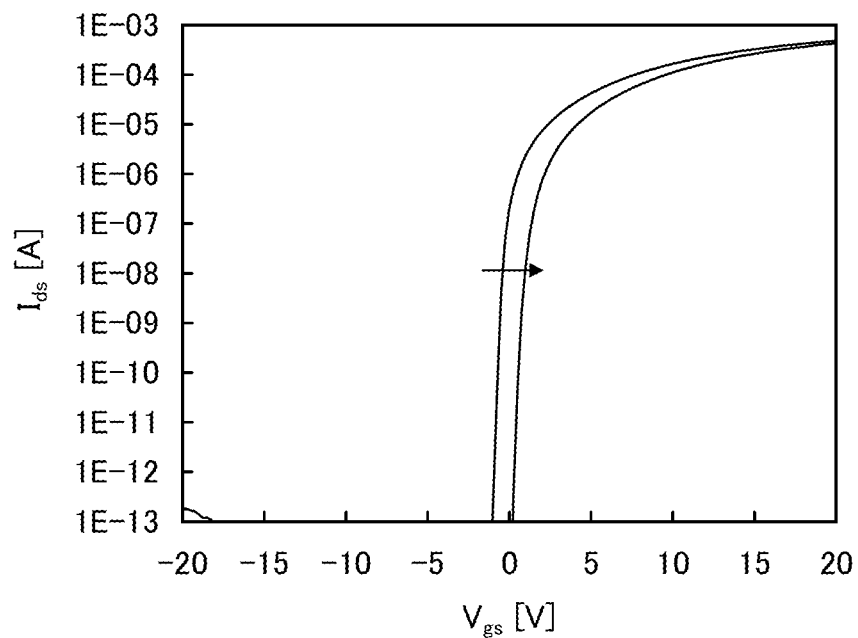
FIGS. 34A and 34B show $V_{gs}$-$I_{ds}$ characteristics after BT tests of a transistor of Sample 1.
Figure 34B:
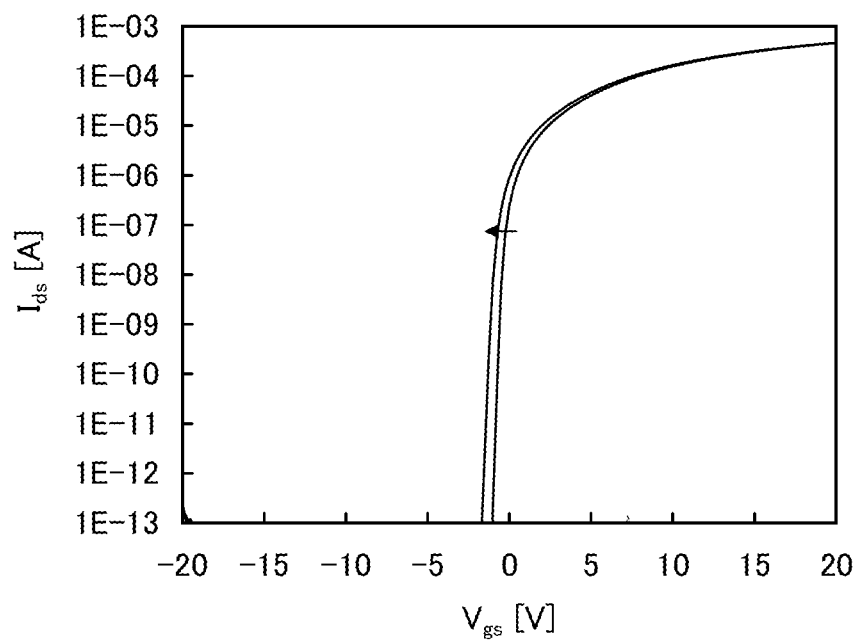
Figure 35A:
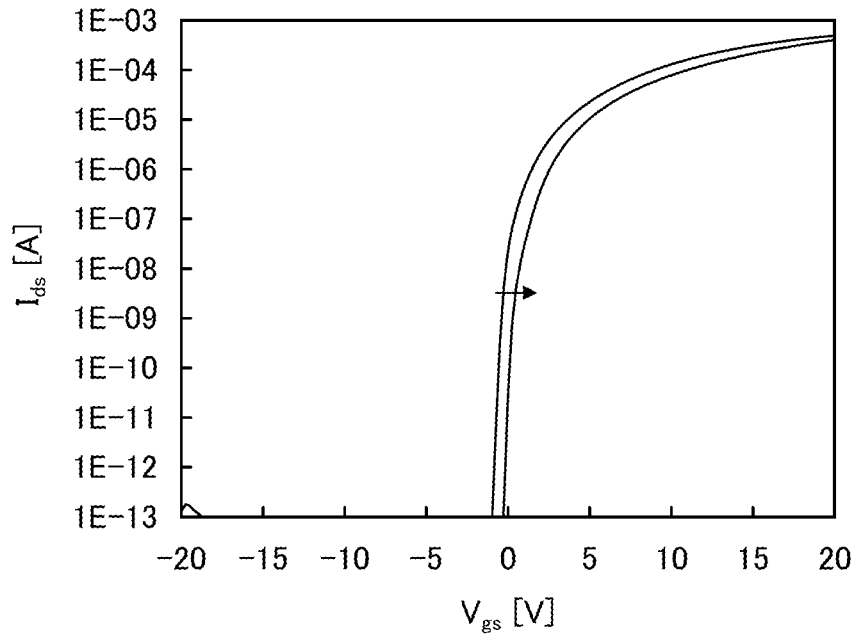
FIGS. 35A and 35B show $V_{gs}$-$I_{ds}$ characteristics after BT tests of a transistor of Sample 2.
Figure 35B:
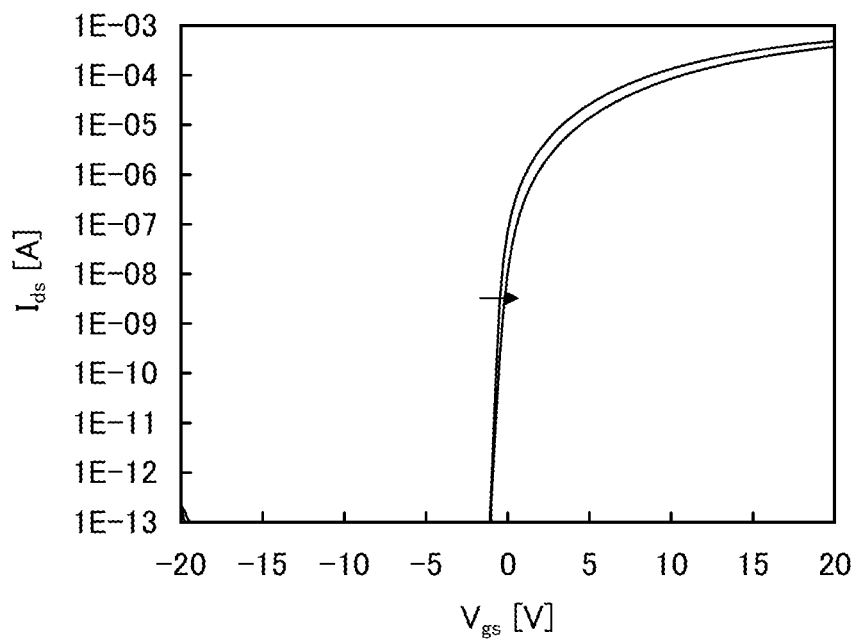

FIGS. 34A and 34B show results of the positive BT test and the negative BT test, respectively, of Sample 1. FIGS. 35A and 35B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to an oxygen vacancy is easily caused in the oxide semiconductor or at an interface with between the oxide semiconductor and a stacked film; when excess oxygen is included in the oxide semiconductor by the heat treatment, an oxygen vacancy caused later can be compensated for with excess oxygen. The excess oxygen is mainly oxygen existing between lattices. When the concentration of the oxygen is set in the range of $1\times10^{16}$/cm$^3$ to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film is deposited by a sputtering method without heating a substrate intentionally, using a target having a composition ratio of In:Sn:Zn=1:1:1, a halo pattern is observed from the oxide semiconductor film by X-ray diffraction (XRD). This deposited oxide semiconductor film can be crystallized by being subjected to heat treatment. The temperature of the heat treatment can be set as appropriate; when the heat treatment is performed at 650° C., for example, a clear diffraction peak can be observed by X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn—O film with a thickness of 100 nm was deposited over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature during deposition was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for an hour and heat treatment in an oxygen atmosphere was further performed for an hour without lowering the temperature. A sample formed in this manner was used as Sample B.

Figure 36:
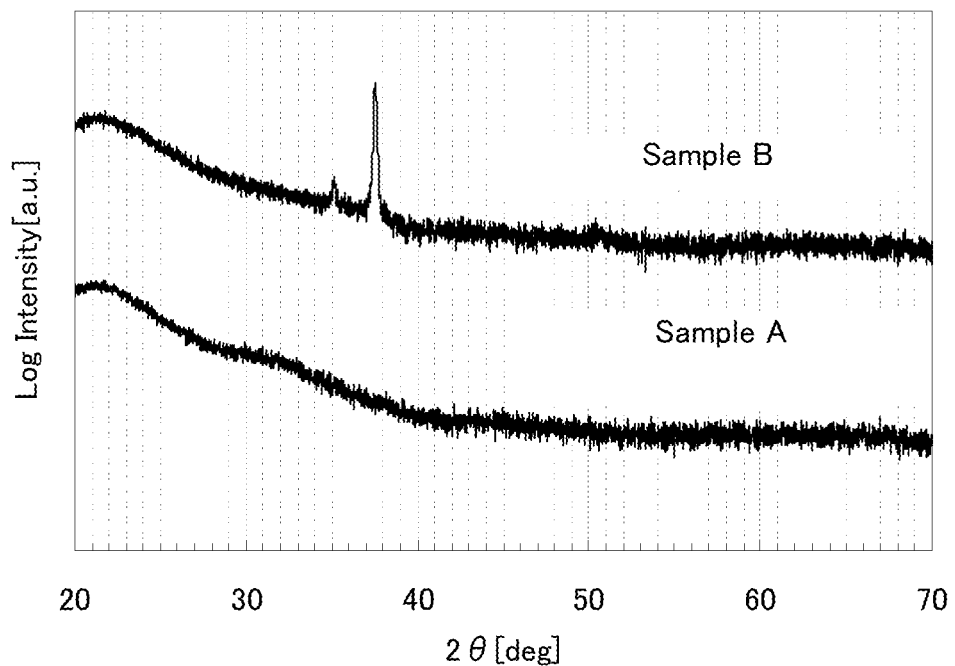
FIG. 36 is a graph showing XRD spectra of Sample A and Sample B.

FIG. 36 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an advantageous effect of preventing hydrogen and a hydroxyl group, which are unfavorable impurities for an oxide semiconductor, from being included in the film or an advantageous effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 37:
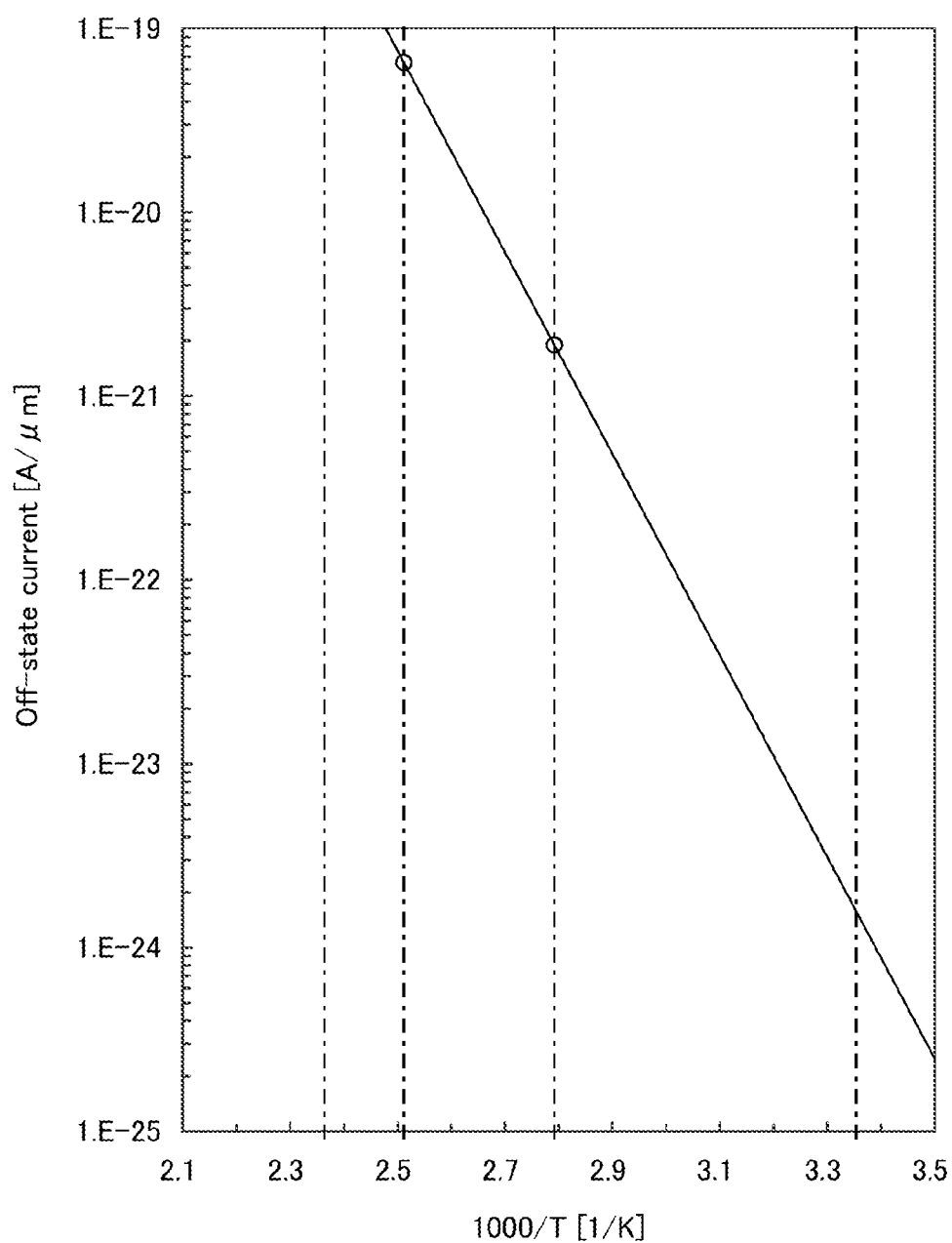
FIG. 37 is a graph showing a relation between the off-state current of a transistor and the substrate temperature in measurement.

FIG. 37 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 37, the off-state current was 0.1 aA/μm ($1\times10^{-19}$ A/μm) or smaller and 10 zA/μm ($1\times10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1\times10^{-22}$ A/μm) or smaller. Hence, the off-state current can be 1 aA/μm ($1\times10^{-18}$ A/μm) or smaller, 100 zA/μm ($1\times10^{-19}$ A/μm) or smaller, and 1 zA/μm ($1\times10^{-21}$ A/μm) or smaller at 125° C., 85° C., and room temperature, respectively.

Note that in order to prevent hydrogen and moisture from being included in the oxide semiconductor film during deposition of the film, it is preferable to increase the purity of a sputtering gas by sufficiently suppressing leakage from the outside of a deposition chamber and degasification through an inner wall of the deposition chamber. For example, a gas with a dew point of lower than or equal to −70° C. is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor of the sample on which heat treatment at 650° C. was performed after deposition of the oxide semiconductor film was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 38:
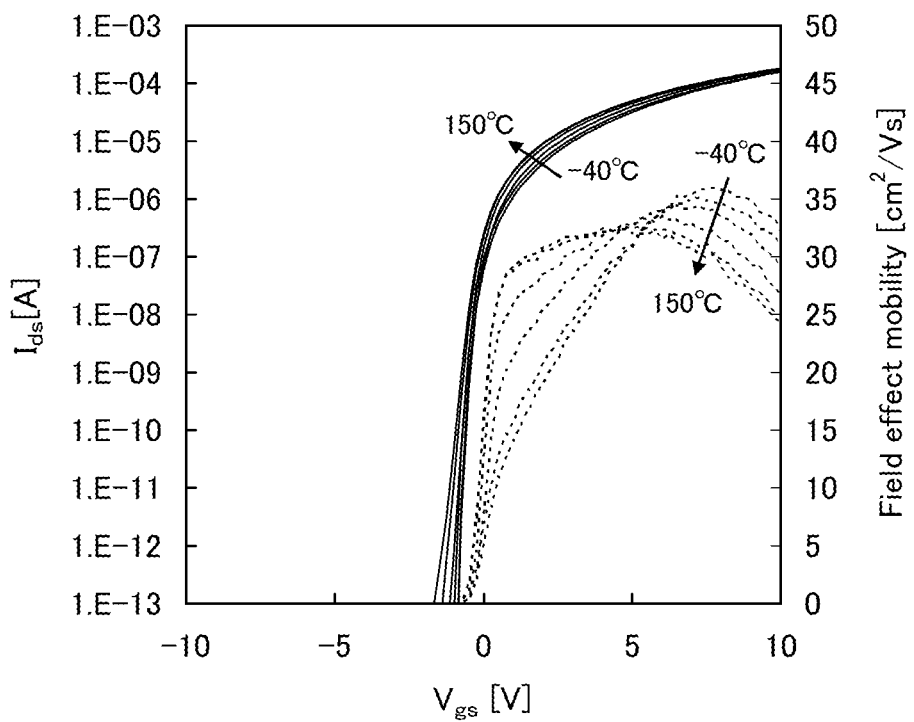
FIG. 38 is a graph showing $V_{gs}$ dependence of $I_{ds}$ and field-effect mobility.
Figure 39A:
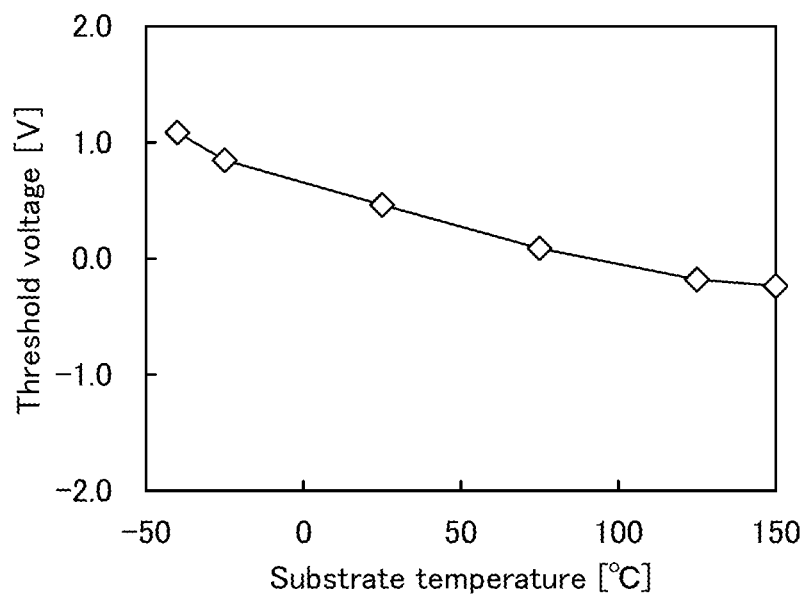
FIG. 39A is a graph showing a relation between the substrate temperature and the threshold voltage.

FIG. 38 shows the $V_{gs}$ dependence of $I_{ds}$ (a solid line) and field-effect mobility (a dotted line). FIG. 39A shows a relation between the substrate temperature and the threshold voltage, and FIG. 39B shows a relation between the substrate temperature and the field-effect mobility.

From FIG. 39A, it is found that the threshold voltage gets lower as the substrate temperature increases. Note that the threshold voltage is decreased from 1.09 V to −0.23 V in the range from −40° C. to 150° C.

Figure 39B:
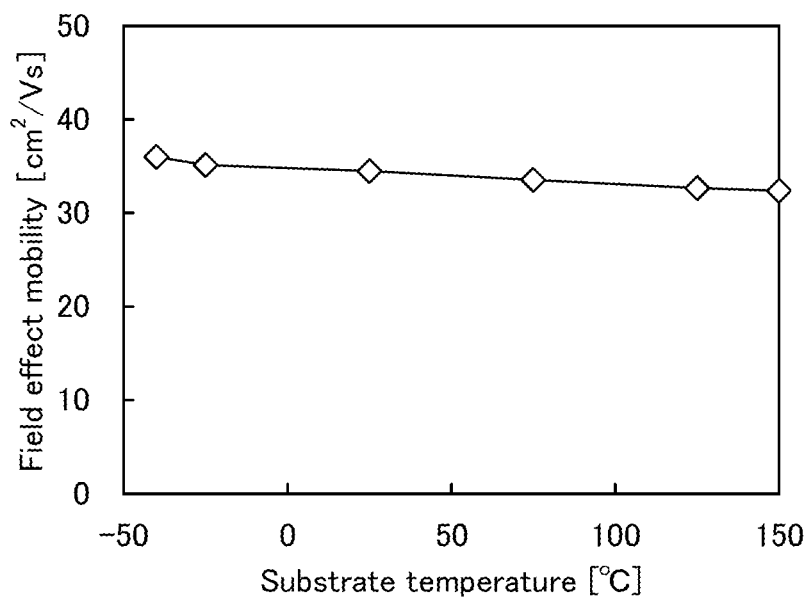
FIG. 39B is a graph showing a relation between the substrate temperature and the field-effect mobility.

From FIG. 39B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor whose channel formation region includes such an oxide semiconductor including In, Sn, and Zn as main components, a field-effect mobility higher than or equal to 30 cm$^2$/Vs, preferably higher than or equal to 40 cm$^2$/Vs, more preferably higher than or equal to 60 cm$^2$/Vs can be obtained with the off-state current maintained at 1 aA/μm or lower, which can achieve an on-state current needed for an LSI. For example, in an FET where L/W is 33 nm/40 nm, an on-state current higher than or equal to 12 μA can flow when the gate voltage is 2.7 V and the drain voltage is 1.0 V. In addition, sufficient electric characteristics can be ensured in a temperature range needed for the operation of the transistor. With such characteristics, in an integrated circuit, a transistor including a Si semiconductor and a transistor including an oxide semiconductor can be operated together. Thus, a semiconductor storage device without the necessity of saving and returning a data signal between a volatile storage device and a nonvolatile storage device can be provided.

Meanwhile, a magnetic tunnel junction element (MTJ element) is known as a storage element used for a nonvolatile semiconductor storage device. The MTJ element is an element for storing information in a low-resistance state when the magnetization directions of ferromagnetic films which are formed with an insulating film provided therebetween are parallel and storing information in a high-resistance state when the spin directions are anti-parallel. Therefore, the principle of the MTJ element is completely different from that of the semiconductor storage device including an oxide semiconductor, which is described in this embodiment. Table 1 shows a comparison between the MTJ element and the semiconductor storage device according to this embodiment (in the table indicated by "Oxide semiconductor/Si").

TABLE 1

| | Spintronics (MTJ element) | Oxide Semiconductor |
|---|---|---|
| 1) Heat Resistance | Curie Temperature | Process Temperature at 500° C. (Reliability at 150° C.) |
| 2) Driving Method | Current Driving | Voltage Driving |
| 3) Principle of Writing Operation | Changing Magnetization Direction of Magnetic Film | On/Off of FET |
| 4) Si LSI | Suitable for Bipolar LSI | Suitable for MOS LSI |
| 5) Overhead | Large (Due to Large Joule Heat) | Smaller by 2 to 3 or more Orders of Magnitude than the MTJ Element (Because of charging and discharging of parasitic capacitance) |
| 6) Nonvolatility | Utilizing Spin | Utilizing Small Off-State Current |
| 7) Number of Times of Holding Electric Charges | Unlimited | Unlimited |
| 8) 3D Display | Difficult (At Most Two Layers) | Easy (Number of Layers is Unlimited) |
| 9) Integration Degree ($F^2$) | 4 $F^2$ to 15 $F^2$ | Depending on Number of Layers for 3D Display |
| 10) Material | Magnetic Rare Earth Element | Oxide Semiconductor Material |
| 11) Cost per Bit | High | Low |
| 12) Magnetic Field Resistance | Low | High |

The MTJ element has a disadvantage in that ferromagnetic property thereof is lost when the temperature is higher than or equal to the Curie temperature because a magnetic material is used. In addition, the MTJ element is compatible with a silicon bipolar device because current driving is employed; however, the bipolar device is unsuitable for high integration. Further, there is a problem in that power consumption is increased by an increase of memory capacity, though the writing current of the MTJ element is extremely low.

In principle, the MTJ element has low resistance to a magnetic field, and the magnetization direction is easily changed when the MTJ element is exposed to a high magnetic field. In addition, it is necessary to control magnetic fluctuation which is caused by nanoscaling of a magnetic body used for the MTJ element.

Further, a rare-earth element is used for the MTJ element; therefore, incorporation of a process of the MTJ element into a process of a silicon semiconductor which avoids metal contamination should be paid high attention to. The material cost per bit of the MTJ element may be expensive.

On the other hand, the transistor including an oxide semiconductor in the semiconductor storage device described in this embodiment is similar to a silicon MOSFET in the element structure and the operation principal except that a semiconductor material which forms the channel formation region is a metal oxide. In addition, the transistor including an oxide semiconductor is not affected by a magnetic field, and the transistor does not cause soft error. This shows that the transistor is highly compatible with a silicon integrated circuit.

This application is based on Japanese Patent Application serial No. 2011-111738 filed with the Japan Patent Office on May 18, 2011, the entire contents of which are hereby incorporated by reference.

What is claimed is:

1. A semiconductor storage device comprising:
a wiring;
a first storage circuit comprising a first transistor, a first capacitor, a first data holding portion, a first circuit, and a first control circuit;
a second storage circuit comprising a second transistor, a second capacitor, a second data holding portion, a second circuit, and a second control circuit; and
a third transistor,
wherein the first storage circuit and the second storage circuit are adjacent to each other,
wherein one of a source and a drain of the first transistor is electrically connected to the wiring,
wherein the first data holding portion is configured to hold data supplied from the wiring when the first transistor and the second transistor are in an Off-state,
wherein the first data holding portion is electrically connected to the other of the source and the drain of the first transistor, a first electrode of the first capacitor, an input terminal of the first circuit, and one of a source and a drain of the second transistor,
wherein the first circuit is configured to output a first signal to the first control circuit and a data output portion, a potential of the first signal depending on a potential of the data in the first data holding portion,
wherein the first control circuit is configured to output a second signal to a second electrode of the first capacitor so that the potential of the data in the first data holding portion is controlled by the second signal,
wherein the second data holding portion is electrically connected to the other of the source and the drain of the second transistor, a first electrode of the second capacitor, an input terminal of the second circuit, and the third transistor, and
wherein the second data holding portion is configured to hold the data supplied from the first data holding portion when the second transistor and the third transistor are in an Off-state.

2. The semiconductor storage device according to claim 1, wherein at least one of the first circuit, the first control circuit, the second circuit, and the second control circuit comprises a transistor comprising a semiconductor including silicon.

3. The semiconductor storage device according to claim 2, wherein the transistor and the first transistor or the second transistor are stacked.

4. The semiconductor storage device according to claim 1, wherein the first to third transistors are each a transistor comprising a semiconductor layer including an oxide semiconductor.

5. The semiconductor storage device according to claim 4, wherein the oxide semiconductor is an In—Sn—Zn-based oxide semiconductor.

6. The semiconductor storage device according to claim 1, further comprising a first gate-selection signal generator circuit electrically connected to a gate of the first transistor, and a second gate-selection signal generator circuit electrically connected to a gate of the second transistor.

7. A semiconductor storage device comprising:
a wiring;
a (2m−1)-th stage storage circuit (m is a natural number of 1 or more);
a 2m-th stage storage circuit;
a (2m+1)-th stage storage circuit;
a (2m−1)-th gate-selection signal generator circuit; and
a 2m-th gate-selection signal generator circuit,
wherein the (2m−1)-th stage storage circuit comprises:
a (2m−1)-th transistor including a first terminal electrically connected to the wiring;
a (2m−1)-th data holding portion electrically connected to a second terminal of the (2m−1)-th transistor, a first terminal of a 2m-th transistor included in the 2m-th stage storage circuit, a first electrode of a (2m−1)-th capacitor, and an input terminal of a (2m−1)-th inverter circuit, the (2m−1)-th data holding portion being configured to hold data supplied from the wiring; and
a (2m−1)-th NOR circuit configured to receive a signal of an output terminal of the (2m−1)-th inverter circuit and a first capacitor control signal, the (2m−1)-th NOR circuit including an output terminal electrically connected to a second electrode of the (2m−1)-th capacitor,
wherein the 2m-th stage storage circuit comprises:
the 2m-th transistor;
a 2m-th data holding portion electrically connected to a second terminal of the 2m-th transistor, a first terminal of a (2m+1)-th transistor included in a (2m+1)-th stage storage circuit, a first electrode of a 2m-th capacitor, and an input terminal of a 2m-th inverter circuit, the 2m-th data holding portion being configured to hold the data supplied from the (2m−1)-th data holding portion; and
a 2m-th NOR circuit configured to receive a signal of an output terminal of the 2m-th inverter circuit and a second capacitor control signal, the 2m-th NOR circuit including an output terminal electrically connected to a second electrode of the 2m-th capacitor,
wherein a gate of the (2m−1)-th transistor is electrically connected to a (2m−1)-th gate-selection signal generator circuit configured to receive a first gate control signal and a (2m−1)-th enable signal and to control a conductive state or a non-conductive state of the (2m−1)-th transistor,
wherein a gate of the 2m-th transistor is electrically connected to a 2m-th gate-selection signal generator circuit configured to receive a second gate control signal and a 2m-th enable signal and to control a conductive state or a non-conductive state of the 2m-th transistor,
wherein the (2m−1)-th data holding portion is configured to hold the data by turning the (2m−1)-th transistor and the 2m-th transistor Off,
wherein the 2m-th data holding portion is configured to hold the data by turning the 2m-th transistor and the (2m+1)-th transistor Off,
wherein the (2m−1)-th NOR circuit is configured to output a first signal depending on the signal of the output terminal of the (2m−1)-th inverter circuit and the first capacitor control signal to control a potential of the (2m−1)-th data holding portion by capacitive coupling through the (2m−1)-th capacitor, and
wherein the 2m-th NOR circuit is configured to output a second signal depending on the signal of the output terminal of the 2m-th inverter circuit and the second capacitor control signal to control a potential of the 2m-th data holding portion by capacitive coupling through the 2m-th capacitor.

8. The semiconductor storage device according to claim 7, wherein at least one of the (2m−1)-th inverter circuit, the 2m-th inverter circuit, the (2m−1)-th NOR circuit, the 2m-th NOR circuit, the (2m−1)-th gate-selection signal generator circuit, and the 2m-th gate-selection signal generator circuit comprises a transistor comprising a semiconductor including silicon.

9. The semiconductor storage device according to claim 8, wherein the transistor and the (2m−1)-th transistor or the 2m-th transistor are stacked.

10. The semiconductor storage device according to claim 7, wherein the (2m−1)-th transistor and the 2m-th transistor are each a transistor comprising a semiconductor layer including an oxide semiconductor.

11. The semiconductor storage device according to claim 10, wherein the oxide semiconductor is an In—Sn—Zn-based oxide semiconductor.

12. A semiconductor storage device comprising:
a wiring;
a first wiring;
a second wiring;
a first storage circuit comprising a first transistor, a first capacitor, a first data holding portion, a first inverter, a second inverter, and a first NOR circuit;
a second storage circuit comprising a second transistor, a second capacitor, a second data holding portion, a third inverter, a fourth inverter, and a second NOR circuit;
a first selection circuit;
a second selection circuit; and
a third transistor,
wherein the first storage circuit and the second storage circuit are adjacent to each other,
wherein one of a source and a drain of the first transistor is electrically connected to the wiring,
wherein a gate of the first transistor is electrically connected to the first selection circuit,
wherein a gate of the second transistor is electrically connected to the second selection circuit,
wherein the first data holding portion is electrically connected to the other of the source and the drain of the first transistor, a first electrode of the first capacitor, an input terminal of the first inverter, and one of a source and a drain of the second transistor,
wherein an output terminal of the first inverter is electrically connected to a first input terminal of the first NOR circuit and an input terminal of the second inverter,
wherein an output terminal of the first NOR circuit is electrically connected to a second electrode of the first capacitor,
wherein a second input terminal of the first NOR circuit is electrically connected to the first wiring,
wherein the second data holding portion is electrically connected to the other of the source and the drain of the second transistor, a first electrode of the second capacitor, an input terminal of the third inverter, and one of a source and a drain of the third transistor, wherein an output terminal of the third inverter is electrically connected to a first input terminal of the second NOR circuit and an input terminal of the fourth inverter, wherein an output terminal of the second NOR circuit is electrically connected to a second electrode of the second capacitor, and wherein a second input terminal of the second NOR circuit is electrically connected to the second wiring.

13. The semiconductor storage device according to claim 12, wherein at least one of the first to fourth inverters, the first NOR circuit, and the second NOR circuit comprises a transistor comprising a semiconductor including silicon.

14. The semiconductor storage device according to claim 13, wherein the transistor and the first transistor or the second transistor are stacked.

15. The semiconductor storage device according to claim 12, wherein the first to third transistors are each a transistor comprising a semiconductor layer including an oxide semiconductor.

16. The semiconductor storage device according to claim 15, wherein the oxide semiconductor is an In—Sn—Zn-based oxide semiconductor.

* * * * *